(12) United States Patent
Ogura et al.

(10) Patent No.: US 9,324,815 B2
(45) Date of Patent: Apr. 26, 2016

(54) SEMICONDUCTOR DEVICE

(71) Applicant: KABUSHIKI KAISHA TOSHIBA, Minato-ku, Tokyo (JP)

(72) Inventors: Tsuneo Ogura, Kanagawa-ken (JP); Tomoko Matsudai, Tokyo (JP); Yuuichi Oshino, Tokyo (JP); Yoshiko Ikeda, Kanagawa-ken (JP); Kazutoshi Nakamura, Kanagawa-ken (JP); Ryohei Gejo, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/702,070

(22) Filed: May 1, 2015

(65) Prior Publication Data

US 2015/0236104 A1 Aug. 20, 2015

Related U.S. Application Data

(62) Division of application No. 14/014,157, filed on Aug. 29, 2013, now Pat. No. 9,054,066.

(30) Foreign Application Priority Data

Aug. 30, 2012 (JP) .................................. 2012-190638
May 24, 2013 (JP) .................................. 2013-110389

(51) Int. Cl.
*H01L 29/08* (2006.01)
*H01L 29/36* (2006.01)
*H01L 29/10* (2006.01)
*H01L 29/861* (2006.01)
(Continued)

(52) U.S. Cl.
CPC ............ *H01L 29/36* (2013.01); *H01L 29/0626* (2013.01); *H01L 29/0692* (2013.01);
(Continued)

(58) Field of Classification Search
CPC . H01L 29/0626; H01L 29/1095; H01L 29/36; H01L 29/7393; H01L 29/872
See application file for complete search history.

(56) References Cited

U.S. PATENT DOCUMENTS 5,223,442 A 6/1993 Kitagawa et al.
5,459,338 A 10/1995 Takayanagi et al.
(Continued)

FOREIGN PATENT DOCUMENTS

JP 617757 B2 3/1986
JP 0234190 B2 8/1990
(Continued)

OTHER PUBLICATIONS

U.S. Appl. No. 13/846,624; Tomoko Matsudai et al; filed Mar. 18, 2013.

*Primary Examiner* — Thanh V Pham
(74) *Attorney, Agent, or Firm* — Holtz, Holtz & Volek PC

(57) ABSTRACT

According one embodiment, a semiconductor device includes: a first electrode; a second electrode; a first semiconductor layer provided between the first electrode and the second electrode and being in contact with the first electrode; a second semiconductor layer including a first part and a second part, and the second part being contact with the first electrode, and the second semiconductor layer having an effective impurity concentration lower than an effective impurity concentration in the first semiconductor layer; a third semiconductor layer provided between the second semiconductor layer and the second electrode, and having an effective impurity concentration lower than an effective impurity concentration in the second semiconductor layer; and a fourth semiconductor layer provided between the third semiconductor layer and the second electrode, and being in contact with the second electrode.

12 Claims, 38 Drawing Sheets

(51) Int. Cl.
  *H01L 29/739* (2006.01)
  *H01L 29/78* (2006.01)
  *H01L 29/872* (2006.01)
  *H01L 29/06* (2006.01)

(52) U.S. Cl.
  CPC ........ *H01L29/1095* (2013.01); *H01L 29/7393* (2013.01); *H01L 29/7839* (2013.01); *H01L 29/861* (2013.01); *H01L 29/872* (2013.01)

(56) References Cited

U.S. PATENT DOCUMENTS

| | | |
|---|---|---|
| 6,323,509 B1 | 11/2001 | Kusunoki |
| 7,102,207 B2 | 9/2006 | Inoue et al. |
| 7,781,869 B2 | 8/2010 | Inoue et al. |
| 2005/0258493 A1 | 11/2005 | Aono et al. |
| 2009/0078936 A1 | 3/2009 | Fujii |
| 2010/0096664 A1 | 4/2010 | Tsukuda |
| 2010/0295093 A1 | 11/2010 | Rahimo et al. |
| 2010/0308446 A1 | 12/2010 | Nakamura |
| 2013/0093066 A1 | 4/2013 | Tsukuda |

FOREIGN PATENT DOCUMENTS

| | | |
|---|---|---|
| JP | 2008269069 A | 6/2008 |
| JP | 2009094105 A | 4/2009 |
| JP | 2011238681 A | 11/2011 |
| JP | 2012119716 A | 6/2012 |
| WO | 9963597 A1 | 12/1999 |

SEMICONDUCTOR DEVICE

CROSS-REFERENCE TO RELATED APPLICATIONS

This application is a Divisional of parent application Ser. No. 14/014,157, filed on Aug. 29, 2013, which is based upon and claims the benefit of priority from Japanese Patent Application No. 2012-190638, filed on Aug. 30, 2012, and No. 2013-110389, filed on May 24, 2013; the entire contents of which are incorporated herein by reference.

FIELD

Embodiments described herein relate generally to a semiconductor device.

BACKGROUND

As a semiconductor device used in a power converter such as an inverter, there are a MOS (Metal-Oxide-Semiconductor) transistor, an IGBT (Insulated Gate Bipolar Transistor), a diode etc. The diode is used for a reflux flow, being connected anti-parallel to the IGBT. Accordingly, the diode in this case is referred to as a FWD (Free Wheeling Diode).

In the improvement of characteristics of a power converter, it is important to improve the characteristics of the FWD, for example, electric characteristics such as a switching time, an ON voltage and a leak current, along with the improvement of characteristics of the MOS transistor and the IGBT.

BRIEF DESCRIPTION OF THE DRAWINGS

FIG. 20B is a schematic plan view at the position of the BB' line shown in FIG. 19, in the semiconductor device according to the second variation of the second embodiment;

FIG. 22A is a schematic cross-sectional view, and FIG. 22B is a schematic plan view at the position of the BB' line in FIG. 22A;

FIG. 24A is a schematic cross-sectional view, and FIG. 24B is a schematic plan view at the position of the BB' line in FIG. 24A;

FIG. 26A is a schematic cross-sectional view of the second variation, and FIG. 26B is a schematic cross-sectional view of the third variation;

DETAILED DESCRIPTION

Figure 1A:
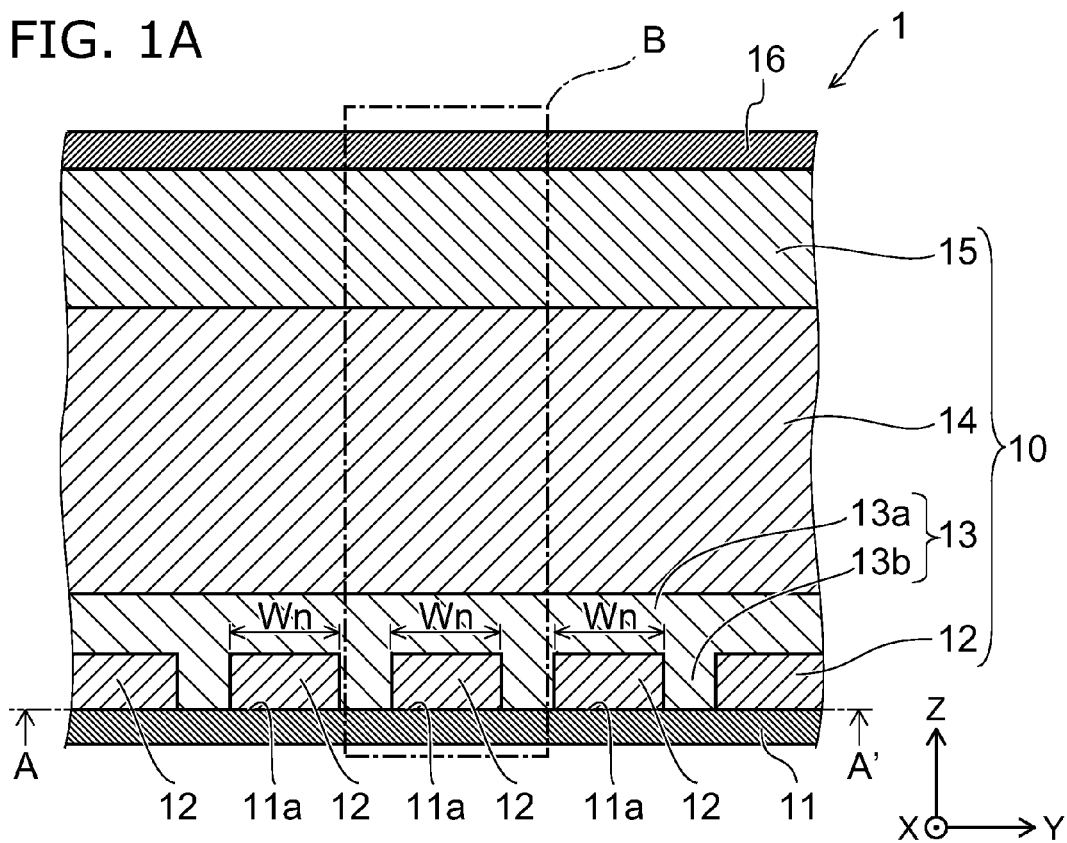
FIG. 1A is a schematic cross-sectional view illustrating a semiconductor device according to a first embodiment and FIG. 1B is a schematic plan view at the position of an AA' line shown in FIG. 1A.

In general, according one embodiment, a semiconductor device is disclosed. The device includes: a first electrode; a second electrode; a first semiconductor layer of a first conductivity type, the first semiconductor layer being provided between the first electrode and the second electrode, and the first semiconductor layer being in contact with the first electrode; a second semiconductor layer of a first conductivity type, the second semiconductor layer including a first part provided between the first semiconductor layer and the second electrode and a second part provided between the first electrode and the second electrode and the second part being in contact with the first electrode, and the second semiconductor layer having an effective impurity concentration lower than an effective impurity concentration in the first semiconductor layer; a third semiconductor layer of a first conductivity type, the third semiconductor layer being provided between the second semiconductor layer and the second electrode, and the third semiconductor layer having an effective impurity concentration lower than an effective impurity concentration in the second semiconductor layer; and a fourth semiconductor layer of a second conductivity type, the fourth semiconductor layer being provided between the third semiconductor layer and the second electrode, and the fourth semiconductor layer being in contact with the second electrode. A peak in an impurity concentration profile of the second semiconductor layer in a direction from the first electrode toward the second electrode is positioned between the first semiconductor layer and the third semiconductor layer.

Hereinafter, embodiments of the invention will be described while referring to the drawings. In descriptions below, the same reference numeral is given to the same member, and, regarding the member described once, the description thereof is omitted as appropriate. The example in respective drawings is an example, and examples obtained by combining respective drawings are also included in the embodiments, if it is possible technologically. In respective drawings, for convenience of description thereof, an anode electrode and a cathode electrode are occasionally not shown.

First Embodiment

First, a first embodiment will be described.

Figure 1B:
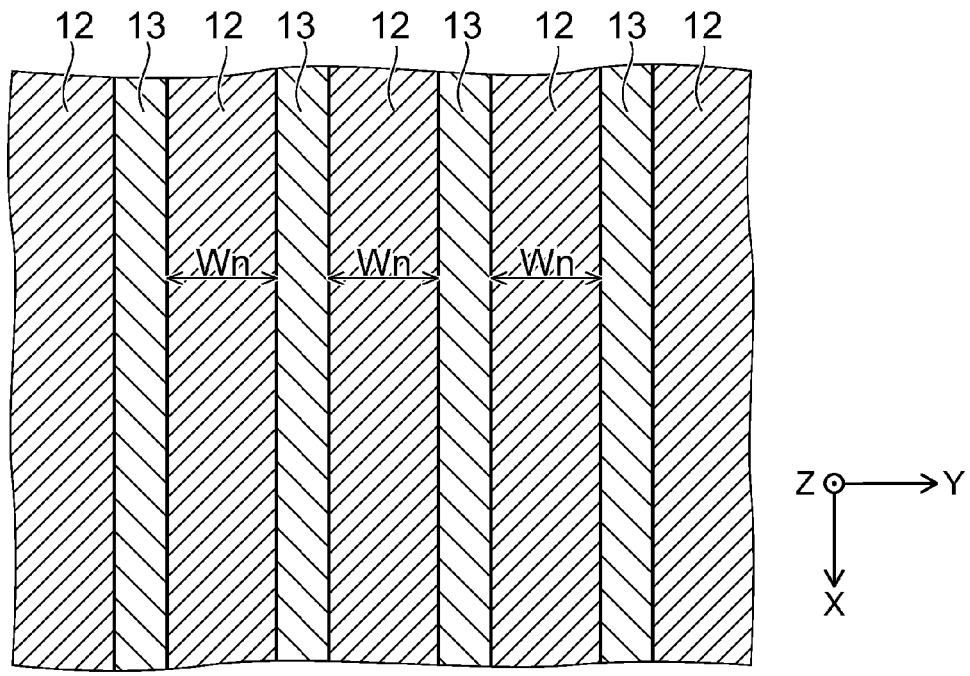

FIG. 1A is a schematic cross-sectional view illustrating the semiconductor device according to the first embodiment and FIG. 1B is a schematic plan view at the position of an AA' line shown in FIG. 1A. A cathode electrode is removed in FIG. 1B.

As shown in FIG. 1A, a cathode electrode 11 (a first electrode), an $n^+$ cathode layer 12 (a first semiconductor layer), an n cathode layer 13 (a second semiconductor layer), an n base layer 14 (a third semiconductor layer), a $p^+$ anode layer 15 (a fourth semiconductor layer) and an anode electrode 16 (a second electrode) are provided in the semiconductor device 1 according to the embodiment. The $n^+$ cathode layer 12, the n cathode layer 13, the n base layer 14 and the $p^+$ anode layer 15 are provided between the cathode electrode 11 and the anode electrode 16. The semiconductor device 1 is, for example, a diode. The $n^+$ cathode layer 12, the n cathode layer 13, the n base layer 14 and the $p^+$ anode layer 15 are collectively referred to as a semiconductor layer 10.

The cathode electrode 11 includes a metal, such as aluminum. The cathode electrode 11 has, for example, a plate-like shape. A plurality of $n^+$ cathode layers 12 are disposed apart from each other on the cathode electrode 11, for example, on the plate face of the cathode electrode 11.

As shown in FIG. 1B, each of $n^+$ cathode layers 12 is formed, for example, into the shape of a cuboid extending in one direction on the cathode electrode 11. A region 11a (a first region), which is in contact with each of $n^+$ cathode layers 12 in the cathode electrode 11, also extends in one direction. For example, the n+ cathode layer 12 is positioned in a region directly over the region 11a, i.e., in a region immediately above the region 11a. In this case, a width Wn of each of n+ cathode layers 12, i.e., the length in the direction orthogonal to the direction in which each of n+ cathode layers 12 extends is equal to the width Wn of the region 11a. The width Wn is, for example, not more than 100 micrometers (μm). The thickness of each of n+ cathode layers 12, i.e., the length between the upper end and the lower end of each of n+ cathode layers 12 is, for example, not more than 5 micrometers (μm).

The distances between the respective n+ cathode layers 12 and the distances between the respective regions 11a are, for example, not more than 50 micrometers (μm). The n+ cathode layer 12 includes a semiconductor, such as silicon. An impurity serving as a donor, for example, phosphorous is included in the n+ cathode layer 12. The conductivity type of the n+ cathode layer 12 is the n type (a first conductivity type). An effective concentration of impurities at a surface in the n+ cathode layer 12, i.e., a surface impurity concentration is more than $3 \times 10^{17}$ cm$^{-3}$, for example, not less than $1 \times 10^{19}$ cm$^{-3}$.

In the specification, "the effective impurity concentration" means concentration of impurities that contribute to the conduction of a semiconductor material. For example, when both impurities serving as a donor and an acceptor are included in a semiconductor material, "the effective impurity concentration" means the concentration obtained by excluding a canceled amount by donors and acceptors from an amount of all activated impurities. Hereinafter, the effective impurity concentration is also simply referred to as the impurity concentration.

The cathode electrode 11 and the n+ cathode layer 12 are in ohmic contact with each other. The ohmic contact means a contact between a metal and a semiconductor, the contact having such a small contact resistance as can be neglected as compared with a series resistance due to resistances of semiconductor bulks. The ohmic contact is a non-rectifying contact.

Figure 2:
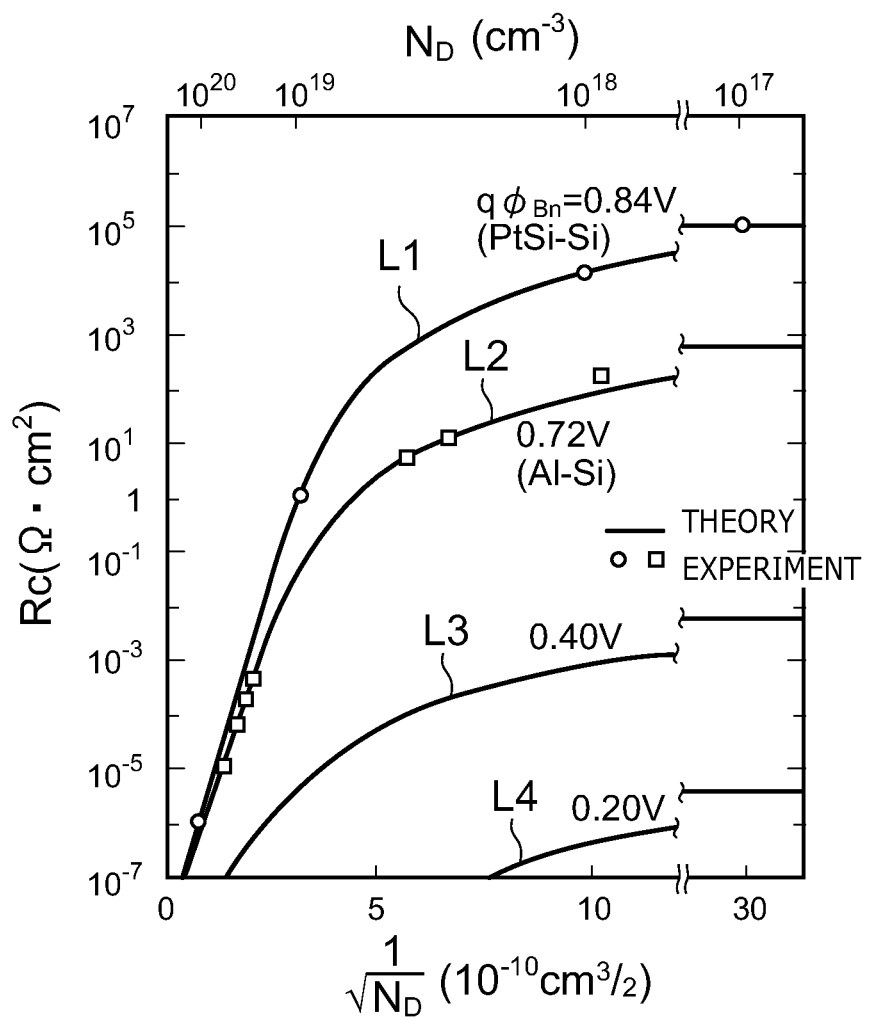
FIG. 2 is a graph illustrating an ohmic contact and a Schottky contact between a metal and a semiconductor.

FIG. 2 is a graph illustrating an ohmic contact and a Schottky contact between a metal and a semiconductor. The vertical axis shows a specific contact resistance (Ω·cm$^2$), and the horizontal axis shows an impurity concentration ($10^{-10}$ cm$^{3/2}$ and cm$^{-3}$). Solid lines L1, L2, L3 and L4 show theoretical values, and circular signs and square signs show experimental values.

As shown in FIG. 2, when an impurity concentration in a semiconductor is more than $3 \times 10^{17}$ cm$^{-3}$, a metal and the semiconductor are in ohmic contact. In the semiconductor device 1, since the effective surface impurity concentration in the n+ cathode layer 12 is more than $3 \times 10^{17}$ cm$^{-3}$, the cathode electrode 11 and the n+ cathode layer 12 is in ohmic contact.

The n cathode layer 13 is disposed on the n+ cathode layer 12 and the cathode electrode 11. Accordingly, the n cathode layer 13 includes a part 13a disposed on the n+ cathode layer 12 and a part 13b in contact with the cathode electrode 11. The part 13a is provided between the n+ cathode layer 12 and the anode electrode 16. The part 13b is provided between the cathode electrode 11 and the anode electrode 16. The thickness of the part in contact with the cathode electrode 11 in the n cathode layer 13 is from several to several tens micrometers (μm), for example, from 1 to 20 micrometers (μm), or from 0.5 to 20 μm.

The n cathode layer 13 includes a semiconductor, such as silicon. An impurity serving as a donor, such as phosphor, is included in the n cathode layer 13. The conductivity type of the n cathode layer 13 is the n type. The effective surface impurity concentration in the n cathode layer 13 is lower than the effective surface impurity concentration in the n+ cathode layer 12. The surface concentration of phosphorous in the part, which is in contact with the cathode electrode 11, of the n cathode layer 13 is not more than $3 \times 10^{17}$ cm$^{-3}$, for example. The cathode electrode 11 and the n cathode layer 13 are in Schottky contact. The Schottky contact means a contact between a metal and a semiconductor, the contact having a Schottky barrier between the metal and the semiconductor. The Schottky contact is a rectifying contact.

As shown in FIG. 2, when the effective surface impurity concentration in a semiconductor is not more than $3 \times 10^{17}$ cm$^{-3}$, the metal and the semiconductor are in Schottky contact. Since the effective surface impurity concentration in the n cathode layer 13 is not more than $3 \times 10^{17}$ cm$^{-3}$, the cathode electrode 11 and the n cathode layer 13 are in Schottky contact in the embodiment.

The n base layer 14 is disposed on the n cathode layer 13. The n base layer 14 is provided between the n cathode layer 13 and the anode electrode 16. The thickness of the n base layer 14 is, for example, 10 to 500 micrometers (μm), the thickness being designed corresponding to the breakdown voltage of an element. The n base layer 14 includes a semiconductor, such as silicon. An impurity serving as a donor, such as phosphorous, is included in the n base layer 14. The conductivity type of the n base layer 14 is the n type. The effective impurity concentration in the n base layer 14 is lower than the effective impurity concentration in the n cathode layer 13.

The p+ anode layer 15 is disposed on the n base layer 14. The p+ anode layer 15 is provided between the n base layer 14 and the anode electrode 16. The thickness of the p+ anode layer 15 is from several to several tens micrometers (μm), for example, from 1 to 20 micrometers (μm). The p+ anode layer 15 includes a semiconductor, such as silicon. An impurity serving as an acceptor, such as boron, is included in the p+ anode layer 15. The conductivity type of the p+ anode layer 15 is the p type (a second conductivity type). An effective surface concentration of impurities in the p+ anode layer 15 is more than $3 \times 10^{17}$ cm$^{-3}$, for example, not less than $1 \times 10^{19}$ cm$^{-3}$.

The anode electrode 16 is disposed on the p+ anode layer 15. The anode electrode 16 includes a metal, such as aluminum. The anode electrode 16 has, for example, a plate-like shape. The anode electrode 16 includes aluminum. Since the effective impurity concentration in the p+ anode layer 15 is more than $3 \times 10^{17}$ cm$^{-3}$, the anode electrode 16 and the p+ anode layer 15 are in ohmic contact.

In the semiconductor device 1, configurations shown in FIG. 1A and FIG. 1B are disposed repeatedly.

Next, actions of the semiconductor device 1 according to the embodiment will be described.

Between the anode electrode 16 and the cathode electrode 11, a forward bias, i.e., a voltage with the anode electrode 16 side being positive with respect to the cathode electrode 11 is applied. From the n cathode layer 13 side, electrons are injected into the n base layer 14. From the p anode layer 15 side, holes are injected into the n base layer 14. Consequently, a conductive state is provided between the anode electrode 16 and the cathode electrode 11.

Figure 3:
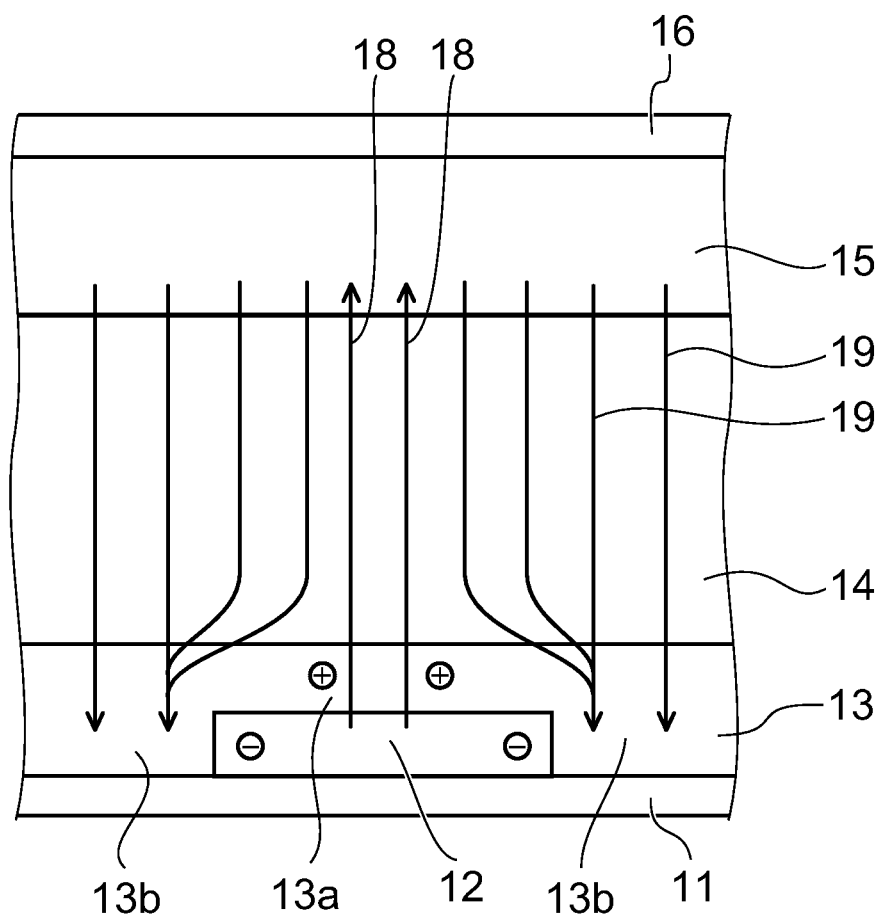
FIG. 3 is an enlarged view illustrating the action of the region B shown in FIG. 1A in the semiconductor device according to the first embodiment.

FIG. 3 is an enlarged view illustrating the action of the region B shown in FIG. 1A in the semiconductor device according to the first embodiment.

Figure 4A:
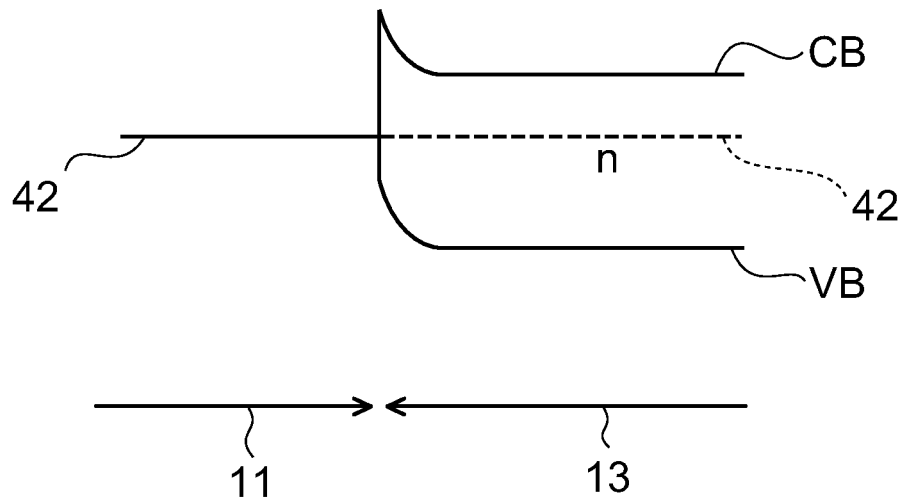
FIG. 4A is a drawing illustrating energy bands of the cathode electrode 11 and the n cathode layer 13.
Figure 4B:
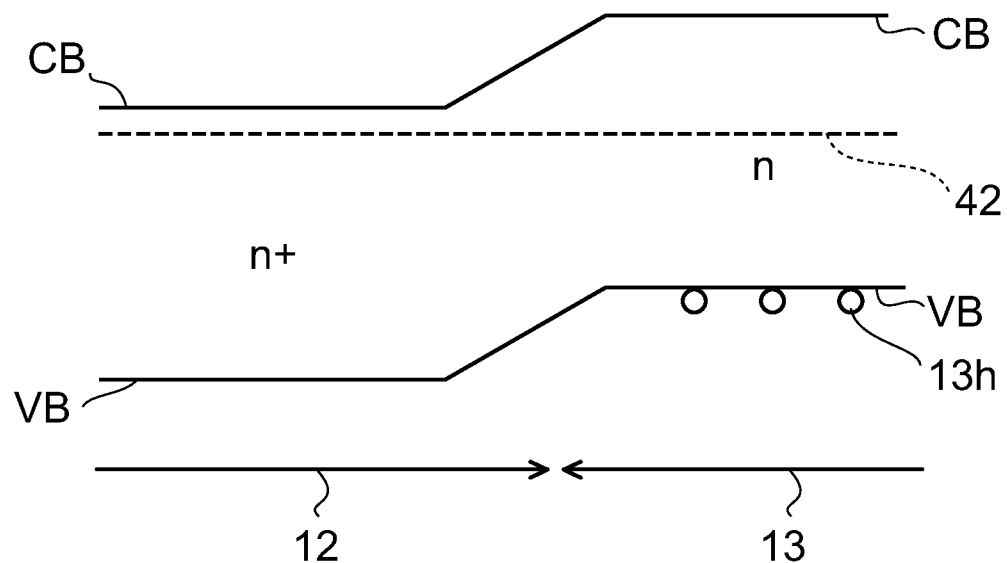
FIG. 4B is a drawing illustrating energy bands of the n+ cathode layer 12 and the n cathode layer 13, in the semiconductor device according to the first embodiment.

FIG. 4A is a drawing illustrating energy bands of the cathode electrode 11 and the n cathode layer 13, and FIG. 4B is a drawing illustrating energy bands of the n+ cathode layer 12 and the n cathode layer 13, in the semiconductor device according to the first embodiment.

As shown in FIG. 3, holes are injected into the n base layer 14 from the $p^+$ anode layer 15. Consequently, a hole current 19 is formed.

As shown in FIG. 4A, the Fermi level 42 in the n cathode layer 13 is positioned, between a valence electron band VB and a conduction band CB, on the conduction band CB side. A Schottky barrier is formed between the cathode electrode 11 and the n cathode layer 13. But, the Schottky barrier between the cathode electrode 11 and the n cathode layer 13 does not serve as an energy barrier for holes. Accordingly, holes flow into the cathode electrode 11 through the n base layer 14 and the n cathode layer 13, so that the hole current 19 is formed.

As shown in FIG. 4B, the boundary between the n cathode layer 13 and the $n^+$ cathode layer 12 serves as an energy barrier for a hole 13h of the n cathode layer 13. Accordingly, it is unlikely that the hole 13h flows into the $n^+$ cathode layer 12. Therefore, holes in the n cathode layer 13 move on the $n^+$ cathode layer 12 in a lateral direction, i.e., in another direction orthogonal to one direction in a plane parallel to the plate face of the cathode electrode 11.

Due to the movement of holes in another direction in the n cathode layer 13, the part 13a disposed on the $n^+$ cathode layer 12 is biased so that the part 13a serves as a positive with respect to the part 13b in contact with the cathode electrode 11, that is, the part 13a serves as a positive with respect to the cathode electrode 11.

Due to the bias formed between the part 13a and the cathode electrode 11, the energy barrier between the n cathode layer 13 on the $n^+$ cathode layer 12 and the $n^+$ cathode layer 12 becomes low. Consequently, electrons are injected into the n cathode layer 13 from the $n^+$ cathode layer 12. An electron current 18 is formed by electrons injected into the n cathode layer 13 forms.

Figure 5:
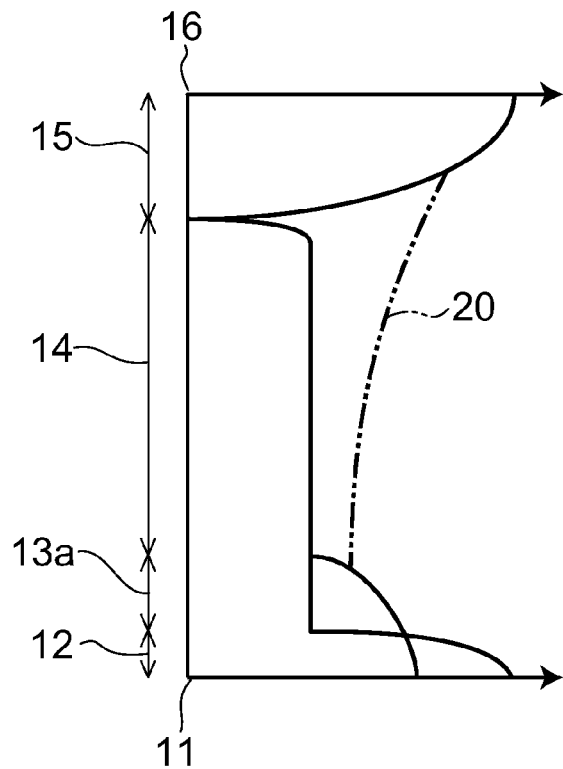
FIG. 5 is a schematic view illustrating the impurity concentration distribution, and the carrier distribution when the forward bias is applied, in the semiconductor device according to the first embodiment.

FIG. 5 is a schematic view illustrating the impurity concentration distribution, and the carrier distribution when the forward bias is applied, in the semiconductor device according to the first embodiment. The vertical axis shows a position in the thickness direction of the semiconductor layer, and the horizontal axis shows an impurity concentration and a carrier concentration.

As shown in FIG. 5, impurity concentrations in the $n^+$ cathode layer 12 and the $p^+$ anode layer 15 are higher than impurity concentrations in the n cathode layer 13 and the n base layer 14. The impurity concentration is, for example, the concentration of phosphorous in the $n^+$ cathode layer 12, the n cathode layer 13 and the n base layer 14. The impurity concentration is, for example, the concentration of boron in the $p^+$ anode layer 15. The impurity concentration in the $n^+$ cathode layer 12 is highest at the lower end of the $n^+$ cathode layer 12. The impurity concentration in the $p^+$ anode layer 15 is highest at the upper end of the $p^+$ anode layer 15.

The impurity concentration in the n cathode layer 13 is a value between concentrations in the $n^+$ cathode layer 12 and the n base layer 14. The impurity concentration in the part 13a disposed on the $n^+$ cathode layer 12 is highest in the part in contact with the $n^+$ cathode layer 12. The impurity concentration in the part 13b in contact with the cathode electrode 11 is highest at the lower end.

The impurity concentration in the n base layer 14 is approximately constant, except that it drops drastically at the upper end.

As shown in FIG. 5, the carrier distribution 20 when the forward bias has been applied shows a concentration distribution that is higher than the impurity concentration in the n base layer 14, but is lower than impurity concentrations at the lower end of the $n^+$ cathode layer 12 and at the upper end of the $p^+$ anode layer 15.

By providing the n cathode layer 13, an injection amount of electrons from the $n^+$ cathode layer 12 is lowered. Accordingly, the carrier distribution 20 when the forward bias has been applied is positioned on a lower concentration side than a carrier distribution 120 of a semiconductor device according to a comparative example to be described later. In particular, the value on the cathode electrode 11 side is significantly lowered. Consequently, the carrier distribution 20 becomes flatter than the carrier distribution 120 in the comparative example to be described later.

Figure 6:
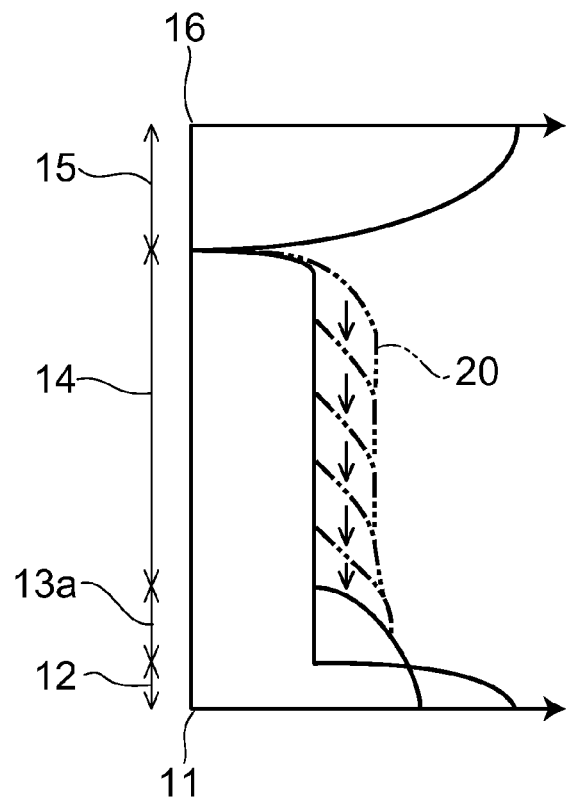
FIG. 6 is a graph illustrating an impurity concentration distribution and a carrier distribution in a transient state when a reverse direction bias is applied, in the semiconductor device according to the first embodiment.

FIG. 6 is a graph illustrating an impurity concentration distribution and a carrier distribution in a transient state when a reverse direction bias is applied, in the semiconductor device according to the first embodiment. The vertical axis shows a position in the thickness direction of the semiconductor layer, and the horizontal axis shows an impurity concentration and a carrier concentration.

As shown in FIG. 6, when a state in which the forward bias has been applied between the anode electrode 16 and the cathode electrode 11 is changed into a state in which a reverse bias is applied, that is, when the cathode electrode 11 is positive with respect to the anode electrode 16, holes existing in the n base layer 14 move to the anode electrode 16 side. Electrons existing in the n base layer 14 move to the cathode electrode 11 side.

Consequently, the carrier distribution 20 in the n base layer 14 goes backward to the cathode electrode 11 side. Moreover, starting from an interface between the $p^+$ anode layer 15 and the n base layer 14, a depletion layer extends in the n base layer 14. Consequently, conduction between the anode electrode 16 and the cathode electrode 11 in the semiconductor device 1 is cut off.

Next, the effect of the embodiment will be described.

In the embodiment, since the n cathode layer 13 is configured so as to include the part 13a disposed on the $n^+$ cathode layer 12 and the part 13b in contact with the cathode electrode 11, the injection amount of electrons is suppressed. Accordingly, the carrier concentration on the cathode electrode 11 side in a state of conduction is lowered.

Furthermore, in the semiconductor device 1 according to the embodiment, the carrier distribution 20 is lowered even when a lifetime killer is not introduced.

Figure 7:
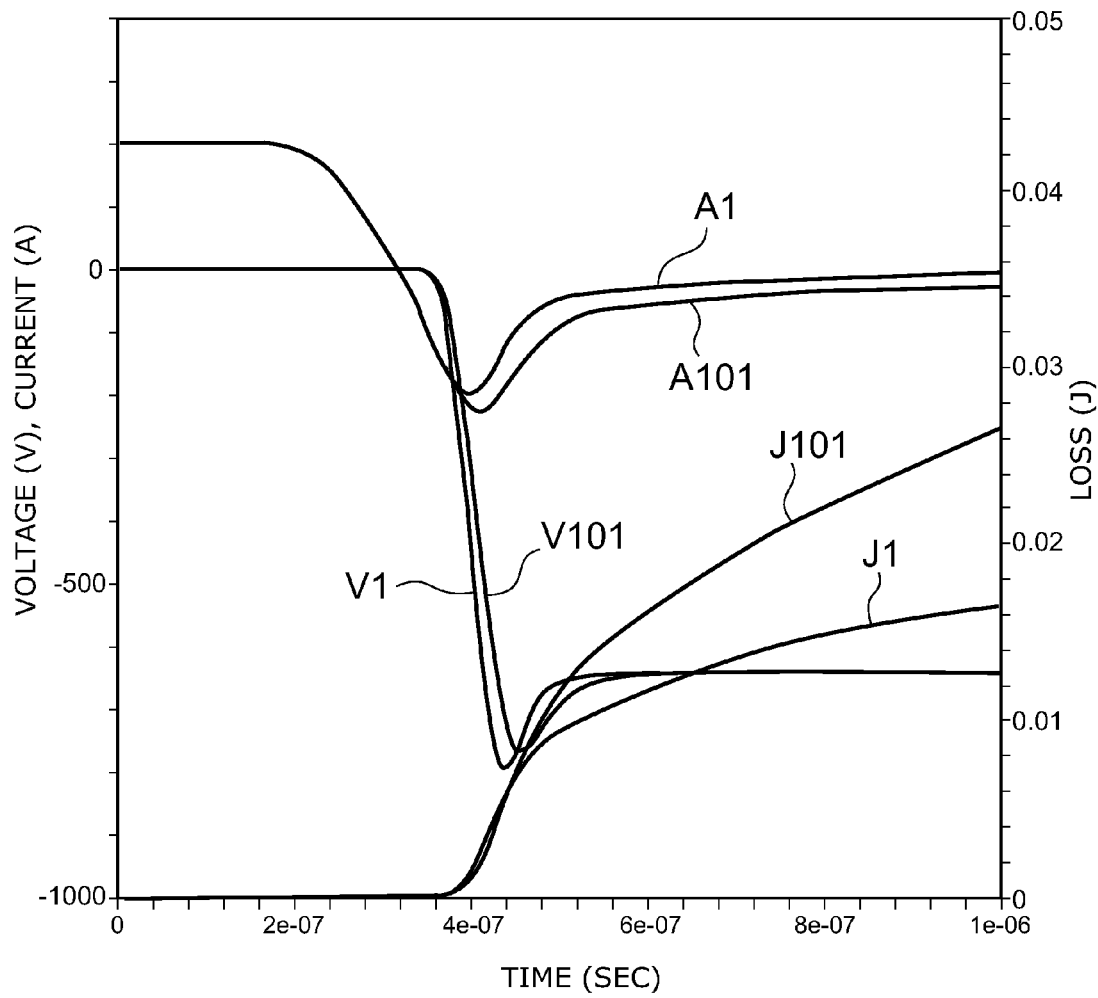
FIG. 7 is a graph illustrating calculation results of a switching current, a switching voltage and switching characteristics from a steady conducting current of 200 amperes (A) of semiconductor devices according to the first embodiment and a comparative example to be described later.

FIG. 7 is a graph illustrating calculation results of a switching current, a switching voltage and switching characteristics from a steady conducting current of 200 amperes (A) of semiconductor devices according to the first embodiment and the comparative example to be described later. The vertical axis shows a current (A), a voltage (V) and a loss (J), and the horizontal axis shows time (sec).

As shown in FIG. 7, in the first embodiment, a recovery period and a tail period of a switching current A1 in the semiconductor device 1 is shorter than a recovery period and a tail period of a switching current A101 in the case of a semiconductor device 101 according to the comparative example to be described later. Furthermore, a switching voltage V1 in the semiconductor device 1 decreases more rapidly and also reaches a steady value more rapidly than a switching voltage V101 in the case of the semiconductor device according to the comparative example to be described later. A switching loss 31 in the semiconductor device 1 is not more than 60% as compared with a switching loss J101 in the case of the semiconductor device according to the comparative example to be described later.

Figure 8A:
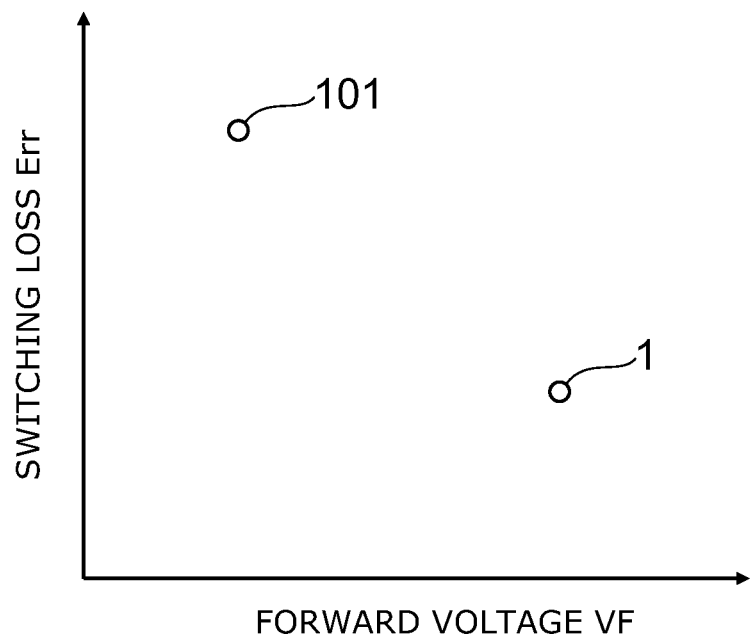
FIG. 8A is a graph illustrating a relation between a switching loss and a forward direction voltage of the semiconductor device according to the first embodiment.

FIG. 8A is a graph illustrating a relation between a switching loss and a forward direction voltage of the semiconductor device according to the first embodiment. The vertical axis shows the switching loss $E_{rr}$, and the horizontal axis shows the forward direction voltage VF.

As shown in FIG. 8A, the switching in the semiconductor device 1 is faster than the switching in the semiconductor device 101 according to the comparative example to be described later.

Figure 8B:
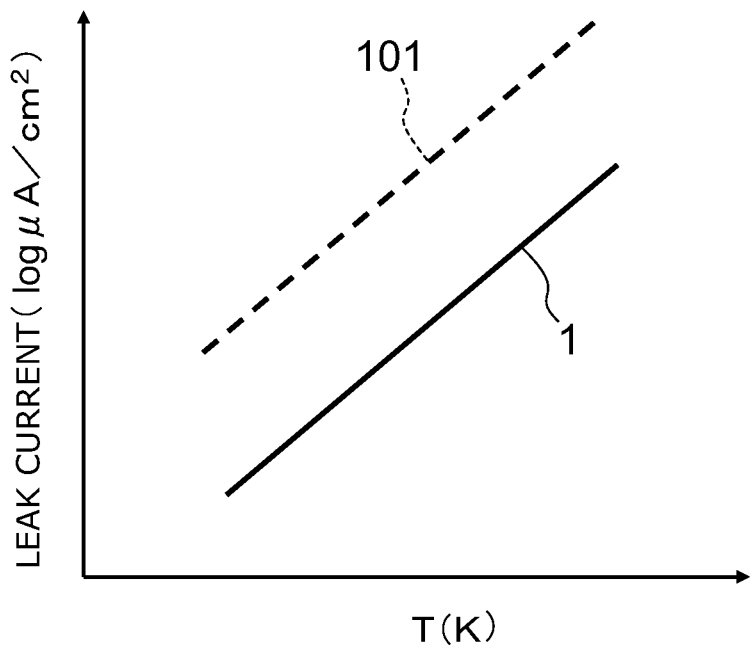
FIG. 8B is a graph illustrating temperature characteristics of a leakage current of the semiconductor device according to the first embodiment.

FIG. 8B is a graph illustrating temperature characteristics of a leakage current of the semiconductor device according to the first embodiment. The vertical axis shows magnitude of a leakage current (log $\mu A/cm^2$), and the horizontal axis shows temperature (K).

As shown in FIG. 8B, in the semiconductor device 1 according to the embodiment, a lifetime killer is not introduced, and thus a leakage current can be made smaller than the leakage current in the semiconductor device 101 according to the comparative example to be described later. Consequently, in particular, at high temperatures, the semiconductor device 1 can be operated safely.

In FIG. 1A and FIG. 1B, the width of the $n^+$ cathode layer 12 is made larger than the width of the part 13b in contact with the cathode electrode 11 in the n cathode layer 13, but is not limited to this. For example, the width of the $n^+$ cathode layer 12 may be made smaller than the width of the part 13b.

(Variation of First Embodiment)

Next, a variation of the first embodiment will be described.

Figure 9A:
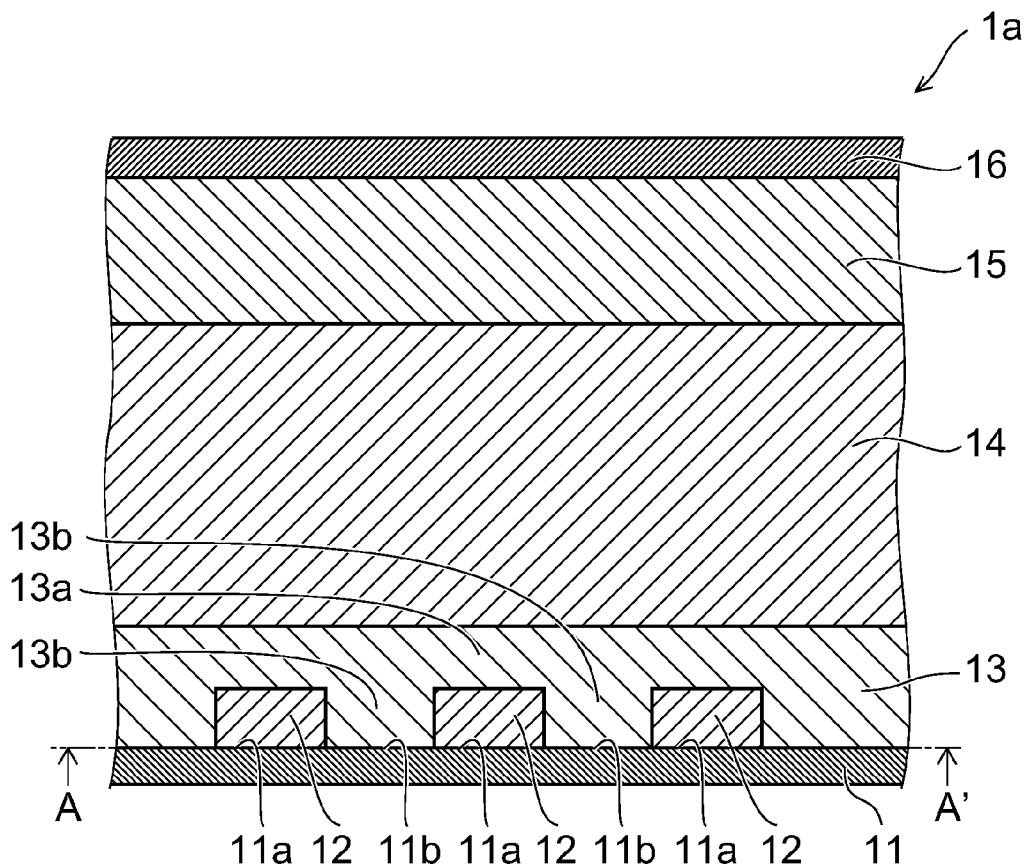
FIG. 9A is a schematic cross-sectional view illustrating a semiconductor device according to a variation of the first embodiment.
Figure 9B:
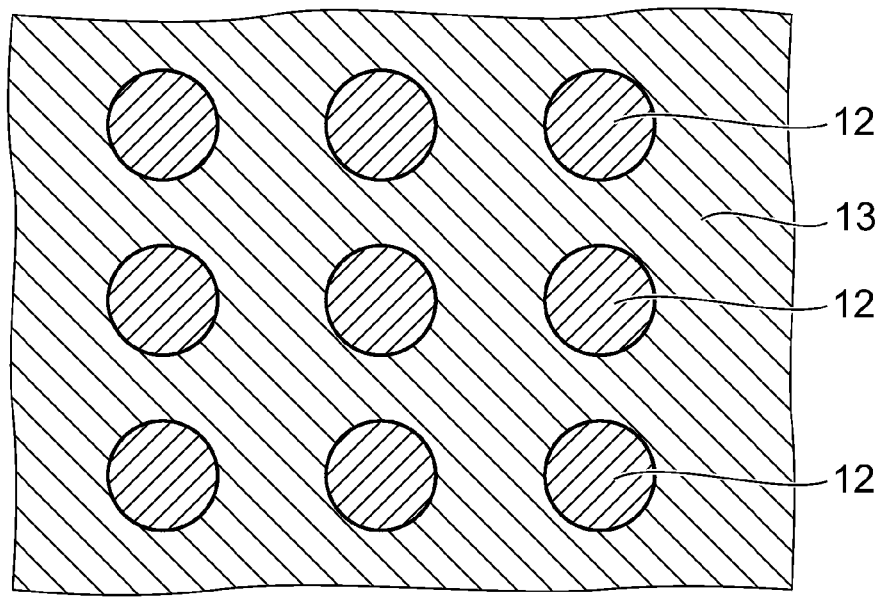
FIG. 9B is a schematic plan view at the position of the AA' line shown in FIG. 9A.

FIG. 9A is a schematic cross-sectional view illustrating the semiconductor device according to the variation of the first embodiment, and FIG. 9B is a schematic plan view at the position of the AA' line shown in FIG. 9A. The cathode electrode is removed in FIG. 9B.

The variation is an example in which the shape and disposition of the $n^+$ cathode layer 12 and the n cathode layer 13 are made different.

As shown in FIG. 9A and FIG. 9B, in a semiconductor device 1a in the variation, a plurality of $n^+$ cathode layers 12 are formed into a circular shape when the semiconductor device 1a is viewed from below. Regions 11a, which is in contact with the $n^+$ cathode layer 12, in the cathode electrode 11 are also made circular. Outer diameters of each of cathode electrodes 11 and each of regions 11a are set, for example, to be not more than 100 micrometers ($\mu$m). A plurality of $n^+$ cathode layers 12 and a plurality of regions 11a are disposed in a matrix state in one direction and in another direction on the cathode electrode 11.

The thickness of the $n^+$ cathode layer 12 is, for example, not more than 5 micrometers ($\mu$m). The distances between the respective $n^+$ cathode layers 12 and the distances between the respective regions 11a are, for example, not more than 50 micrometers ($\mu$m). Configurations other than the above in the variation are the same as those in the first embodiment.

Next, actions in the variation will be described.

In the variation, holes, which are reached the part 13a disposed on the $n^+$ cathode layer 12 in the n cathode layer 13, move in the horizontal direction, i.e., move in the direction parallel to the plate face of the cathode electrode 11, with every direction components radially. Then, holes, which are reached the part 13b in contact with the cathode electrode 11 in the n cathode layer 13, flow into the cathode electrode 11. Actions other than the above in the variation are the same as those in the first embodiment.

Next, effects of the variation will be described.

In the variation, since the region of the $n^+$ cathode layer 12 can be made small, an electron injection amount can be further suppressed, and a higher speed can be realized. Moreover, since the component in the horizontal direction in the hole current is not only in another direction, the hole current can be made uniform. Effects in the variation other than the above are the same as those in the first embodiment.

In FIG. 9B, the region 11a in contact with the $n^+$ cathode layer 12 in the cathode electrode 11 is formed into a circular shape, but the configuration is not limited to this. The region 11b in contact with the n cathode layer 13 in the cathode electrode 11 may be made circular. That is, a plurality of through-holes having a circular cross-sectional shape in a plane parallel to the plate face of the cathode electrode 11 and passing vertically through the $n^+$ cathode layer 12 is formed in the $n^+$ cathode layer 12. Then, the lower end of the n cathode layer 13 may be brought into contact with the cathode electrode 11 via the through-hole.

Comparative Example

Next, the comparative example relative to the first embodiment will be described.

Figure 10:
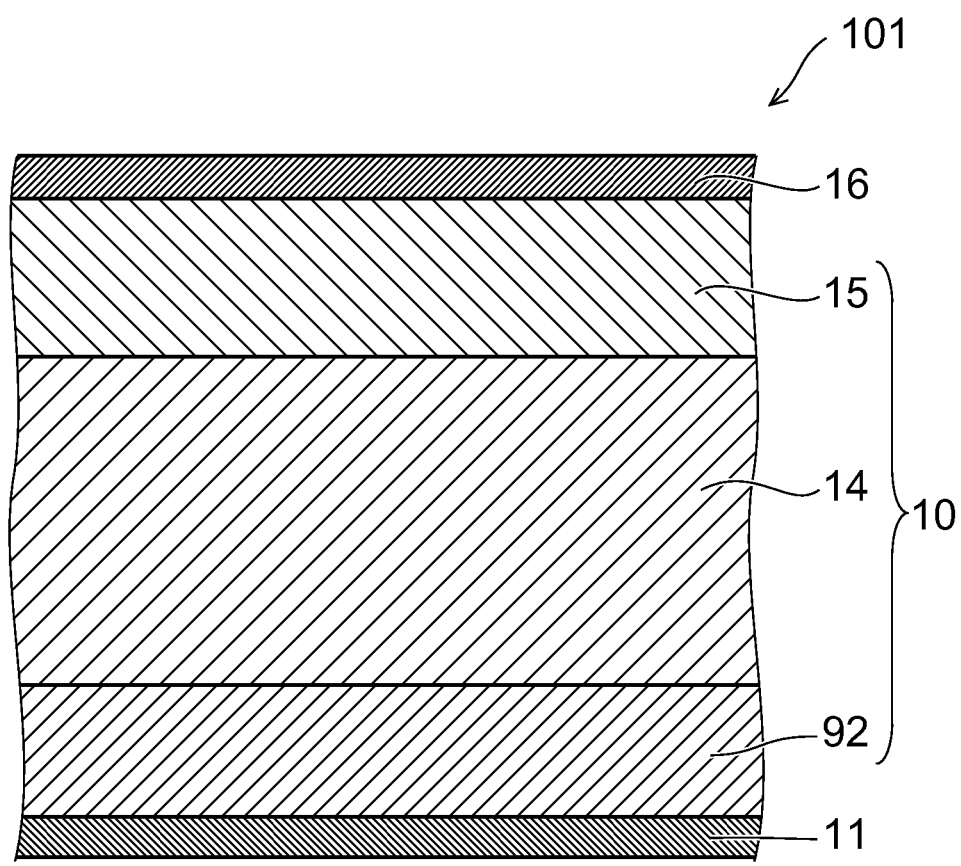
FIG. 10 is a cross-sectional view illustrating the semiconductor device according to the comparative example relative to the first embodiment.

FIG. 10 is a cross-sectional view illustrating the semiconductor device according to a comparative example relative to the first embodiment.

As shown in FIG. 10, for the semiconductor device 101 according to the comparative example, the cathode electrode 11, an $n^+$ cathode layer 92, the n base layer 14, the $p^+$ anode layer 15 and the anode electrode 16 are provided. In the comparative example, the semiconductor layer 10 includes the $n^+$ cathode layer 92, the n base layer 14 and the $p^+$ anode layer 15.

The $n^+$ cathode layer 92 is disposed on the cathode electrode 11. The n base layer 14 is disposed on the $n^+$ cathode layer 92. Accordingly, in the comparative example, on the cathode electrode 11, a plurality of $n^+$ cathode layers 12 is not formed apart from each other on the cathode electrode 11. The $n^+$ cathode layer 92 is formed in layers on the upper face of the cathode electrode 11.

The n base layer 14 is provided on the $n^+$ cathode layer 92. The N cathode layer 13 is not provided between the n base layer 14 and the $n^+$ cathode layer 92. In the n base layer 14, a lifetime killer, for example, a heavy metal element is introduced. Configurations other than the above in the comparative example are the same as those in the first embodiment.

Next, actions of the semiconductor device 101 according to the comparative example will be described.

Between the anode electrode 16 and the cathode electrode 11, a voltage is applied with the anode electrode 16 side being positive with respect to the cathode electrode 11 side. From the $n^+$ cathode layer 92 side, electrons are injected into the n base layer 14. From the $p^+$ anode layer 15 side, holes are injected into the n base layer 14. Consequently, the conductive state is provided between the cathode electrode 11 and the anode electrode 16.

Figure 11A:
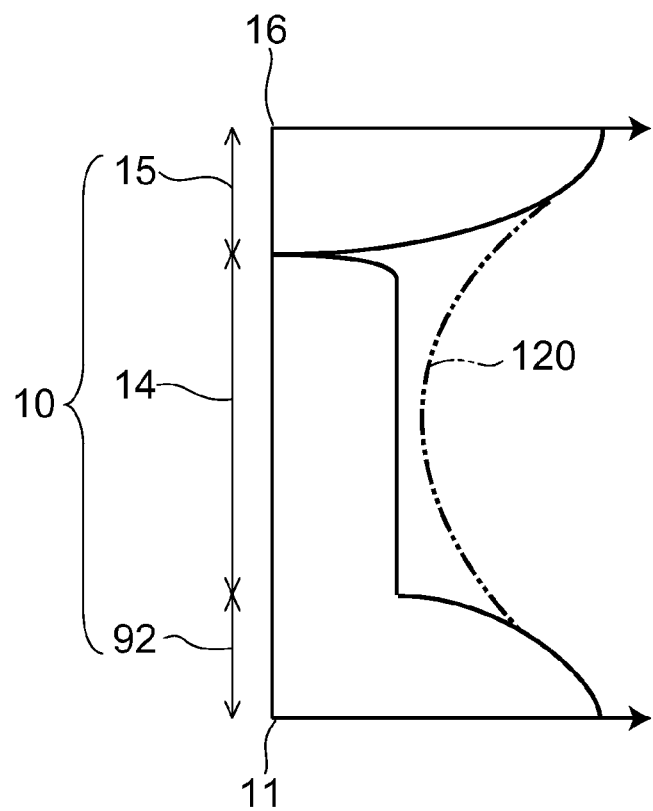
FIG. 11A is a graph illustrating a impurity concentration distribution, and a carrier distribution when the forward bias is applied, in the semiconductor device according to the comparative example relative to the first embodiment.

FIG. 11A is a graph illustrating a impurity concentration distribution, and a carrier distribution when the forward bias is applied, in the semiconductor device according to a comparative example relative to the first embodiment. The vertical axis shows a position in the thickness direction of the semiconductor layer, and the horizontal axis shows the concentration.

As shown in FIG. 11A, in the comparative example, the n cathode layer 13 is not provided, and the carrier concentration on the cathode electrode 11 side can not be lowered.

In addition, when a lifetime killer has been introduced, the value at the central part of the n base layer 14 in the carrier distribution 120 becomes low.

Figure 11B:
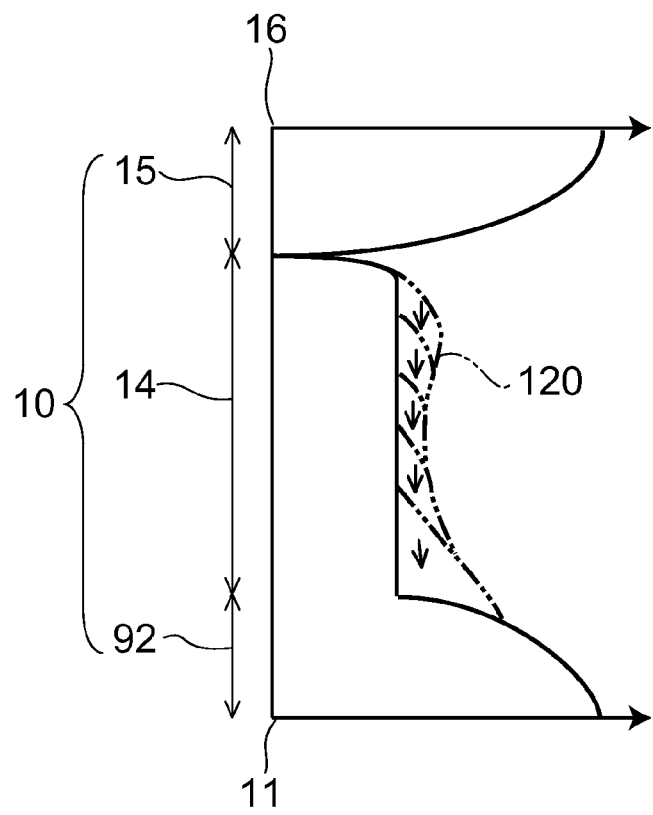
FIG. 11B is a graph illustrating an impurity concentration distribution, and a carrier distribution in a transient state when a reverse bias is applied in the semiconductor device according to the comparative example relative to the first embodiment.

FIG. 11B is a graph illustrating an impurity concentration distribution, and a carrier distribution in a transient state when a reverse bias is applied in the semiconductor device according to a comparative example relative to the first embodiment. The vertical axis shows a position in the thickness direction of the semiconductor layer, and the horizontal axis shows the concentration.

As shown in FIG. 11B, when a state in which the forward bias has been applied is changed into a state in which a reverse bias is applied, that is, the cathode electrode 11 is positive with respect to the anode electrode 16, holes injected in the n base layer 14 move to the anode electrode 16 side. Consequently, the carrier distribution 120 in the n base layer 14 goes back to the cathode electrode 11 side. Moreover, starting from an interface between the $p^+$ anode layer 15 and the n base layer 14, a depletion layer extends in the n base layer 14.

Consequently, conduction between the anode electrode 16 and the cathode electrode 11 in the semiconductor device 101 is cut off. Here, as compared with the lowering in the carrier concentration on the cathode electrode 11 side in a conduction state in the semiconductor device 1 of the embodiment described using FIG. 5 and FIG. 6, the carrier concentration on the cathode electrode 11 side in a conduction state is high, and even at a time when the depletion layer has extended on the cathode electrode 11 side, the carrier concentration on the cathode electrode 11 side is high in FIG. 11. Thereby, speeding up is impossible in the comparative example.

In the comparative example, in order to lower a lifetime, it is necessary to introduce a lifetime killer. Consequently, as shown in FIG. 8B, a leakage current in OFF period increases. Accordingly, an applicable temperature range of the semiconductor device 101 is narrow.

Second Embodiment

Next, a second embodiment will be described.

Figure 12:
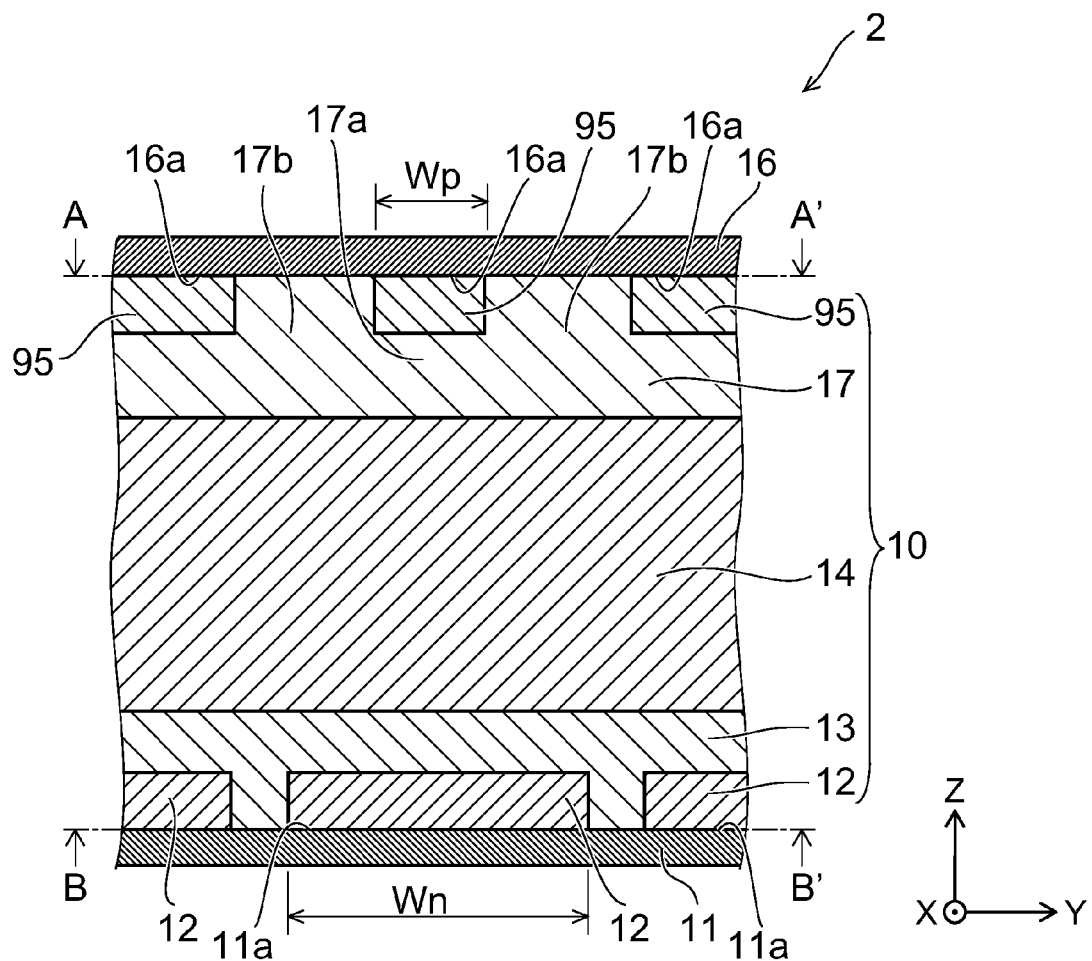
FIG. 12 is a schematic cross-sectional view illustrating a semiconductor device according to a second embodiment.

FIG. 12 is a schematic cross-sectional view illustrating the semiconductor device according to the second embodiment.

Figure 13A:
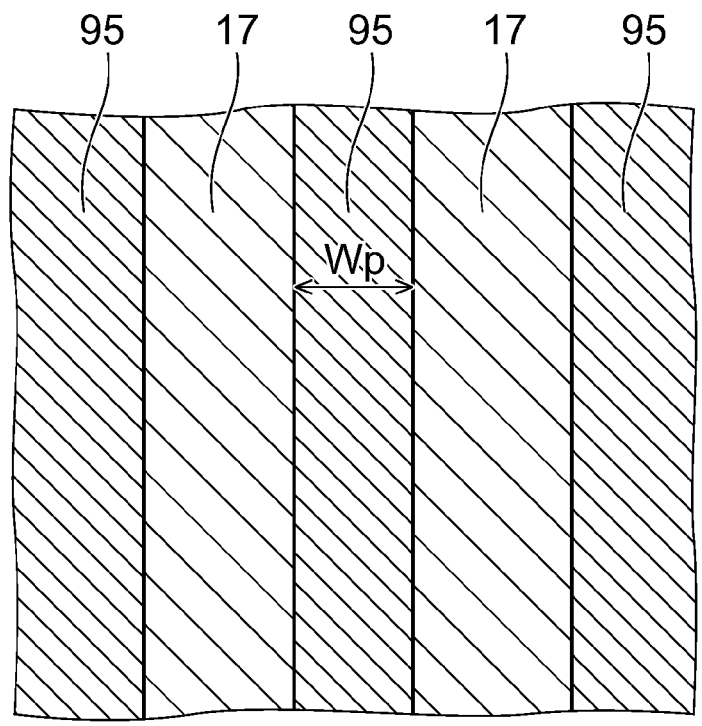
FIG. 13A is a schematic plan view at the position of the AA' line shown in FIG. 12 in the semiconductor device according to the second embodiment.
Figure 13B:
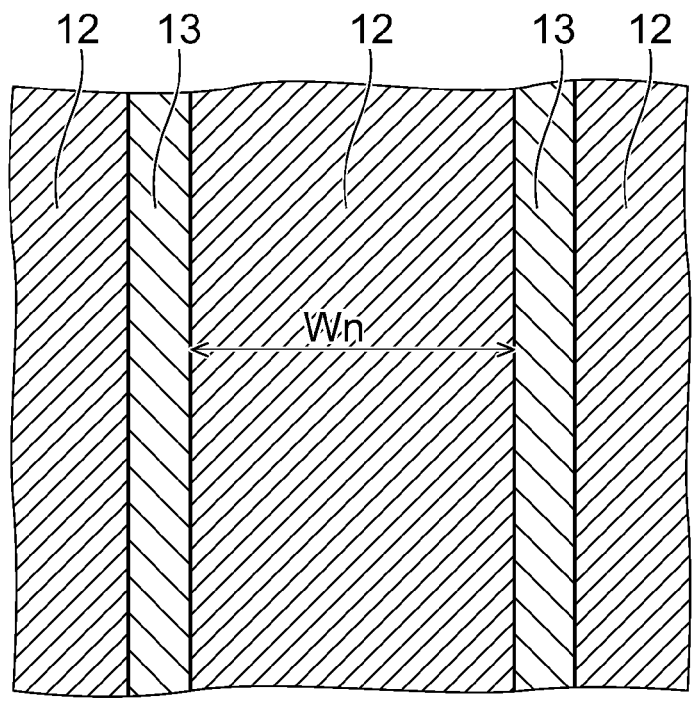
FIG. 13B is a schematic plan view at the position of BB' line shown in FIG. 12.

FIG. 13A is a schematic plan view at the position of the AA' line shown in FIG. 12 in the semiconductor device according to the second embodiment, and FIG. 13B is a schematic plan view at the position of the BB' line shown in FIG. 12.

The anode electrode is removed in FIG. 13A, the cathode is removed in FIG. 13B.

As shown in FIG. 12, FIG. 13A and FIG. 13B, in the semiconductor device 2 according to the embodiment, a p anode layer 17 (a fifth semiconductor layer) is provided on the n base layer 14. The thickness of the p anode layer 17 is from several to several tens micrometers (μm), for example, from 1 to 20 micrometers (μm). The p anode layer 17 includes a semiconductor, such as silicon. In the p anode layer 17, an impurity serving as an acceptor, such as boron, is included. The conductivity type of the p anode layer 17 is the p type. The effective impurity concentration in the p anode layer 17 is lower than the effective impurity concentration in the $p^+$ anode layer 95 (the fourth semiconductor layer). The surface concentration of boron in the p anode layer 17 is, for example, not more than $3 \times 10^{17}$ $cm^{-3}$.

A plurality of the $p^+$ anode layers 95 are disposed on the p anode layer 17 apart from each other. Each of $p^+$ anode layers 95 is formed, for example, into a shape of a plurality of cuboids extending in one direction. The upper part of the p anode layer 17 is sandwiched between the respective $p^+$ anode layers 95. The width Wp of each of $p^+$ anode layers 95 is, for example, not more than 10 micrometers (μm). The thickness of each of $p^+$ anode layers 95 is, for example, not more than 5 micrometers (μm). The width Wn is made larger than the width Wp. The distance between the respective $p^+$ anode layers 95 is, for example, not more than 100 micrometers (μm). The semiconductor layer 10 includes the $n^+$ cathode layer 12, the n cathode layer 13, the n base layer 14, the p anode layer 17 and the $p^+$ anode layer 95.

The anode electrode 16 is disposed on the $p^+$ anode layer 95 and the p anode layer 17. Accordingly, the p anode layer 17 is disposed between the n base layer 14 and the anode electrode 16 and between the n base layer 14 and the $p^+$ anode layer 95. Alternatively, the p anode layer 17 includes a part 17a disposed below the $p^+$ anode layer 95, and a part 17b in contact with the anode electrode 16. The part 17a is provided between the $p^+$ anode layer 95 and the n base layer 14. The part 17b is provided between the n base layer 14 and the anode electrode 16. The anode electrode 16 and the $p^+$ anode layer 95 are in ohmic contact.

A region 16a (a second region), which is in contact with the $p^+$ anode layer 95, in the anode electrode 16 also extends in one direction. For example, the $p^+$ anode layer 95 is positioned in a region directly under the region 16a, i.e., in a region immediately below the region 16a. Accordingly, the width of the region 16a is also the width Wp. The width Wn is larger than the width Wp. Accordingly, the area of each of regions 11a is larger than the area of each of the region 16a. For example, an area Sn obtained by totaling the area of each of regions 11a is larger than an area Sp obtained by totaling the area of each of regions 16a. The distance between the respective regions 16a is equal to the distance between the respective $p^+$ anode layers 95, and is, for example, not more than 100 micrometers (μm).

The anode electrode 16 includes aluminum and an effective surface impurity concentration in the p anode layer 17 is not more than $3 \times 10^{17}$ $cm^{-3}$, and thus the anode electrode 16 and the p anode layer 17 are in Schottky contact. Configurations other than the above in the embodiment are the same as those in the first embodiment.

Next, actions of the semiconductor device according to the second embodiment will be described. Between the anode electrode 16 and the cathode electrode 11, a forward bias, i.e., a voltage with the anode electrode 16 side being positive with respect to the cathode electrode 11 side is applied. From the n cathode layer 13 side, electrons are injected into the n base layer 14. From the p anode layer 17 side, holes are injected into the n base layer 14. Consequently, a conductive state is provided between the anode electrode 16 and the cathode electrode 11. As mentioned above, electrons are injected into the n base layer 14 from the $n^+$ cathode layer 12 through the n cathode layer 13.

The boundary between the p anode layer 17 and the anode electrode 16 does not serve as an energy barrier for electrons. Accordingly, electrons injected into the n base layer 14 flow into the anode electrode 16 through the p anode layer 17. Thereby, an electron current is formed.

The boundary between the p anode layer 17 and the $p^+$ anode layer 95 serves as an energy barrier for electrons. Accordingly, electrons in the p anode layer 17 are less likely to flow into the $p^+$ anode layer 95. Therefore, electrons in the p anode layer 17 move below the $p^+$ anode layer 95 in a horizontal direction, that is, move in another direction in a plane parallel to the plate face of the anode electrode 16.

Due to the movement of electrons in another direction in the p anode layer 17, a forward bias is applied so that the part 17a disposed below the $p^+$ anode layer 95 becomes negative with respect to the part 17b in contact with the anode electrode 16. That is, a forward bias is applied so that the part 17a becomes negative with respect to the anode electrode 16.

Because of the bias formed between the part 17a and the anode electrode 16, the energy barrier for holes between the p anode layer 17 below the p$^+$ anode layer 95, and the p$^+$ anode layer 95 becomes low. Consequently, from the p$^+$ anode layer 95, holes are injected into the p anode layer 17. Holes injected into the p anode layer 17 form a hole current.

Figure 14:
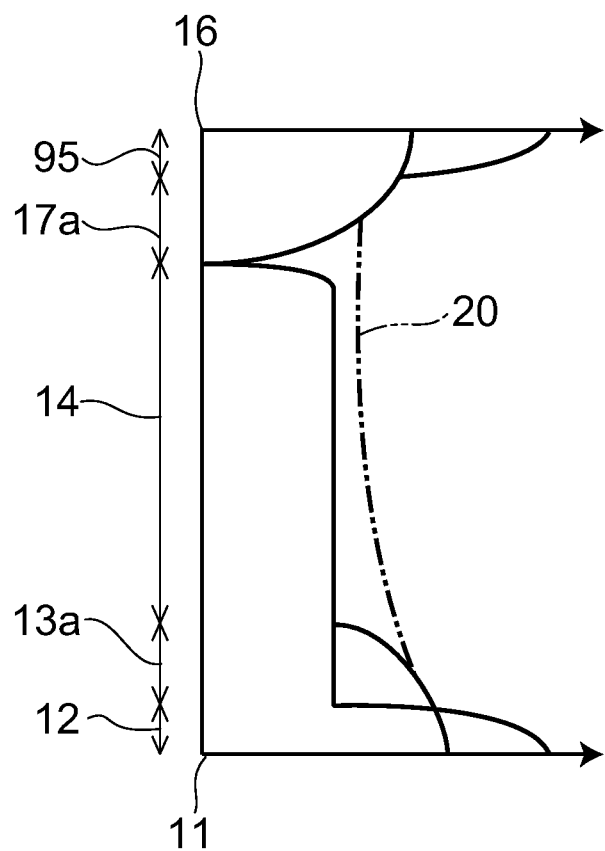
FIG. 14 is a graph illustrating the impurity concentration distribution, and the carrier distribution, when the forward bias is applied in the semiconductor device according to the second embodiment.

FIG. 14 is a graph illustrating the impurity concentration distribution, and the carrier distribution, when the forward bias is applied in the semiconductor device according to the second embodiment. The vertical axis shows a position in the thickness direction of the semiconductor layer, and the horizontal axis shows the concentration.

Figure 15:
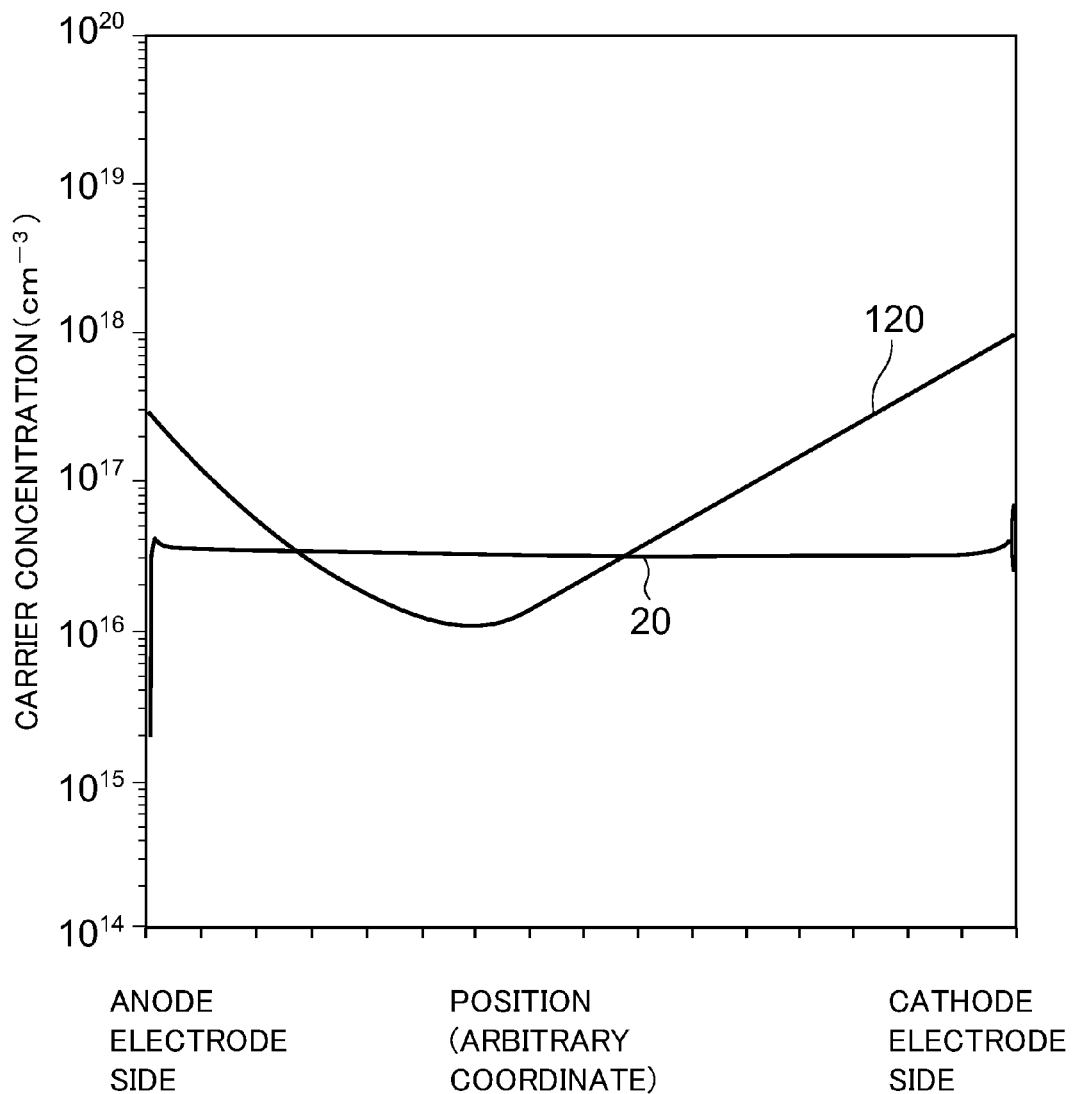
FIG. 15 is a graph illustrating a calculation result of a carrier distribution in a steady conduction state of approximately 100 A/cm2 when the forward bias is applied, in semiconductor devices according to the second embodiment and a comparative example.

FIG. 15 is a graph illustrating a calculation result of a carrier distribution in a steady conduction state of approximately 100 A/cm$^2$ when the forward bias is applied, in semiconductor devices according to the second embodiment and the comparative example. The horizontal axis shows a position in the semiconductor layer in the thickness direction, and the vertical axis shows the carrier concentration (cm$^{-3}$).

As shown in FIG. 14, impurity concentrations in the n$^+$ cathode layer 12 and the p$^+$ anode layer 95 are higher than impurity concentrations in the n cathode layer 13, the n base layer 14 and the p anode layer 17.

The impurity concentration in the p anode layer 17 is a concentration between concentrations in the p$^+$ anode layer 95 and the n base layer 14. The impurity concentration in the part 17a disposed below the p$^+$ anode layer 95 is highest at the part in contact with the p$^+$ anode layer 95. The impurity concentration in the part 17b in contact with the anode electrode 16 is highest at the upper end.

In addition to the lowering in the injection amount of electrons due to the n cathode layer 13, by providing the p anode layer 17, the injection amount of holes from the p$^+$ anode layer 95 is also lowered. Consequently, the carrier distribution 20 becomes, as shown in FIG. 15, flatter than the carrier distribution 120 in the semiconductor device according to the comparative example.

When a state in which the forward bias is applied between the anode electrode 16 and the cathode electrode 11 is changed into a state in which a reverse bias is applied, that is, the cathode electrode 11 with respect to the anode electrode 16 is positive, holes existing in the n base layer 14 move to the anode electrode 16 side. Electrons existing in the n base layer 14 move to the cathode electrode 11 side.

Consequently, the carrier distribution 20 in the n base layer 14 goes back to the cathode electrode 11 side. Furthermore, starting from an interface between the p anode layer 17 and the n base layer 14, a depletion layer extends in the n base layer 14. Consequently, conduction between the anode electrode 16 and the cathode electrode 11 in the semiconductor device 1 is cut off.

Figure 16A:
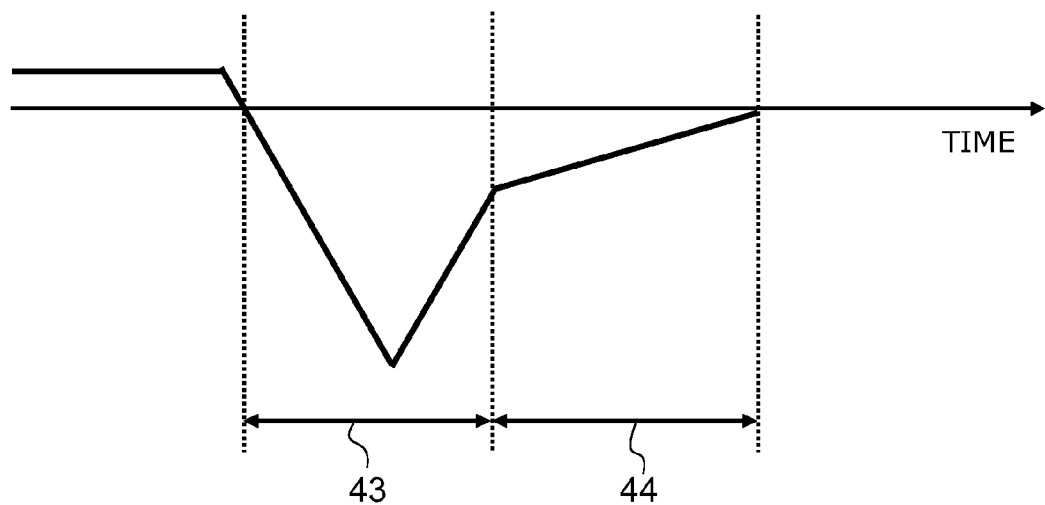
FIG. 16A is a graph illustrating a switching current from a small conduction current of approximately several amperes (A) in the semiconductor device according to the second embodiment.
Figure 16B:
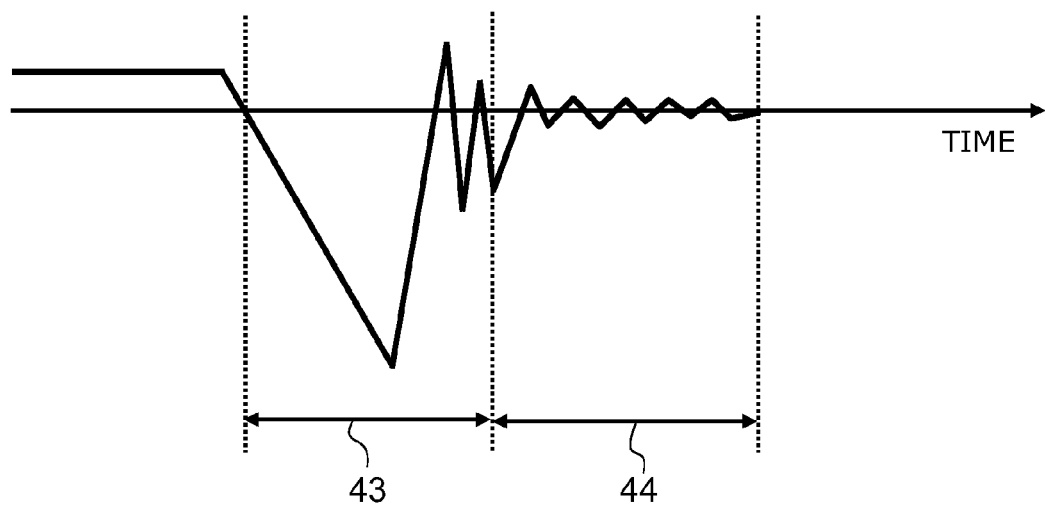
FIG. 16B is a graph illustrating a switching current from a small conduction current of approximately several amperes (A) in the semiconductor device according to a comparative example relative to the first embodiment.

FIG. 16A is a graph illustrating a switching current from a small conduction current of approximately several amperes (A) in the semiconductor device according to the second embodiment. The vertical axis shows a current, and the horizontal axis shows time. FIG. 16B is a graph illustrating a switching current from a small conduction current of approximately several amperes (A) in the semiconductor device according to a comparative example relative to the first embodiment. The vertical axis shows a current, and the horizontal axis shows time.

In the case of the width Wn>the width Wp of the embodiment shown in FIG. 16A, immediately after the application of a reverse bias between the anode electrode 16 and the cathode electrode 11 in the semiconductor device 2, due to holes and electrons existing in the n base layer 14, a current flows in the reverse direction. Then, the current amount in the reverse direction becomes the maximum value. After that, the reverse current decreases. After the reverse current has decreased to a prescribed value, it decreases slowly. Then, the current value becomes zero.

A recovery period 43 is defined as a period from time point when the current becomes zero until the current amount in the reverse direction exhibits a gentle gradient through the maximum value immediately after the application of the reverse bias. A tail period 44 is defined as a period from time point when the current value decreases gently with a prescribed gradient until the current value becomes zero.

By lowering the injection amount of holes on the anode electrode 16 side, the recovery period 43 is shortened. By lowering the injection amount of electrons on the cathode electrode 11 side, the tail period 44 is shortened.

In the case of the width Wn>the width Wp, it is possible to make the injection amount of electrons on the cathode electrode 11 side larger than the injection amount of holes on the anode electrode 16 side. That is, the accumulation amount of carriers on the cathode electrode 11 side in a steady state can be made larger than the accumulation amount of carriers on the anode electrode 16 side in a steady state. Consequently, it is possible to cause carriers to remain on the cathode electrode 11 side of the n base layer 14 in a transition state. Therefore, a current vibration in a current waveform can be suppressed.

In order to make the injection amount of electrons on the cathode electrode 11 side larger than the injection amount of holes on the anode electrode 16 side, the width Wn of the region 11a is made larger than the width Wp of region 16a. That is, the relation of the width Wn>the width Wp, is made to be satisfied. In addition, the area Sn is made larger than the area Sp.

In FIG. 16B, a case where the width Wn is not more than the width Wp, i.e., a case where the width Wn the width Wp holds, is shown. In this case, carriers cannot be caused to remain on the cathode electrode 11 side of the n base layer 14 in a transition period. This is because, since the injection amount of electrons on the cathode electrode 11 side is smaller than the injection amount of holes on the anode electrode 16 side in a steady state of conduction, at a time period when accumulated carriers on the anode electrode 16 side have decreased in the early stage of recovery, accumulated carriers on the cathode electrode 11 side have also disappeared.

Consequently, for example, at the end of the recovery period 43, current vibration, in which the current changes twitchily, is generated. In this case, noise becomes large. As described above, in a switching current from a small conduction current of approximately several amperes (A), vibration tends to be generated because the carrier density is low, differently from a steady conduction current. However, diodes according to the embodiment do not vibrate.

Next, effects of the embodiment will be described. In the semiconductor device 2 according to the embodiment, since the n cathode layer 13 and the p anode layer 17 are provided, the electron injection amount and the hole injection amount can be suppressed. Accordingly, carrier distributions on the cathode electrode 11 side and the anode electrode 16 side are lowered. Consequently, the switching action becomes faster.

In the embodiment, the width Wn is made larger than the width Wp in the semiconductor device 2. In addition, the area Sn is made larger than the area Sp. Furthermore, the current path in a horizontal direction in the part 13a is made larger than the current path in a horizontal direction in the part 17a, to make the bias between the part 13a and the part 13b large.

As described above, the amount of electrons injected into the n cathode layer 13 is made larger than the amount of holes injected into the p anode layer 17. Consequently, the carrier concentration on the p anode layer 17 side is made to be lowered than the concentration on the n cathode layer 13 side. Accordingly, the tail current is considerably lowered at turn-off switching. In addition, the switching loss is lowered to not more than 60%.

Moreover, the generation of current vibration at switching from the forward bias to the reverse bias can be suppressed. Consequently, the generation of noise is suppressed. The function and effect other than the above in the embodiment are the same as in the first embodiment.

The p+ anode layer 95 and the region 16a have been disposed so as to extend in one direction, but the configuration is not limited to this. The p+ anode layer 95 and the region 16a may extend in one of one direction and another direction intersecting with the one direction. The structure in the case of the intersecting will be described later.

(First Variation of Second Embodiment)

Next, a first variation of the second embodiment will be described.

Figure 17:
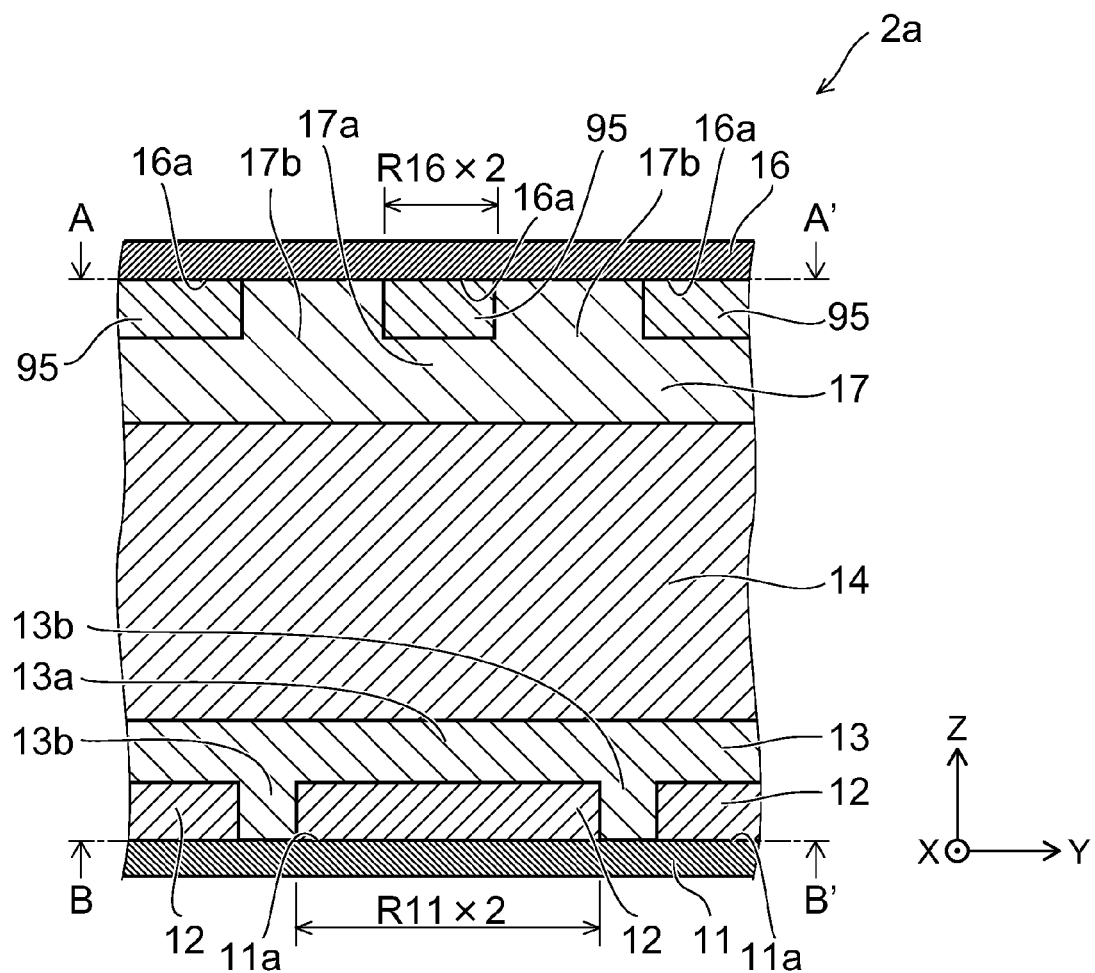
FIG. 17 is a schematic cross-sectional view illustrating a semiconductor device according to a first variation of the second embodiment.

FIG. 17 is a schematic cross-sectional view illustrating the semiconductor device according to the first variation of the second embodiment.

Figure 18A:
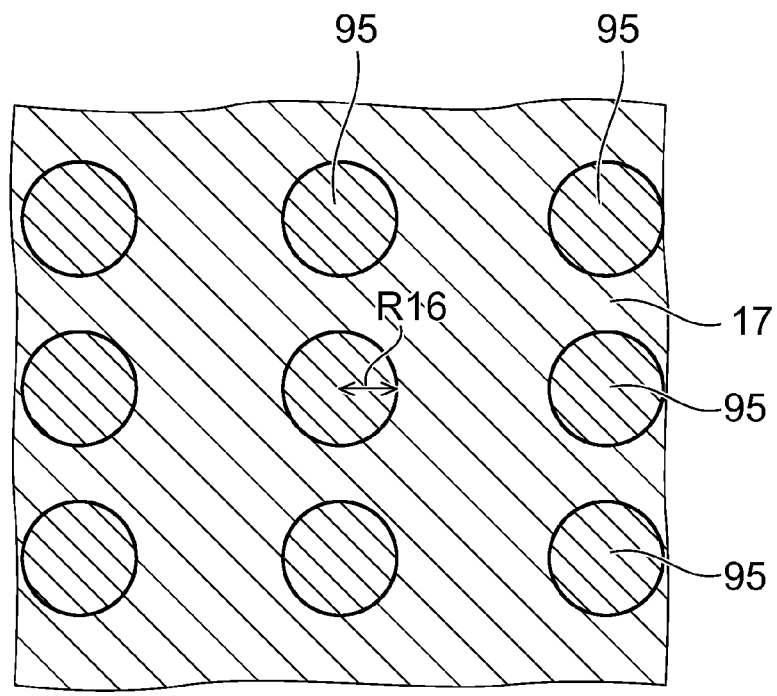
FIG. 18A is a schematic plan view at the position of the AA' line shown in FIG. 17.
Figure 18B:
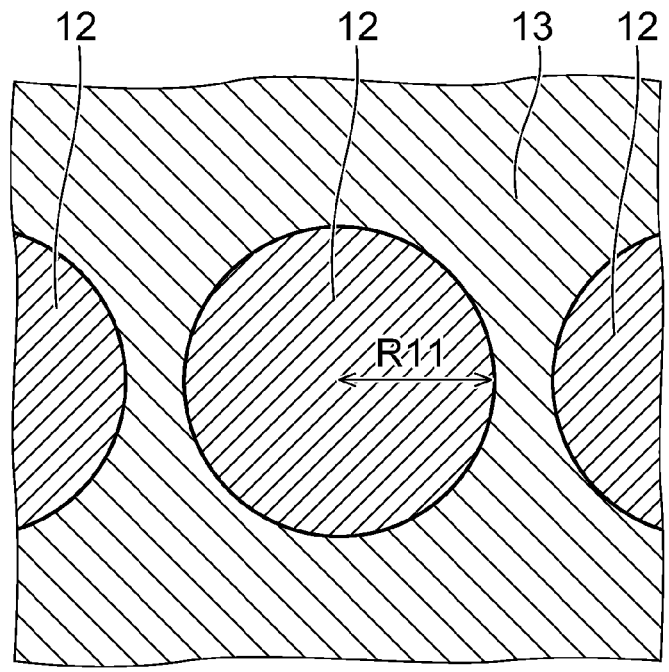
FIG. 18B is a schematic plan view at the position of the BB' line shown in FIG. 17, in the semiconductor device according to the first variation of the second embodiment.

FIG. 18A is a schematic plan view at the position of the AA' line shown in FIG. 17, and FIG. 18B is a schematic plan view at the position of the BB' line shown in FIG. 17, in the semiconductor device according to the first variation of the second embodiment.

The anode electrode is removed in FIG. 18A, the cathode electrode is removed in FIG. 18B.

The variation is an example, in which the shape and the disposition of the n+ cathode layer 12 and the n cathode layer 13, and of the p+ anode layer 95 and the p anode layer 17 are different.

As shown in FIG. 17 and FIG. 18A, a plurality of p+ anode layers 95 is provided apart from each other on the p anode layer 17 in the semiconductor device 2a in the variation. Each of p+ anode layers 95 is formed into a circular shape when viewed from above. Each of regions 16a in contact with the p+ anode layer 95 in the anode electrode 16 is also formed into a circular shape.

A radius R16 of each of p+ anode layers 95 and each of regions 16a is, for example, made not more than 10 micrometers (μm). A plurality of p+ anode layers 95 and a plurality of regions 16a is arranged in a matrix state in one and another directions below the anode electrode 16. The thickness of the p+ anode layer 95 is, for example, not more than 5 micrometers (μm). The distances between the respective p+ anode layers 95 and the distances between the respective regions 16a are, for example, not more than 50 micrometers (μm).

As shown in FIG. 18B, a plurality of n+ cathode layers 12 are provided on the cathode electrode 11. Each of n+ cathode layer 12 is also formed into a circular shape when viewed from above. Each of regions 11a, which is in contact with the n+ cathode layer 12 in the cathode electrode 11, is also formed into a circular shape. The radius R11 of each of n+ cathode layers 12 and each of regions 11a is made, for example, to be not more than 100 micrometers (μm). A plurality of n+ cathode layers 12 and a plurality of regions 11a are arranged, on the cathode electrode 11, in a matrix state in one direction and another direction.

The thickness of the n+ cathode layer 12 is, for example, not more than 5 micrometers (μm). The distances between the respective n+ cathode layers 12 and the respective regions 11a are, for example, not more than 50 micrometers (μm).

The radius R11 is made larger than the radius R16. And, the area Sn is made larger than the area Sp. Furthermore, a distance from the centroid (gravity center) of each of regions 11a to an end edge of each of the regions 11a is made larger than a distance from the centroid of each of regions 16a to an end edge of each of the regions 16a.

Configurations other than the above in the variation are the same as those in the second embodiment.

Next, actions of the semiconductor device 2a according to the variation will be described.

In the variation, electrons, which are reached the region directly under the p+ anode layer 95 in the p anode layer 17, move in the horizontal direction, i.e., move in the direction parallel to the plate face of the anode electrode 16, with components in every direction radially. Then, electrons, which are reached parts other than the region directly under the p+ anode layer 95, flow into the anode electrode 16.

Holes, which are reached the region directly over the n+ cathode layer 12 in the n cathode layer 13, move in the horizontal direction, i.e., move in the direction parallel to the plate face of the cathode electrode 11, with components in every direction radially. Then, holes, which are reached parts other than the region directly over the n+ cathode layer 12, flow into the cathode electrode 11.

Since the radius R11 of the n+ cathode layer 12 and the region 11a is made larger than the radius R16 of the p+ anode layer 95 and the region 16a, the injection amount of electrons on the cathode electrode 11 side becomes larger than the injection amount of holes on the anode electrode 16 side. Furthermore, since the distance from the centroid of each of regions 11a to an end edge of each of the regions 11a is made larger than the distance from the centroid of each of regions 16a to an end edge of each of regions 16a, a current path in the part 13a becomes larger than a current path in the part 17a.

Actions other than above in the variation are the same as those in the first embodiment.

Next, effects of the variation will be described. Since components in horizontal directions in the hole current and the electron current have components other than only in another direction, the hole current and the electron current can be made uniform. In addition, the current path in the part 13a is larger than the current path in the part 17a in the variation. Accordingly, the bias between the part 13a and the part 13b becomes larger than the bias between the part 17a and the part 17b. Consequently, the hole injection amount is lowered than the electron injection amount, to lower the switching loss. Effects other than the above in the variation are the same as those in the first embodiment.

(Second Variation of Second Embodiment)

Next, a second variation of the second embodiment will be described.

Figure 19:
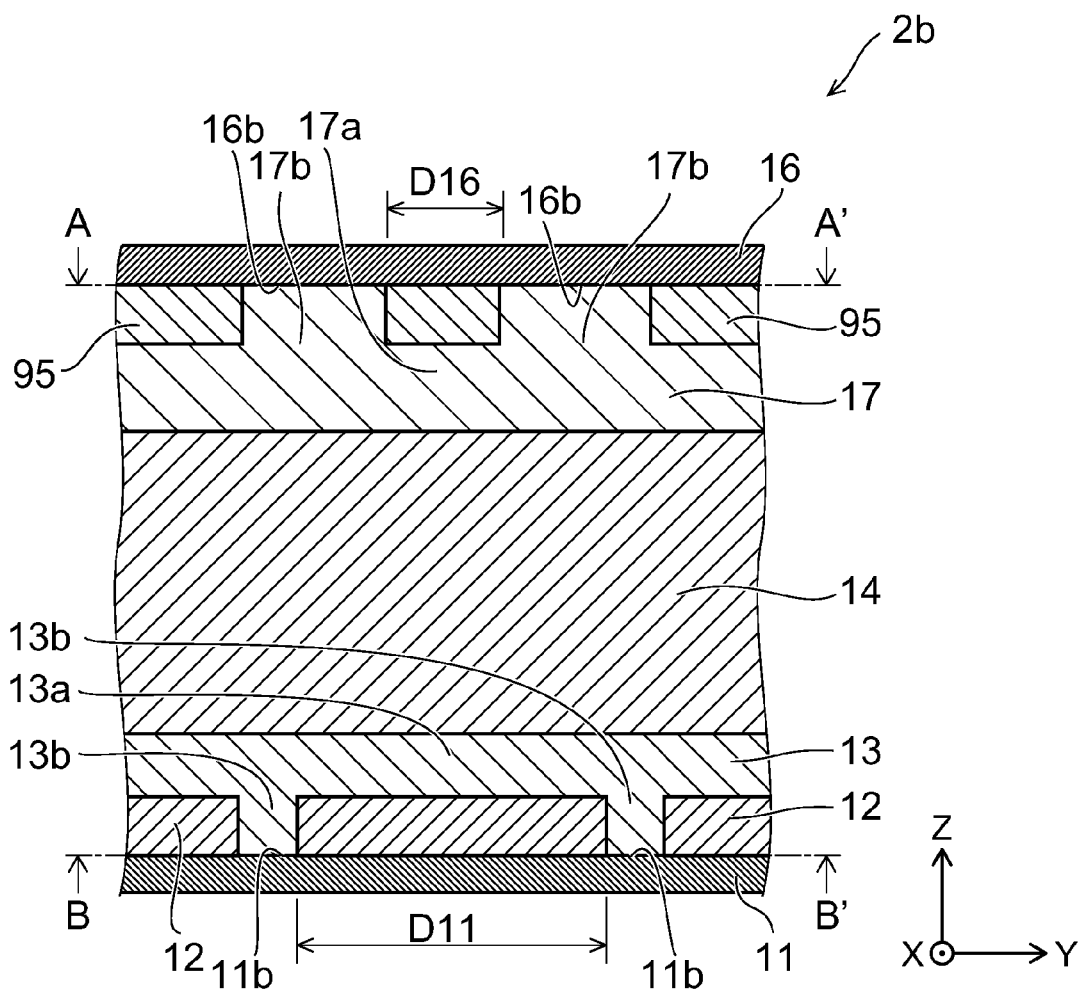
FIG. 19 is a schematic cross-sectional view illustrating a semiconductor device according to a second variation of the second embodiment.

FIG. 19 is a schematic cross-sectional view illustrating the semiconductor device according to the second variation of the second embodiment.

Figure 20A:
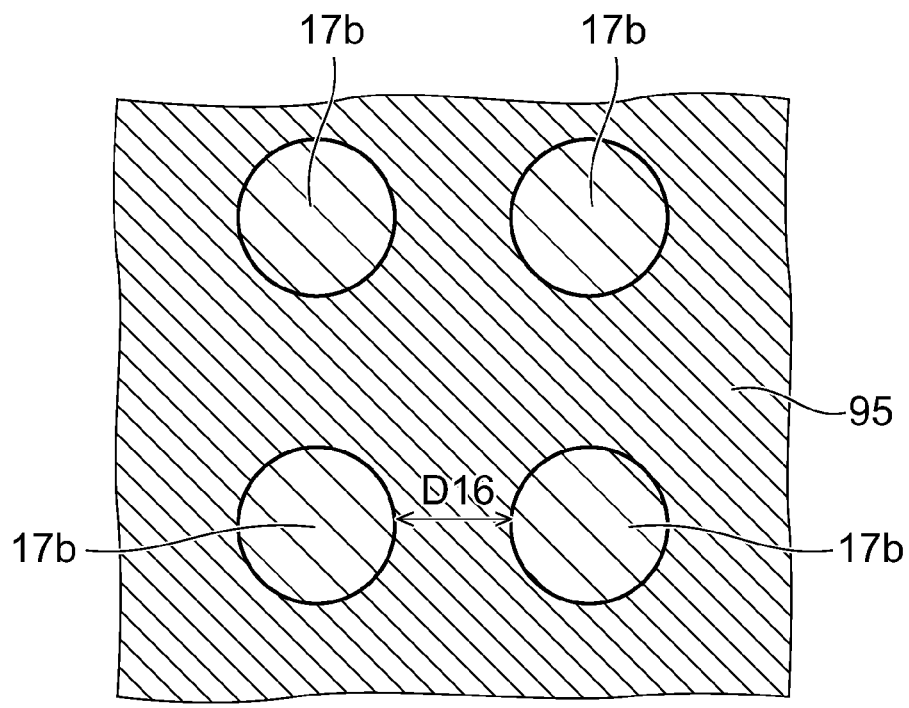
FIGS. 20A and 20B are schematic plan views at the position of the AA' line shown in FIG. 19.
Figure 20B:
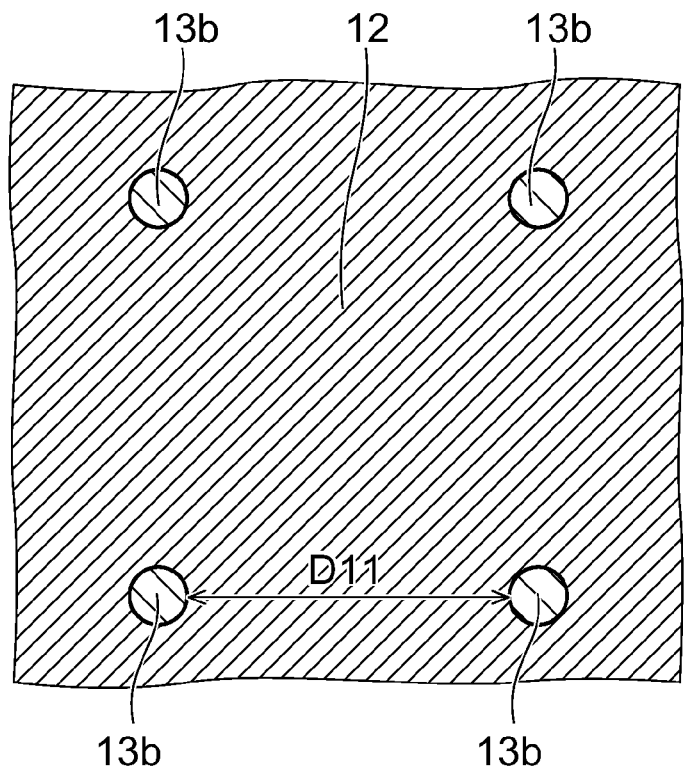

FIG. 20A is a schematic plan view at the position of the AA' line shown in FIG. 19, FIG. 20B is a schematic plan view at the position of the BB' line shown in FIG. 19, in the semiconductor device according to the second variation of the second embodiment.

The anode electrode is removed in FIG. 20A, the cathode electrode is removed in FIG. 20B.

The variation is another example in which the shape and the disposition of the n+ cathode layer 12 and the n cathode layer 13, and of the p+ anode layer 95 and the p anode layer 17 are different.

As shown in FIG. 19 and FIG. 20A, in the semiconductor device 2b according to the variation, the region 16b in contact with the p anode layer 17 in the anode electrode 16 is formed into a circular shape. That is, the p anode layer 17 includes a plurality of parts 17b in contact with the anode electrode 16. The part 17b is circular when viewed from above. A plurality of parts 17b is connected to the part 17a disposed below the p+ anode layer 95 in the p anode layer 17.

As shown in FIG. 20B, the region 11b in contact with the n cathode layer 13 in the cathode electrode 11 is formed into a circular shape. That is, the n cathode layer 13 includes a plurality of parts 13b in contact with the cathode electrode 11. The part 13b is circular when viewed from above. A plurality of parts 13b is connected to the part 13a disposed on the n+ cathode layer 12 in the n cathode layer 13.

Then, the distance D11 between parts 13b adjacent to each other and the distance D11 between regions 11b adjacent to each other is made larger than the distance D16 between parts 17b adjacent to each other and the distance D16 between regions 17b adjacent to each other. Configurations other than the above in the variation are the same as those in the second embodiment.

Next, actions of the semiconductor device according to the variation will be described.

In the variation, holes in the part 17a in the p anode layer 17 move in the horizontal direction, i.e., move in the direction parallel to the plate face of the anode electrode 16, with components in all directions radially. Then, holes, which are reached the part 17b, flow into the anode electrode 16 through the part 17b.

Furthermore, holes in the part 13a in the n cathode layer 13 move in the horizontal direction, i.e., move in the direction parallel to the plate face of the cathode electrode 11, with components in every direction radially. Then, holes, which are reached the contacting part 13b, flow into the cathode electrode 11 through the part 13b.

The distance D11 is made larger than the distance D16. Accordingly, the current path in the part 13a is made larger than the current path in the part 17a. In addition, the area Sn is made larger than the area Sp. Consequently, the injection amount of electrons on the cathode electrode 11 side is made larger than the injection amount of holes on the anode electrode 16 side. Operations and effects other than the above in the variation are the same as those in the second embodiment.

It is also possible to combine the first variation and the second variation. That is, for example, the p+ anode layer 95 is circular when viewed from above and the region 11b in contact with the n cathode layer 13 in the cathode electrode 11 is formed into a circular shape, etc. In the case, too, it is sufficient to make the distance D11 larger than a diameter 2×R11. And, it is sufficient to make the area Sn larger than the area Sp.

(Third Variation of Second Embodiment)

Next, a third variation of the second embodiment will be described.

Figure 21:
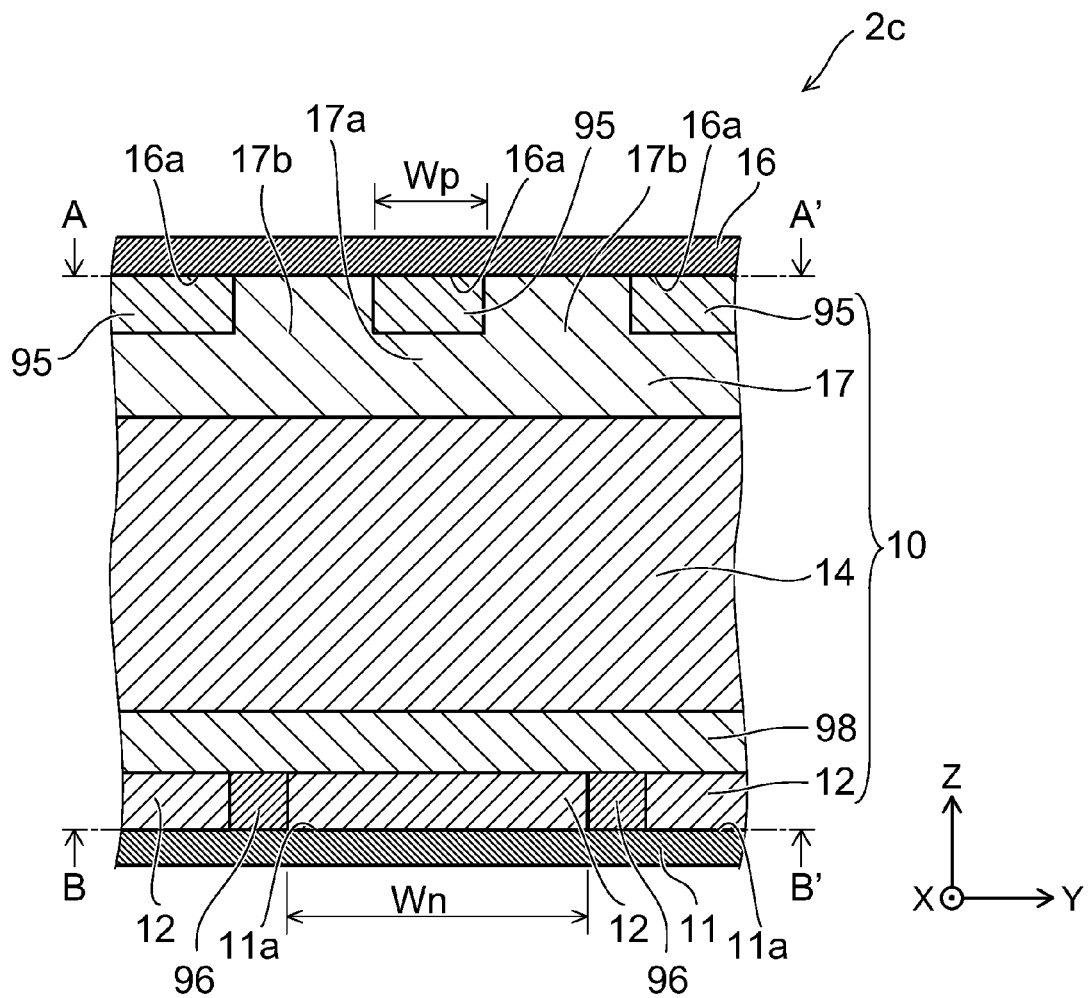
FIG. 21 is a schematic cross-sectional view illustrating a semiconductor device according to a third variation of the second embodiment.

FIG. 21 is a schematic cross-sectional view illustrating the semiconductor device according to the third variation of the second embodiment.

As shown in FIG. 21, in the variation, a p+ sucking-out layer 96 (a sixth semiconductor layer: expressed also as a p+ cathode layer 96) is formed between the respective n+ cathode layers 12 on the cathode electrode 11. A planar shape at the position of the AA' line, seen from below after removing the cathode electrode 11, may be one of a stripe shape and a polka-dot shape, in the same manner as in the second embodiment, the first variation of the second embodiment and the second variation of the second embodiment. The stripe shape and the polka-dot shape include the lower face of the p+ sucking-out layer 96. The stripe shape and the polka-dot shape may include, in addition to the lower face of the p+ sucking-out layer 96, the lower face of the part in contact with the cathode electrode 11 in the n cathode layer 13.

The thickness of the p+ sucking-out layer 96 is, for example, not more than 5 micrometers (μm). The p+ sucking-out layer 96 includes a semiconductor, for example, silicon. In the p+ sucking-out layer 96, an impurity serving as an acceptor, for example, boron is included. The conductivity type of the p+ sucking-out layer 96 is the p type. The surface concentration of boron in the part of the p+ sucking-out layer 96 in contact with the cathode electrode 11 is, for example, not less than $3 \times 10^{17}$ cm$^{-3}$. The cathode electrode 11 and the p+ sucking-out layer 96 are in ohmic contact.

The n cathode layer 98 is provided on the n+ cathode layer 12 and the p+ sucking-out layer 96. The n cathode layer 98 includes a semiconductor, such as silicon. In the n cathode layer 98, an impurity serving as a donor, for example, phosphorous is included. The conductivity type of the n cathode layer 13 is the n type. The effective impurity concentration in the n cathode layer 13 is lower than the effective impurity concentration in the n+ cathode layer 12. The surface concentration of phosphorous in the part of the n cathode layer 98 in contact with the cathode electrode 11 is, for example, not more than $3 \times 10^{17}$ cm$^{-3}$.

Next, actions and effects of the semiconductor device according to the variation will be described.

The p+ sucking-out layer 96 of the variation does not work as a barrier for holes injected from the p+ anode layer 15, but has a function to discharge holes. Consequently, as described in the first embodiment, holes flow into the cathode electrode 11 through the n base layer 14, the n cathode layer 13 and the p+ sucking-out layer 96, thereby making it possible to suppress the injection amount of electrons. Accordingly, by adopting the same dimension in combination with the second embodiment, the same effect can be obtained.

Third Embodiment

A structure for adjusting carrier injection on the cathode side is not limited to the structure described above.

Figure 22A:
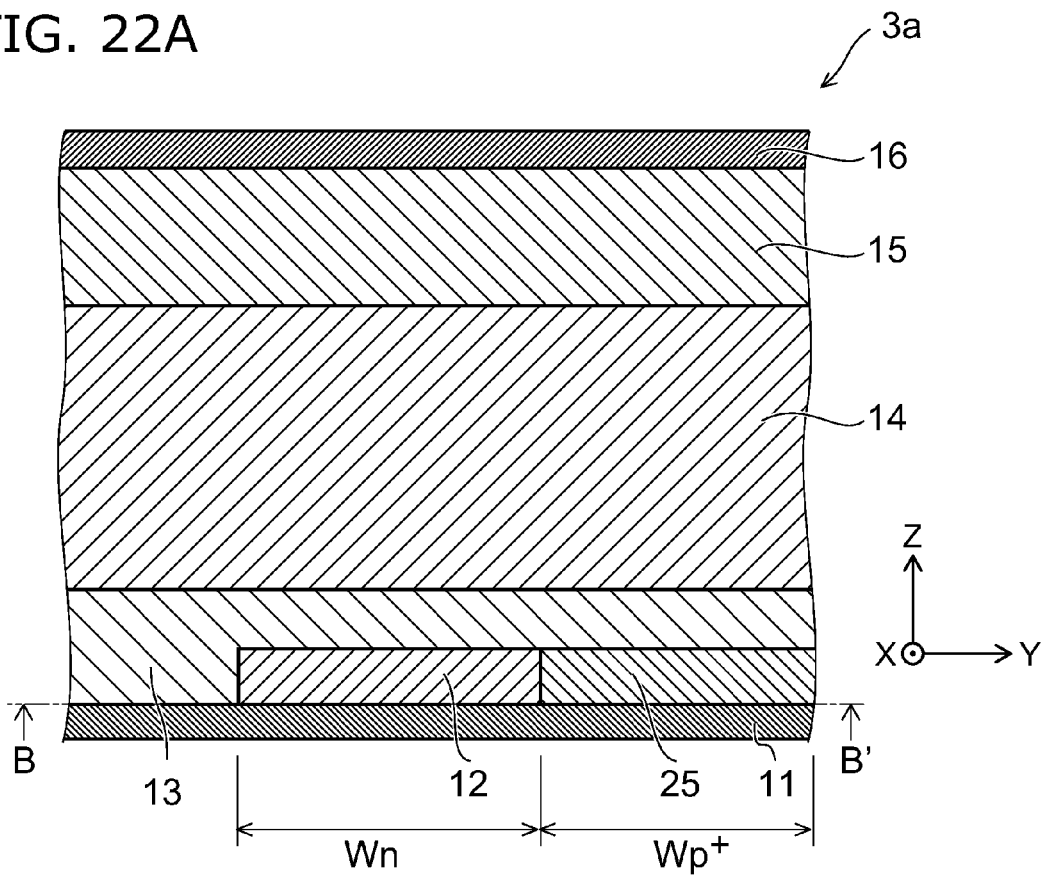
FIGS. 22A and 22B are schematic views illustrating a semiconductor device according to a third embodiment.
Figure 22B:
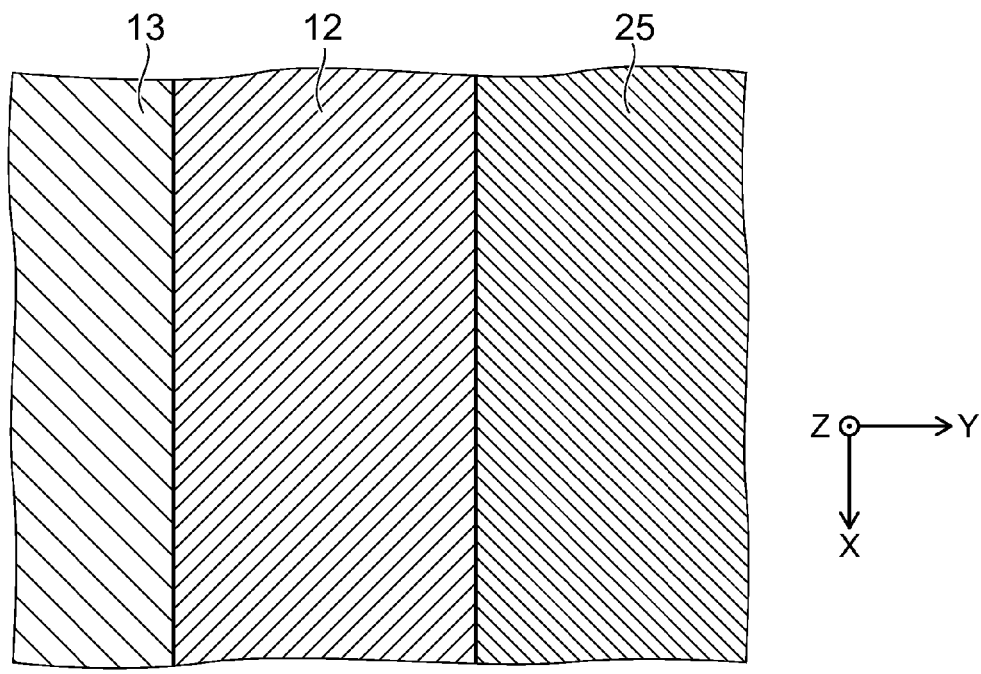

FIGS. 22A and 22B are schematic views illustrating the semiconductor device according to a third embodiment. FIG. 22A is a schematic cross-sectional view, and FIG. 22B is a schematic plan view at the position of the BB' line in FIG. 22A.

The semiconductor device 3a according to the third embodiment furthermore includes a p+ cathode layer 25 (a seventh semiconductor layer) in addition to the configuration of the semiconductor device 1 (FIG. 1). The p+ cathode layer 25 is provided on the cathode electrode 11. The p+ cathode layer 25 is in ohmic contact with the cathode electrode 11. The p+ cathode layer 25 is in contact with the n+ cathode layer 12.

The n cathode layer 13 is provided on the cathode electrode 11, on the p+ cathode layer 25, and on the n+ cathode layer 12. The n cathode layer 13 is in contact with the cathode electrode 11, the p+ cathode layer 25 and the n+ cathode layer 12. The effective impurity concentration in the p+ cathode layer 25 is higher than the effective impurity concentration in the p+ anode layer 15.

The thickness of the p+ cathode layer 25 is, for example, not more than 5 micrometers (μm). The p+ cathode layer 25 includes a semiconductor, such as silicon. In the p+ cathode layer 25, an impurity serving as an acceptor, for example, boron is included. The conductivity type of the p+ cathode layer 25 is the p type. The surface concentration of boron in the part of the p+ cathode layer 25 in contact with the cathode electrode 11 is, for example, not less than $3 \times 10^{17}$ cm$^{-3}$. The width of the n⁺ cathode layer 12 is defined by Wn, and the width of the p⁺ cathode layer 25 is defined by Wp⁺ in the semiconductor device 3a.

Next, actions of the semiconductor device 3a according to the third embodiment will be described.

Figure 23A:
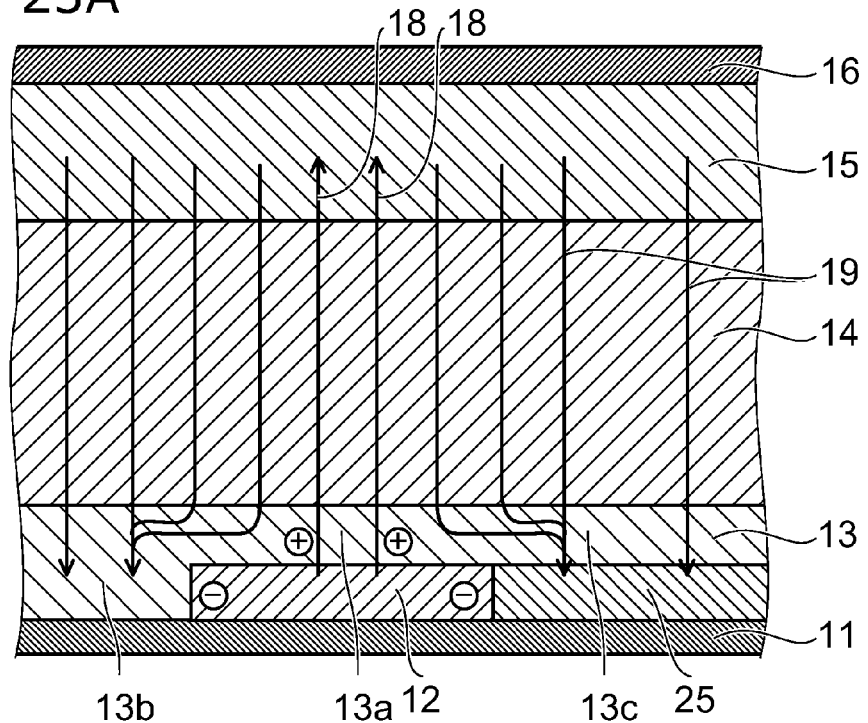
FIGS. 23A and 23B are schematic cross-sectional views illustrating the action in the semiconductor device according to the third embodiment.
Figure 23B:
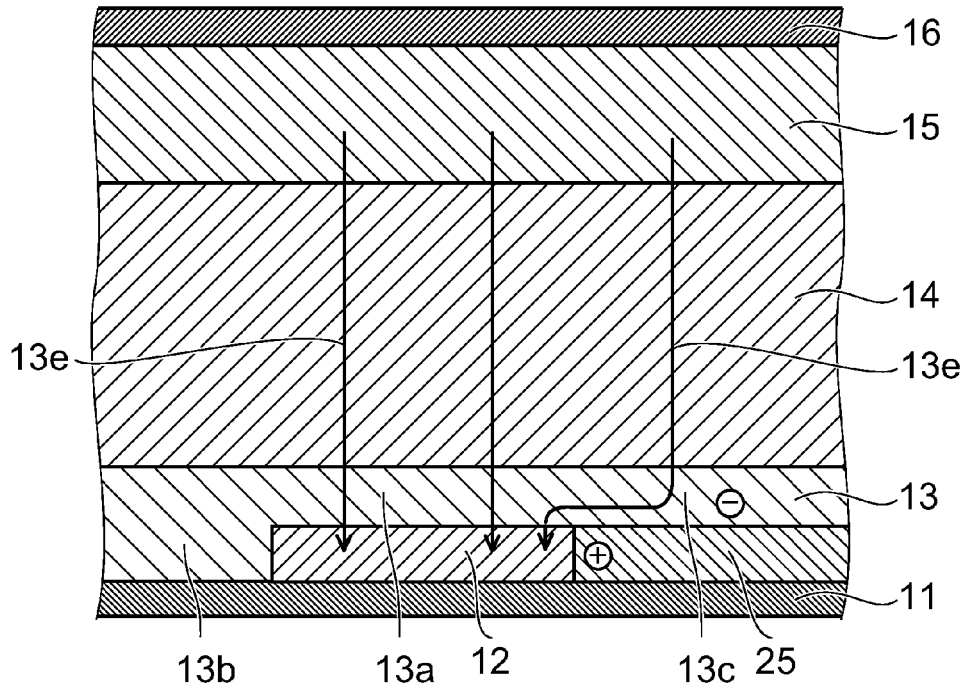

FIGS. 23A and 23B are schematic cross-sectional views illustrating the action in the semiconductor device according to the third embodiment.

In FIG. 23A, the action is illustrated when the forward bias is applied between the anode electrode and the cathode electrode. And, in FIG. 23B, the action immediately after the reverse bias is applied between the anode electrode and the cathode electrode (at the time of recovery) is illustrated.

As shown in FIG. 23A, holes are injected into the n base layer 14 from the p⁺ anode layer 15 in the forward bias. After that, holes flow into the cathode electrode 11 through the n base layer 14 and the n cathode layer 13, to form a hole current 19. That is, the Schottky contact between the cathode electrode 11 and the n cathode layer 13 does not act as an energy barrier for holes (see FIG. 4A).

The p⁺ cathode layer 25 is provided in the semiconductor device 3a. The p⁺ cathode layer 25 does not serve as a barrier for holes injected from the p⁺ anode layer 15. That is, holes flow to the cathode electrode 11 through the n base layer 14, the n cathode layer 13 and the p⁺ cathode layer 25.

But, the junction part between the n cathode layer 13 and the n⁺ cathode layer 12 acts as an energy barrier (see FIG. 4B) for the hole. Accordingly, it is unlikely that the hole flows into the n⁺ cathode layer 12. Therefore, holes having flown to the n cathode layer 13 move on the n⁺ cathode layer 12 in a lateral direction, i.e., in another direction orthogonal to one direction in a plane parallel to the plate face of the cathode electrode.

Due to the movement of holes in another direction in the n cathode layer 13, a bias is formed so that the part 13a disposed on the n⁺ cathode layer 12 becomes positive with respect to the part 13b in contact with the cathode electrode 11, that is, the part 13a becomes positive with respect to the cathode electrode 11.

Due to the bias formed between the part 13a and the cathode electrode 11, the energy barrier between the n cathode layer 13 on the n⁺ cathode layer 12 and the n⁺ cathode layer 12 becomes low. Consequently, electrons are injected from the n⁺ cathode layer 12 into the n cathode layer 13. Electrons injected into the n cathode layer 13 form an electron current 18.

Since the n cathode layer 13 is provided in the semiconductor device 3a, the injection amount of electrons from the n⁺ cathode layer 12 is lowered in the application of the forward bias. Accordingly, carrier distribution 20 when the forward bias is applied is positioned on a lower concentration side than carrier distribution 120 in the semiconductor device according to the comparative example. As described above, the injection amount of carriers is suppressed in ON period.

In contrast, in the application of the reverse bias (in the recovery), holes existing in the n base layer 14 moves to the anode electrode 16 side, and electrons existing in the n base layer 14 move to the cathode electrode 11 side as shown in FIG. 23B.

Immediately after the recovery, the pn junction of the n cathode layer 13 and the p⁺ cathode layer 25 acts as an energy barrier for electrons. Accordingly, it is unlikely that an electron 13e flows into the p⁺ cathode layer 25.

However, the junction part between the n cathode layer 13 and the n⁺ cathode layer 12 does not serve as an energy barrier for electrons. Accordingly, the electron 13e, which are flown to the n cathode layer 13, moves on the p⁺ cathode layer 25 in a lateral direction, i.e., in another direction orthogonal to one direction in a plane parallel to the plate face of the cathode electrode 11.

After that, the electron 13e flows to the cathode electrode 11 through the n⁺ cathode layer 12. Then, due to the movement of electrons in the n cathode layer 13 in another direction, a bias is formed so that the part 13c disposed on the p⁺ cathode layer 25 becomes negative with respect to the part 13a in contact with the n⁺ cathode layer 12. Because the n⁺ cathode layer 12 and the cathode electrode 11 are in ohmic contact, the part 13c is biased so as to be negative with respect to the cathode electrode 11 finally.

Consequently, due to the bias formed between the part 13c and the cathode electrode 11, the energy barrier between the part 13c on the p⁺ cathode layer 25 and the p⁺ cathode layer 25 becomes low. As the result, holes, i.e., carriers are reinjected from the p⁺ cathode layer 25 to the n cathode layer 13. As described above, the injection amount of carriers are also adjusted in the OFF time in the semiconductor device 3a.

The Wp⁺ is necessarily not less than a prescribed length in order to reinject carriers into the n cathode layer 13 from the p⁺ cathode layer 25 by lowering the energy barrier between the part 13c and the p⁺ cathode layer 25. For example, not less than 10 μm is preferable as the Wp⁺, and, furthermore, not less than 30 μm is more preferable.

After that, the carrier distribution 20 (see FIG. 6) in the n base layer 14 goes back to the cathode electrode 11 side. Furthermore, a depletion layer extends to the n base layer 14, starting from an interface of the p⁺ anode layer 15 and the n base layer 14. As the result, an electrical connection between the anode electrode 16 and the cathode electrode 11 in the semiconductor device 3a is cut off.

According to the structure, it is possible to make carriers stay more surely on the cathode electrode 11 side of the n base layer 14 in the transition period by the reinjection of carriers in the recovery time. Consequently, for example, the current vibration in which the direction of current changes twitchily is hardly generated at the end of recovery period 43. As the result, the generation of noise is suppressed furthermore.

Also, the difference between the third embodiment and the third variation of the second embodiment is described below. The n cathode layer 13, the n⁺ cathode layer 12 and the p⁺ cathode layer 25 are in contact with the cathode electrode 11 in the structure on the cathode side in the third embodiment. But, only the n⁺ cathode layer 12 and the p⁺ sucking-out layer 96 are in contact with the cathode electrode 11 in the structure of the third variation of the second embodiment. As described above, the effect is that, the width of the n⁺ cathode layer 12 and the width of the p⁺ cathode layer 25 can be designed independently of an element pitch by providing the n cathode layer 13. Thereby, there are effects of more speeding up and suppressing noise generation in low currents.

(First Variation of Third Embodiment)

Figure 24A:
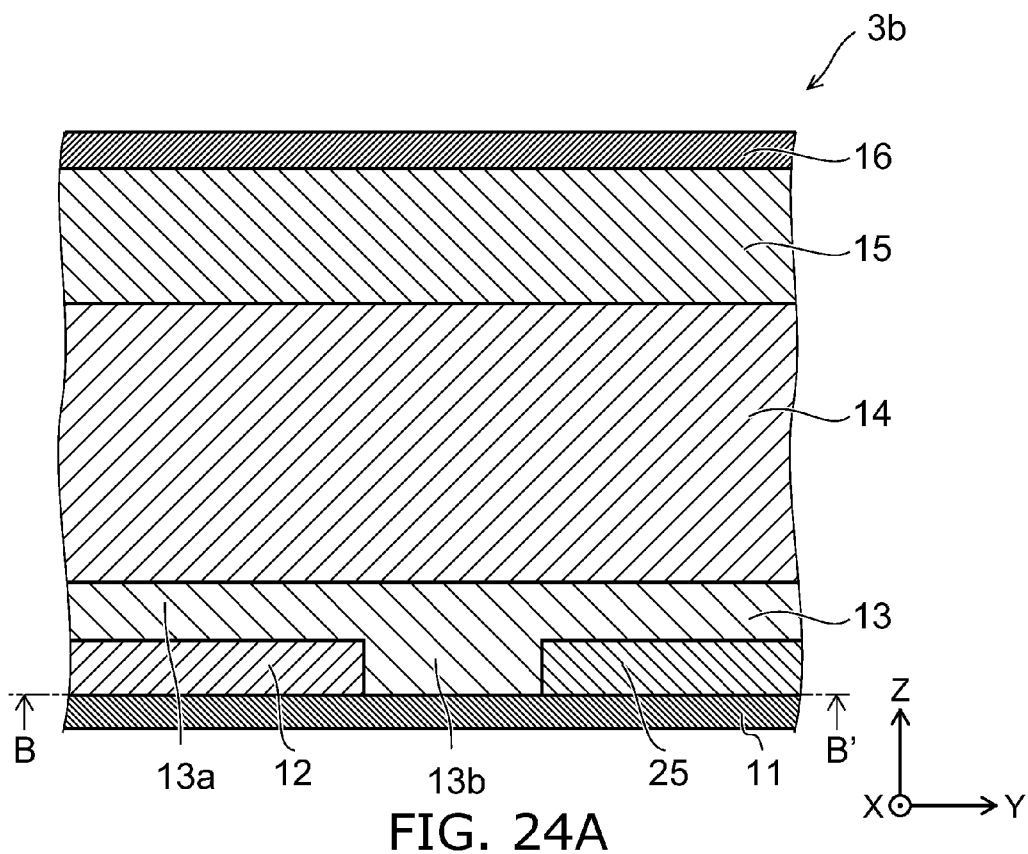
FIGS. 24A and 24B are schematic views illustrating the semiconductor device according to a first variation of the third embodiment.
Figure 24B:
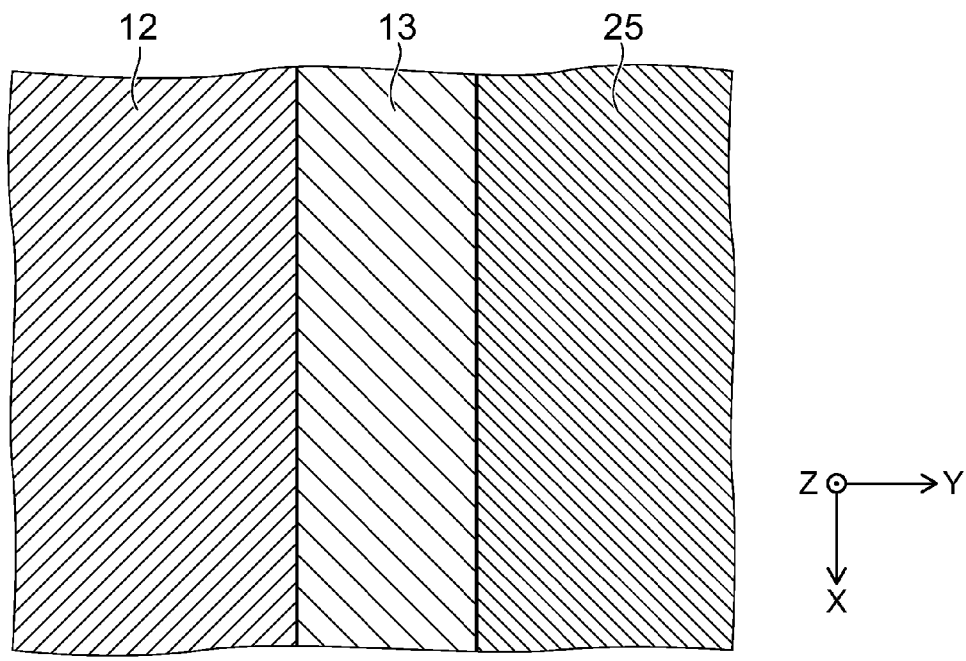

FIGS. 24A and 24B are schematic views illustrating the semiconductor device according to a first variation of the third embodiment, FIG. 24A is a schematic cross-sectional view, and FIG. 24B is a schematic plan view at the position of the BB' line in FIG. 24A.

The semiconductor device 3b according to the first variation of the third embodiment further includes, the p⁺ cathode layer 25 in addition to the configuration of the semiconductor device 1 (FIG. 1). The p⁺ cathode layer 25 is provided on the cathode electrode 11. The p⁺ cathode layer 25 is in ohmic contact with the cathode electrode 11. In the first variation, the n⁺ cathode layer 12 and the p⁺ cathode layer 25 are not in contact with each other. That is, the n⁺ cathode layer 12 and the p⁺ cathode layer 25 are provided, each being separated. In other words, the part 13b of the n cathode layer 13 is sandwiched between the n⁺ cathode layer 12 and the p⁺ cathode layer 25.

The n cathode layer 13 is provided on the cathode electrode 11, on the p⁺ cathode layer 25, and on the n⁺ cathode layer 12. The effective impurity concentration of the p⁺ cathode layer 25 is higher than the effective impurity concentration of the p⁺ anode layer 15.

The action of the semiconductor device 3b at the time of the recovery will be described.

Figure 25A:
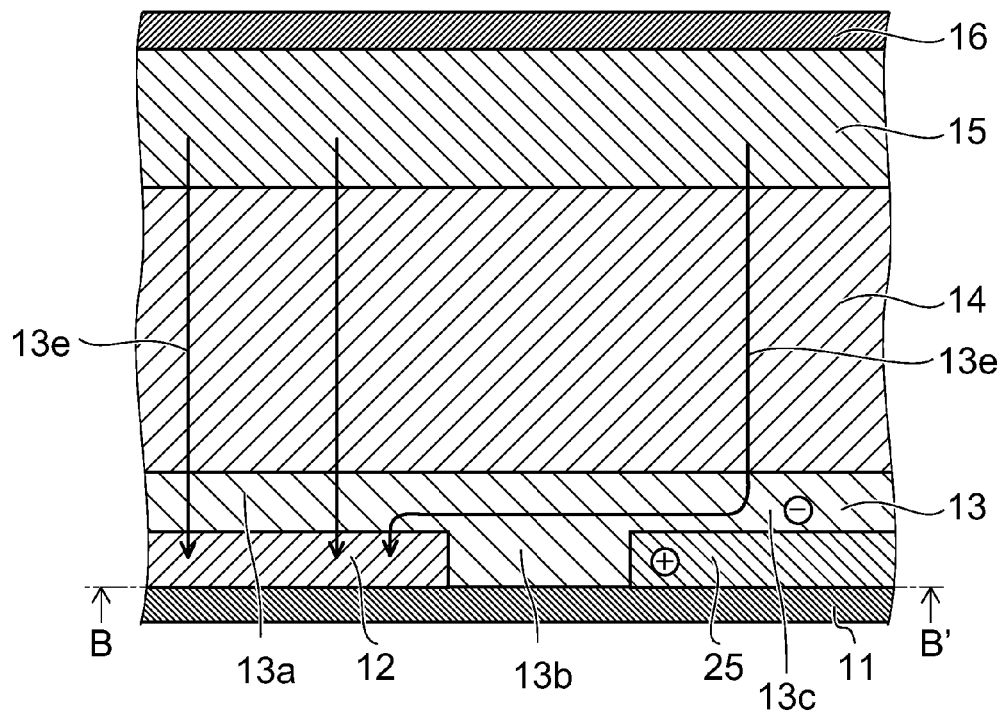
FIGS. 25A and 25B are schematic cross-sectional views illustrating the action in the semiconductor device according to a first variation of the third embodiment.
Figure 25B:
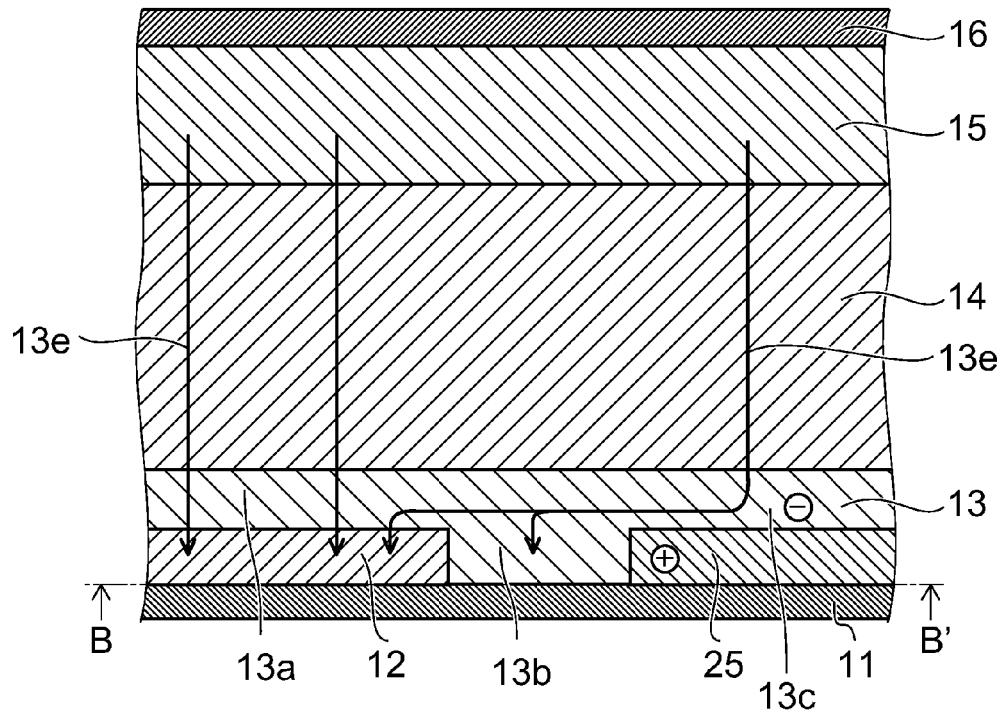

FIGS. 25A and 25B are schematic cross-sectional views illustrating the action in the semiconductor device according to the first variation of the third embodiment.

As shown in FIG. 25A, holes existing in the n base layer 14 move to the anode electrode 16 side, and electrons existing in the n base layer 14 move to the cathode electrode 11 side at the time of the application of the reverse bias (at the time of the recovery).

Immediately after the recovery, the pn junction of the n cathode layer 13 and the p⁺ cathode layer 25 serves as an energy barrier for electrons. Accordingly, it is unlikely that the electron 13e flows into the p⁺ cathode layer 25. Furthermore, the Schottky contact between the cathode electrode 11 and the n cathode layer 13 serves as an energy barrier for electrons flowing from the n cathode layer 13 toward the cathode electrode 11 (see FIG. 4A).

However, the junction part of the n cathode layer 13 and the n⁺ cathode layer 12 does not serve as an energy barrier for electrons. Accordingly, the electron 13e, which is flown to the n cathode layer 13, move on the p⁺ cathode layer 25 in the horizontal direction, i.e., in another direction orthogonal to one direction in the plane parallel to the plate face of the cathode electrode 11.

After that, the electron 13e flows to the cathode electrode 11 through the n⁺ cathode layer 12. Due to the movement of electrons in the n cathode layer 13 in another direction, a bias is formed so that the part 13c disposed on the p⁺ cathode layer 25 becomes negative with respect to the part 13a in contact with the n⁺ cathode layer 12. The n⁺ cathode layer 12 and the cathode electrode 11 are in ohmic contact. Thereby, the part 13c is biased so as to be negative with respect to the cathode electrode 11 finally.

Consequently, due to the bias formed between the part 13c and the cathode electrode 11, the energy barrier between the part 13c on the p⁺ cathode layer 25 and the p⁺ cathode layer 25 becomes low. As the result, holes, i.e., carriers are reinjected from the p⁺ cathode layer 25 to the n cathode layer 13. As described above, the injection amount of carriers are also adjusted in the OFF time in the first variation.

But, it is unlikely that the electron 13e flows to the cathode electrode 11 through the part 13b when the cathode electrode 11 and the n cathode layer 13 are in Schottky contact. Accordingly, the substantial width of the p⁺ cathode layer 25 may be the length obtained by adding the width Wp⁺ of the p⁺ cathode layer 25 and the width of the part 13b. In this case, an excess amount of holes, i.e., carriers may be reinjected from the cathode side.

In FIG. 25B, an action when the cathode electrode 11 and the n cathode layer 13 are not in Schottky contact but in ohmic contact is illustrated.

In this case, in immediately after recovery, for electrons, the pn junction of the n cathode layer 13 and the p⁺ cathode layer 25 acts as an energy barrier. Accordingly, it is unlikely that the electron 13e flows into the p⁺ cathode layer 25.

However, for electrons, the junction part of the cathode electrode 11 and the n cathode layer 13 does not serve as an energy barrier due to ohmic contact. Accordingly, the electron 13e, flowing from the n cathode layer 13 toward the cathode electrode 11, can flow to the cathode electrode 11 through the part 13b.

Accordingly, the electron 13e, which are flown to the n cathode layer 13, moves on the p⁺ cathode layer 25 in the horizontal direction, i.e., in another direction orthogonal to one direction in the plane parallel to the plate face of the cathode electrode 11. After that, the electron 13e flows to the cathode electrode 11 through the part 13b. And, a bias is formed so that the part 13c disposed on the p⁺ cathode layer 25 becomes negative with respect to the part 13a in contact with the n⁺ cathode layer 12 by the movement of electrons in another direction in the n cathode layer 13. The n⁺ cathode layer 12 and the cathode electrode 11 are in ohmic contact. Thereby, the part 13c is biased so as to become negative with respect to the cathode electrode 11 finally.

Consequently, the energy barrier between the part 13c on the p⁺ cathode layer 25 and the p⁺ cathode layer 25 becomes low by the bias formed between the part 13c and the cathode electrode 11. Consequently, holes, i.e., carriers are reinjected from the p⁺ cathode layer 25 into the n cathode layer 13. As described above, the injection amount of carriers are also adjusted in OFF time in the first variation.

In the example in FIG. 25B, the reinjection of an excessive amount of holes, i.e., reinjection of excessive carriers from the cathode side can be suppressed by making the cathode electrode 11 and the n cathode layer 13 be in ohmic contact.

As described above, according to the first variation of the third embodiment, by the reinjection of carriers, carriers can be caused to remain more reliably on the cathode electrode 11 side of the n base layer 14 in a transition period. Consequently, for example, the current vibration in which the direction of current changes twitchily is hardly generated at the end of the recovery period 43. As the result, the generation of noise is further suppressed.

(Second and Third Variations of Third Embodiment)

Figure 26A:
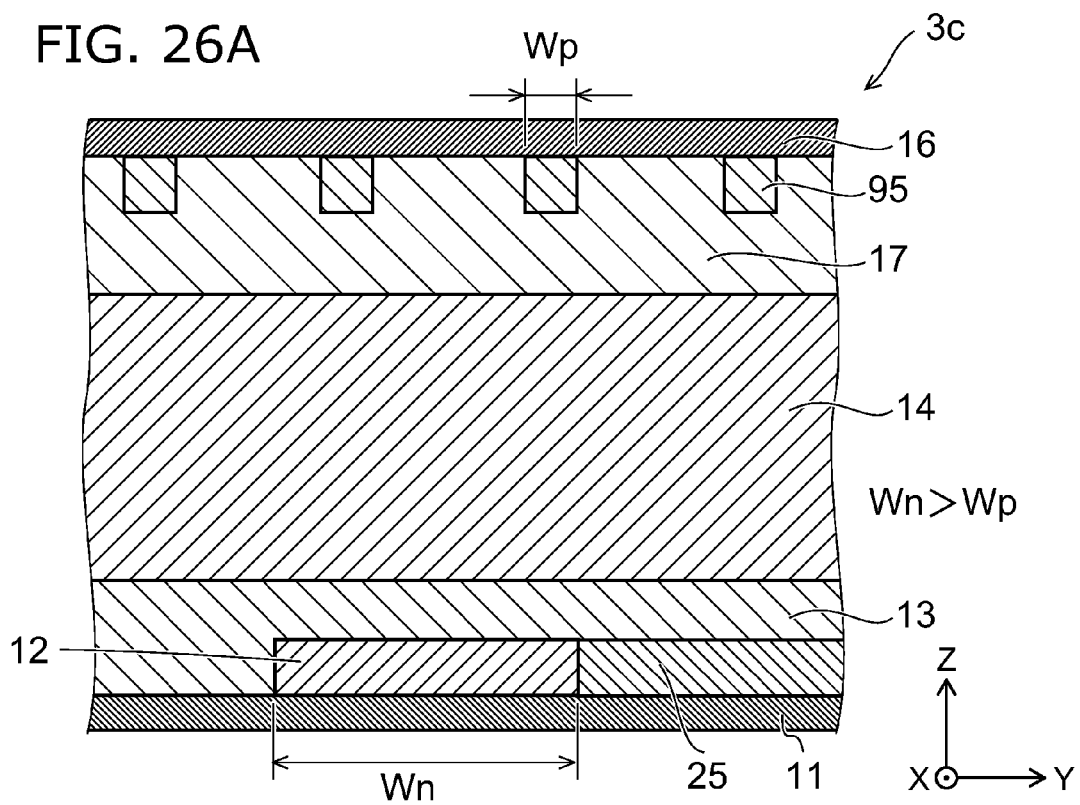
FIGS. 26A and 26B are schematic views illustrating semiconductor devices according to a second variation and a third variation of the third embodiment.
Figure 26B:
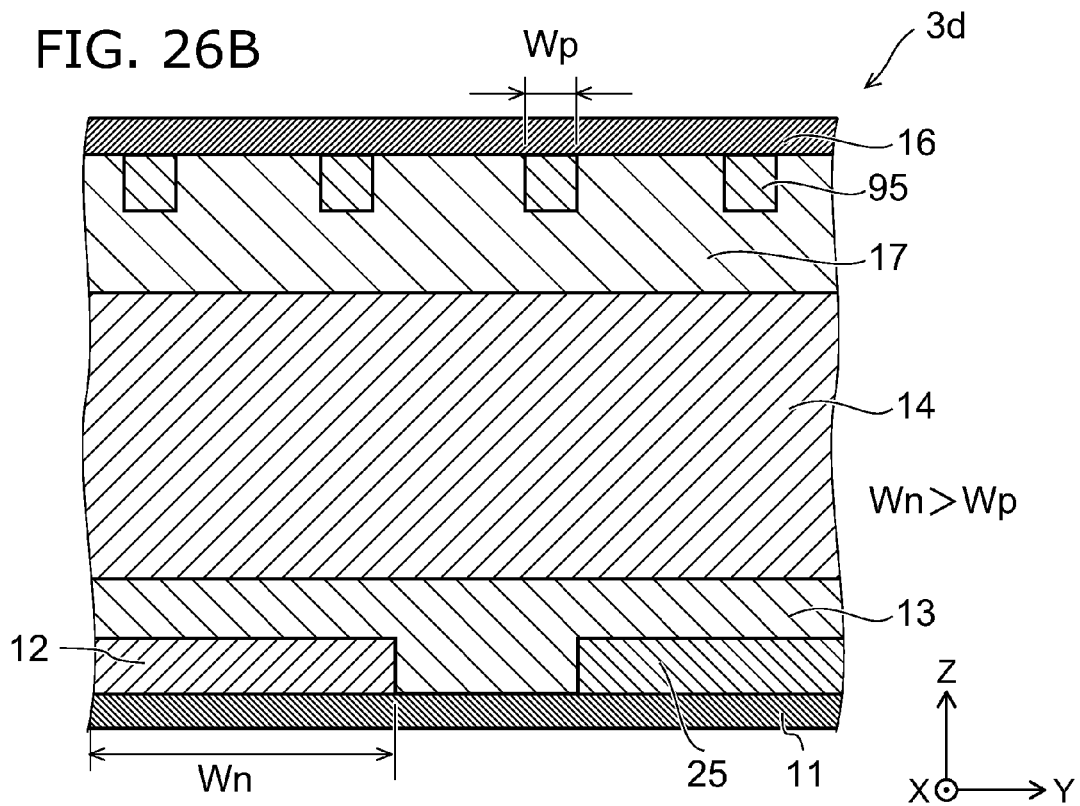

FIGS. 26A and 26B are schematic views illustrating semiconductor devices according to a second variation and a third variation of the third embodiment. FIG. 26A is a schematic cross-sectional view of the second variation, and FIG. 26B is a schematic cross-sectional view of the third variation.

The semiconductor device 3c according to the second variation of the third embodiment illustrated in FIG. 26A is a semiconductor device obtained by combining the semiconductor device 2 according to the second embodiment and the semiconductor device 3a according to the third embodiment.

According to the structure, in addition to the function and effect obtained in the semiconductor device 2, the function and effect obtained in the semiconductor device 3a are further exerted. That is, the injection amount of electrons on the cathode electrode 11 side can be made larger than the injection amount of holes on the anode electrode 16 side by making the width Wn>the width Wp. Consequently, the accumulated amount of carriers on the cathode electrode 11 in a steady state can be made larger than the accumulated amount of carriers on the anode electrode 16 side in a steady state. As the result, carriers are caused to remain on the cathode electrode 11 side of the n base layer 14 in a transition period.

Furthermore, it is possible to cause carriers to remain reliably on the cathode electrode 11 side of the n base layer 14 in the transition period at the time of the recovery by the reinjection of carriers. Consequently, the current vibration is hardly generated at the end of the recovery period 43. As the result, the generation of noise is further suppressed.

The semiconductor device 3d according to the third variation of the third embodiment illustrated in FIG. 26B is a semiconductor device obtained by combining the semiconductor device 2 according to the second embodiment and the semiconductor device 3b according to the first variation of the third embodiment.

According to the structure, in addition to the function and effect obtained in the semiconductor device 2, the function and effect obtained in the semiconductor device 3b are further exerted. That is, the injection amount of electrons on the cathode electrode 11 side can be made larger than the injection amount of holes on the anode electrode 16 side by setting the width Wn>the width Wp. Consequently, the accumulated amount of carriers on the cathode electrode 11 in a steady state can be made larger than the accumulated amount of carriers on the anode electrode 16 side in a steady state. As the result, carriers are caused to remain on the cathode electrode 11 side of the n base layer 14 in a transition period.

Furthermore, it is possible to cause carriers to remain reliably on the cathode electrode 11 side of the n base layer 14 in the transition period at the time of the recovery by the reinjection of carriers. Consequently, the current vibration is hardly generated at the end of the recovery period 43. As the result, the generation of noise is further suppressed.

Figure 27A:
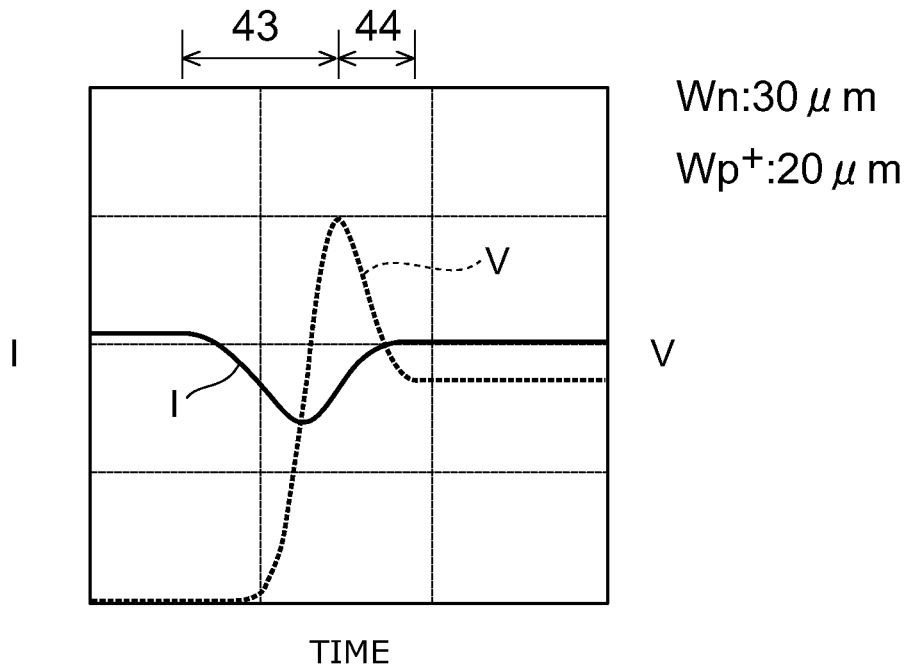
FIG. 27A and FIG. 27B are graphs illustrating a switching current and voltage of the semiconductor device according to the third embodiment.
Figure 27B:
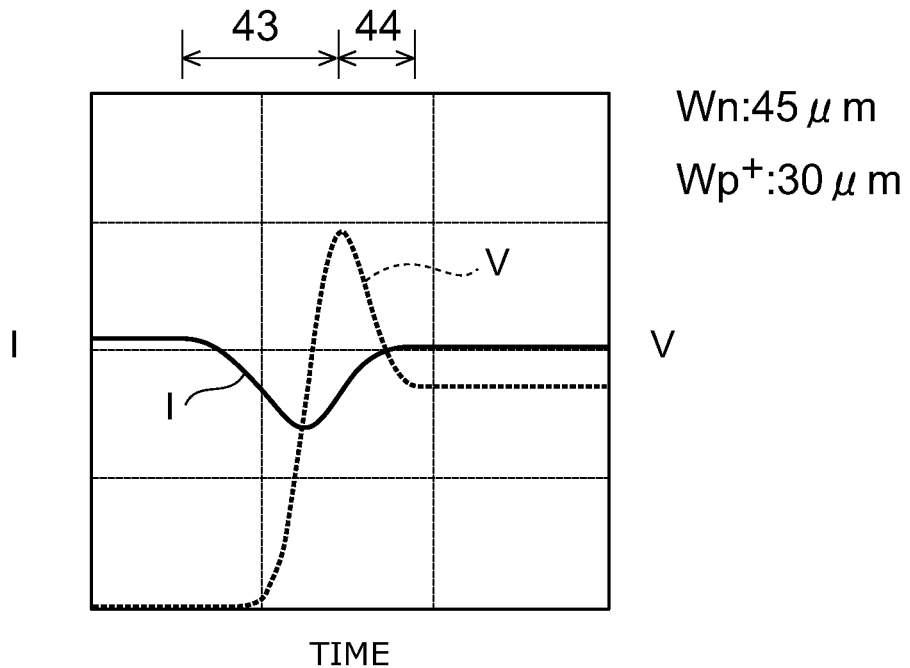

FIG. 27A and FIG. 27B are graphs illustrating a switching current and voltage of the semiconductor device according to the third embodiment.

In FIG. 27, as an example, the switching current and voltage of the semiconductor device 3c is illustrated.

In addition, in FIG. 27A, the switching current and voltage are illustrated when Wn is 30 μm and Wp$^+$ is 20 μm. In FIG. 27B, characteristics of the switching current and voltage are illustrated when Wn is 45 μm and Wp$^+$ is 30 μm. Wn>Wp holds.

As shown in FIG. 27, in the recovery period 43 and tail time 44, neither current vibration nor voltage vibration was generated. In addition, other semiconductor devices 3a, 3b and 3d also exhibited the same tendency.

Fourth Embodiment

The structure in which carriers are reinjected from the cathode side at the time of recovery to lower noise is not limited to the structures in FIG. 22, FIG. 24, FIG. 26A and FIG. 26B.

Figure 28A:
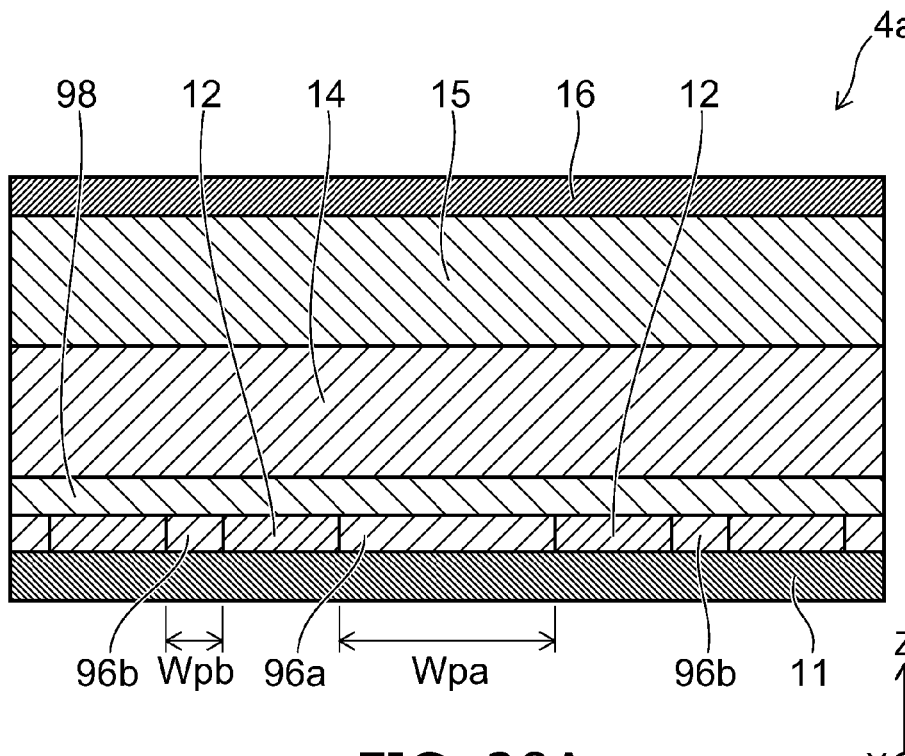
FIG. 28A is a schematic cross-sectional view illustrating a semiconductor device according to a first example of a fourth embodiment.
Figure 28B:
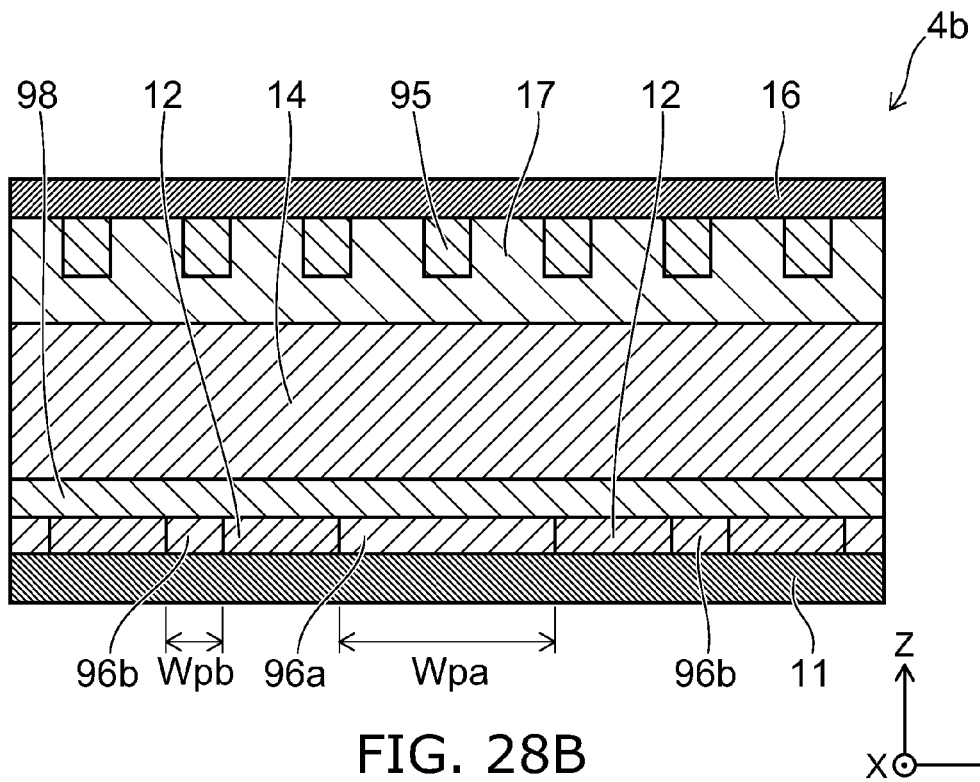
FIG. 28B is a schematic cross-sectional view illustrating a semiconductor device according to a second example of the fourth embodiment.

FIG. 28A is a schematic cross-sectional view illustrating the semiconductor device according to a first example of the fourth embodiment, and FIG. 28B is a schematic cross-sectional view illustrating the semiconductor device according to a second example of the fourth embodiment.

For example, in the semiconductor device 4a shown in FIG. 28A, a plurality of p$^+$ cathode layers 96 (p$^+$ cathode layers 96a and 96b) are provided between the cathode electrode 11 and the n cathode layer 98. The p$^+$ cathode layer 96 includes a semiconductor such as silicon. In the p$^+$ cathode layer 96, an impurity as an acceptor (for example, boron) is included. The surface concentration of boron in the part of the p$^+$ cathode layer 96 in contact with the cathode electrode 11 is, for example, not less than $3\times10^{17}$ cm$^{-3}$. The p$^+$ cathode layer 96 is in ohmic contact with the cathode electrode 11.

The p$^+$ cathode layer 96 includes, for example, two kinds of p$^+$ cathode layers having widths different from each other. For example, the p$^+$ cathode layer 96 has a group of p$^+$ cathode layers 96a having a width Wpa (a first width) in the direction (the Y direction in the drawing) intersecting with the direction (the X direction in the drawing) in which the p$^+$ cathode layer 96 extends, and another group of p$^+$ cathode layers 96b having a width Wpb (a second width) in the Y direction. The width Wpa is wider than the width Wpb.

Here, the width Wpa is adjusted to the extent that carries (holes) are reinjected from the cathode side at the time of recovery, and the width Wpb is adjusted to the extent that carriers (holes) are not reinjected from the cathode side at the time of recovery. The width Wpa is, for example, not less than 10 μm, more preferably not less than 30 μm. The width Wpb is, for example, less than 10 μm.

According to the structure, carriers are reinjected by the p$^+$ cathode layer 96a at the time of recovery, and it is possible to cause carriers to remain surely on the cathode electrode 11 side of the n base layer 14 in a transition state. Consequently, the current vibration, in which the direction of current changes little by little, is hard to be generated at the end of recovery period 43, for example. As the result, the generation of noise is suppressed furthermore.

On the other hand, when the carrier reinjection at the time of recovery becomes excessive, there may be such a case that the recovery loss increases to deteriorate diode characteristics. In the fourth embodiment, the amount of reinjected carriers at the time of recovery is optimized by providing the p$^+$ cathode layer 96b from which no carrier is reinjected at the time of recovery.

The p$^+$ cathode layer 96a and the p$^+$ cathode layer 96b have the same impurity concentration with each other. Each of the p$^+$ cathode layer 96a and the p$^+$ cathode layers 96b is formed simultaneously by ion injection. Accordingly, like the semiconductor device 2c in FIG. 21, the number of manufacturing processes is the same as that in the case where the p$^+$ cathode layer 96 is formed singly. That is, even when the p$^+$ cathode layer 96b is formed in addition to the p$^+$ cathode layer 96a, the manufacturing cost does not rise.

Like the semiconductor device 4b shown in FIG. 28B, by setting the anode side to be the same structure as the semiconductor device 2 (FIG. 12), the carrier injection at the time of conduction is suppressed to enable a higher-speed operation.

Fifth Embodiment

The structure in which carriers are reinjected from the cathode side at the time of recovery to lower noise is not limited to the structures in FIGS. 28A and 28B.

Figure 29:
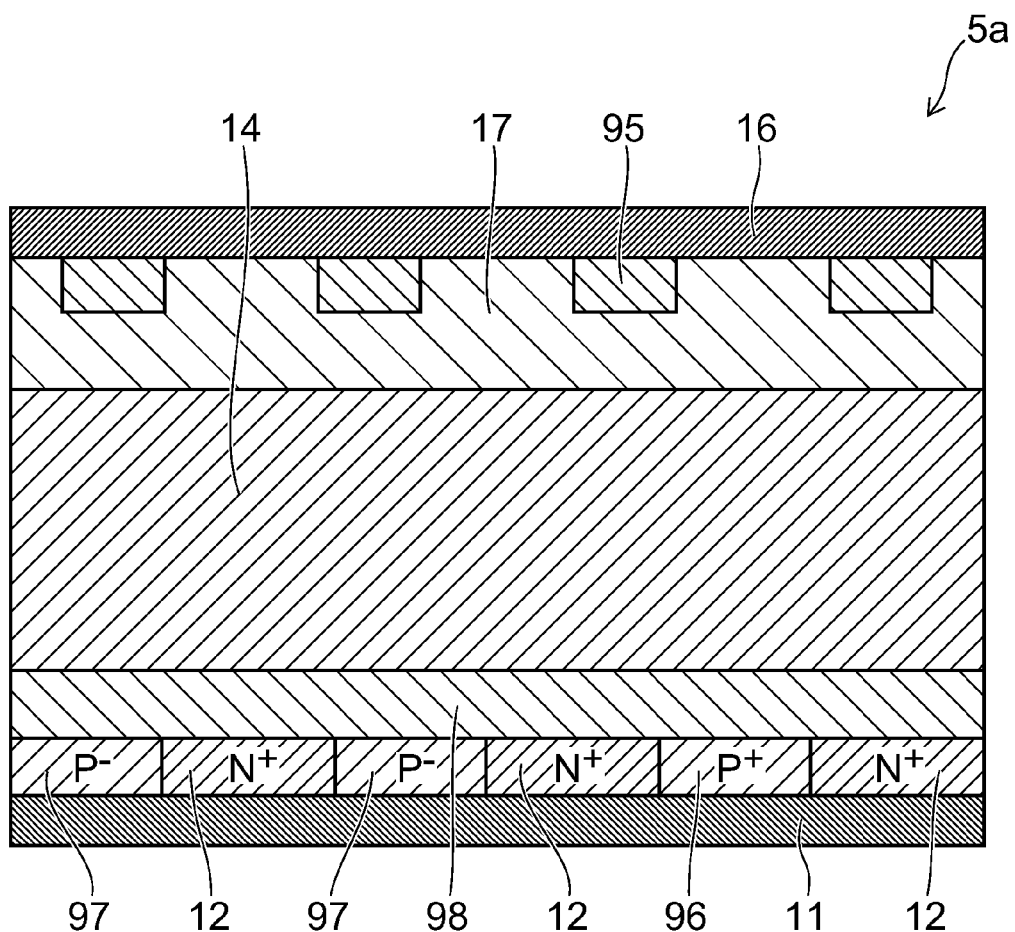
FIG. 29 is a schematic cross-sectional view illustrating a semiconductor device according to a first example of a fifth embodiment.

FIG. 29 is a schematic cross-sectional view illustrating the semiconductor device according to a first example of a fifth embodiment.

A semiconductor device 5a shown in FIG. 29 further includes, in addition to the p$^+$ cathode layer 96, a p$^-$ cathode layer 97 (a seventh semiconductor layer) in contact with the n$^+$ cathode layer 12 and, furthermore, in Schottky contact with the cathode electrode 11.

The p$^-$ cathode layer 97 includes a semiconductor such as silicon. In the p$^-$ cathode layer 97, an impurity as an acceptor (for example, boron) is included. The effective impurity concentration in the p$^-$ cathode layer 97 is lower than the effective impurity concentration in the p$^+$ cathode layer 96. The surface concentration of boron in the p$^-$ cathode layer 97 is, for example, not more than $3\times10^{17}$ cm$^{-3}$.

Here, the impurity concentration in the p$^+$ cathode layer 96 is adjusted to the extent that carriers (holes) are reinjected from the cathode side at the time of recovery, and the impurity concentration in the p$^-$ cathode layer 97 is adjusted to the extent that carries (holes) are not reinjected from the cathode side at the time of recovery.

According to the structure, carriers are reinjected by the p$^+$ cathode layer 96 at the time of recovery, and it is possible to cause carriers to remain surely on the cathode electrode 11 side of the n base layer 14 in a transition state. Consequently, for example, the current vibration or the voltage vibration is hard to be generated at the end of recovery period 43. As the result, the generation of noise is suppressed furthermore.

On the other hand, when the carrier reinjection at the time of recovery becomes excessive, there may be such a case that the recovery loss increases to deteriorate diode characteristics. In the fifth embodiment, the amount of reinjected carriers at the time of recovery is optimized by providing the p⁻ cathode layer 97 from which no carrier is reinjected at the time of recovery.

Figure 30A:
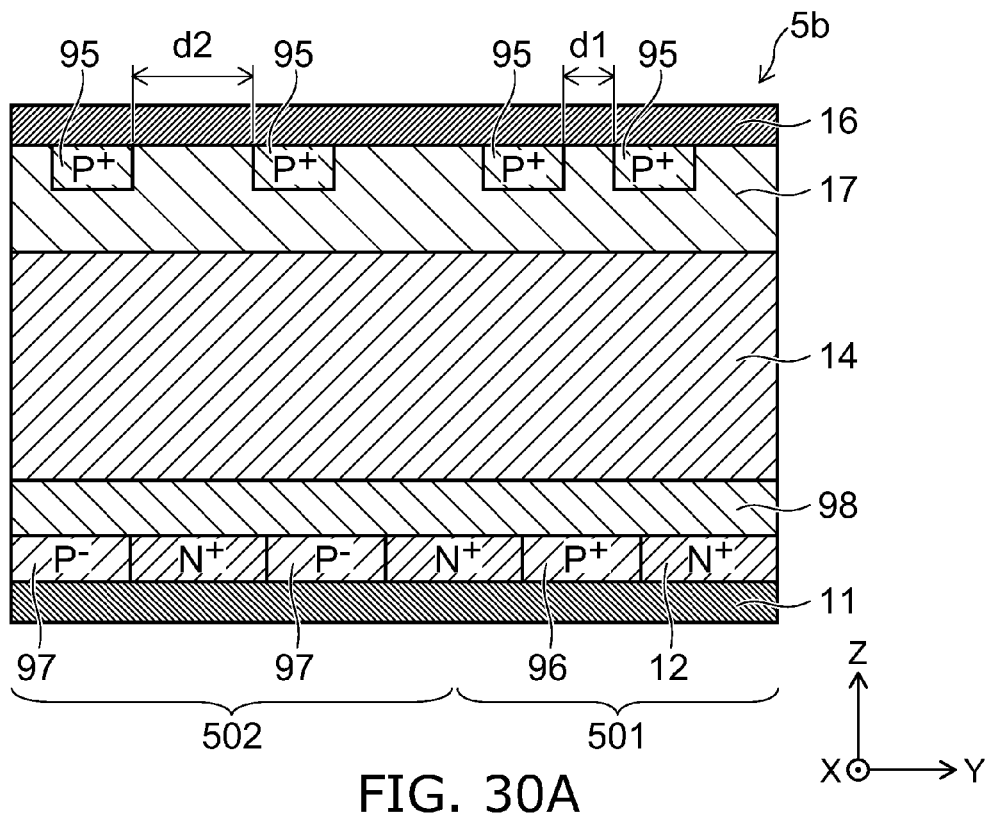
FIG. 30A is a schematic cross-sectional view illustrating a semiconductor device according to a second example of the fifth embodiment.
Figure 30B:
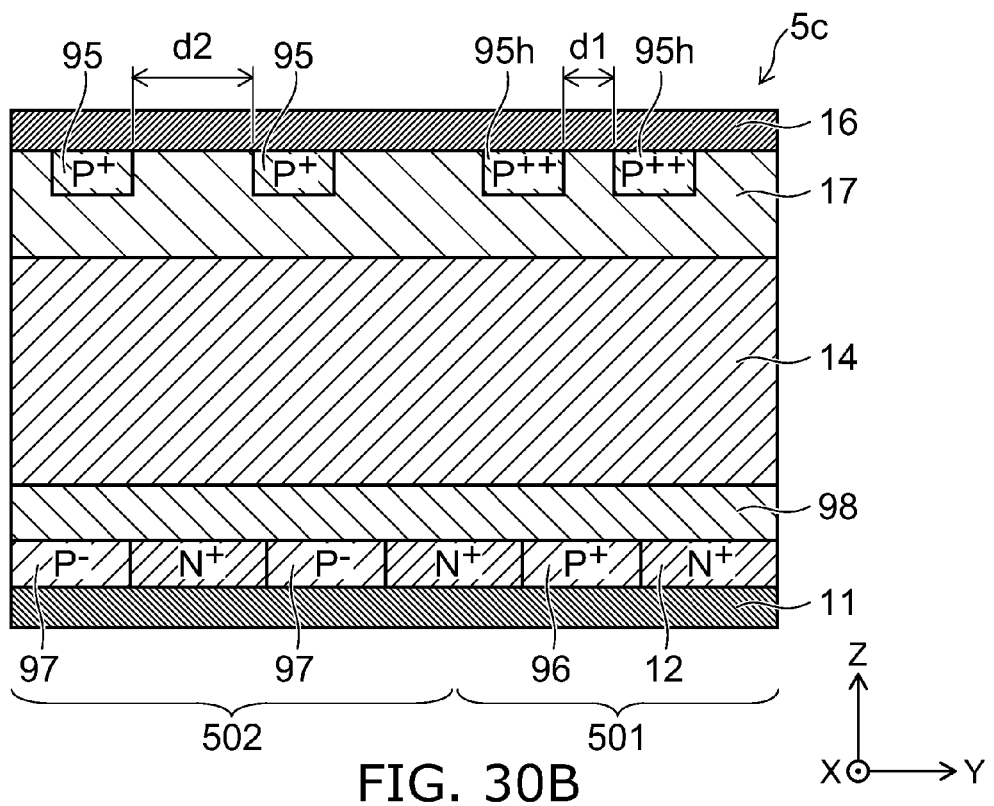
FIG. 30B is a schematic cross-sectional view illustrating a semiconductor device according to a third example of the fifth embodiment.

FIG. 30A is a schematic cross-sectional view illustrating the semiconductor device according to a second example of the fifth embodiment, and FIG. 30B is a schematic cross-sectional view illustrating the semiconductor device according to a third example of the fifth embodiment.

A semiconductor device 5b shown in FIG. 30A includes a first disposition region 501 in which the p⁺ cathode layer 96 is disposed, and a second disposition region 502 in which the p⁺ cathode layer 97 is disposed. In the semiconductor device 5b, a distance d1 between the adjacent p⁺ anode layers 95 in the first disposition region 501 is shorter than a distance d2 between the adjacent p⁺ anode layers 95 in the second disposition region 502.

According to the structure, holes injected from the p⁺ cathode layer 96 at the time of recovery are released to the anode electrode 16 effectively through the p⁺ anode layer 95. This is because, since the distance d1<the distance d2, the occupation ratio of the p⁺ anode layer 95 in the upper part of the p⁺ cathode layer 96 is higher than the occupation ratio of the p⁺ anode layer 95 in the upper part of the p⁻ cathode layer 97. Consequently, recovery capability of the semiconductor device 5b is further improved.

Furthermore, in the semiconductor device 5c shown in FIG. 30B, the effective impurity concentration in the p⁺ anode layer 95h in the first disposition region 501 is higher than the effective impurity concentration in the p⁺ anode layer 95 in the second disposition region 502. That is, in the semiconductor device 5c, the effective impurity concentration in the p⁺ anode layer 95h in the first disposition region 501 is set to be further higher than that in the semiconductor device 5b, to lower hole resistance of the p⁺ anode layer 95h.

Consequently, holes injected from the p⁺ cathode layer 96 are released to the anode electrode 16 further effectively through the p⁺ anode layer 95h. As the result, the recovery capability of the semiconductor device 5c is further improved.

Figure 31:
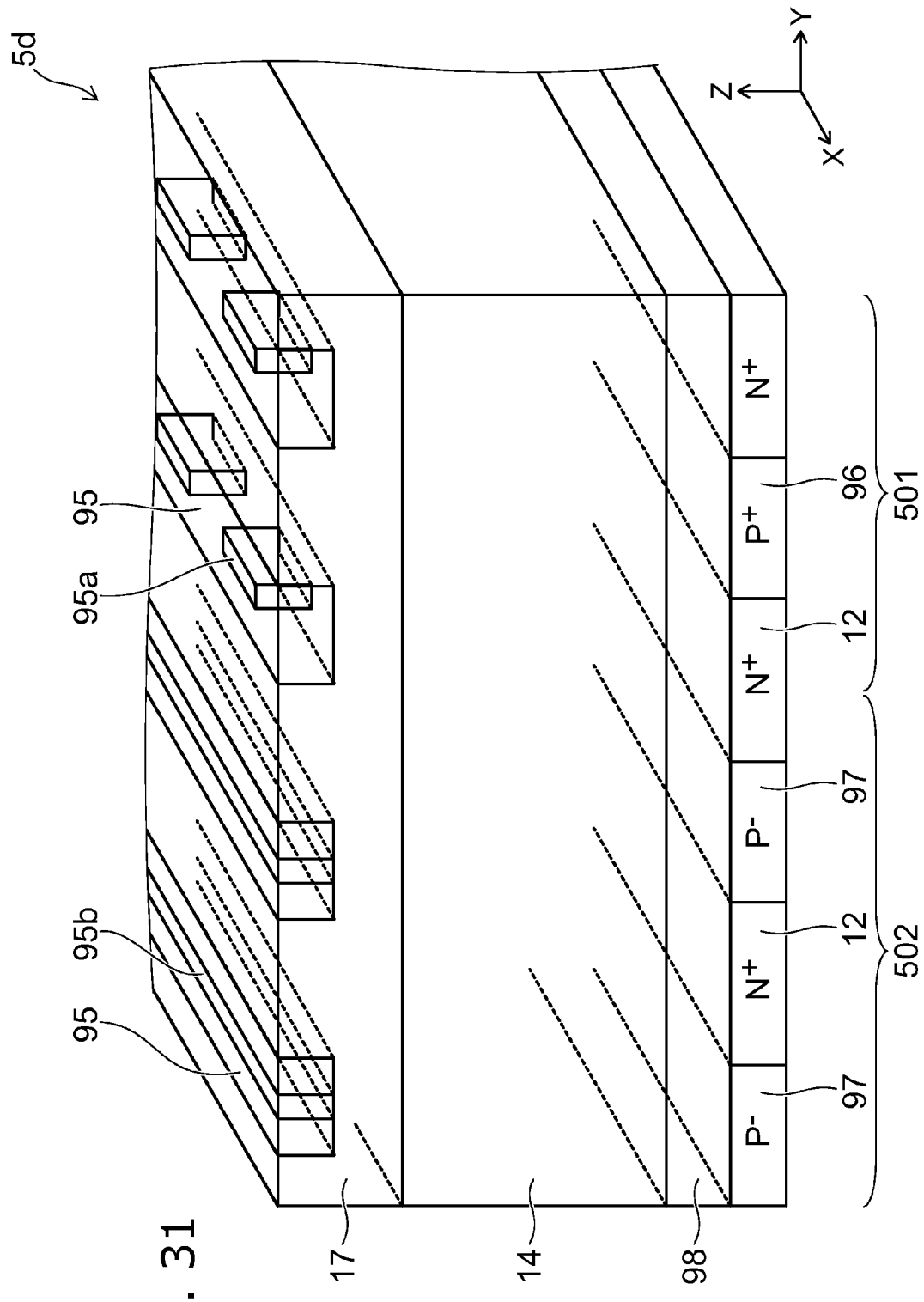
FIG. 31 is a schematic perspective view illustrating a semiconductor device according to a fourth example of the fifth embodiment.

FIG. 31 is a schematic perspective view illustrating the semiconductor device according to a fourth example of the fifth embodiment.

A semiconductor device 5d shown in FIG. 31 further includes a p⁺ anode layer 95a (an eighth semiconductor layer) in the first disposition region 501. The p⁺ anode layer 95a is in contact with the anode electrode 16, and at least a part other than the part in contact with the anode electrode 16 is surrounded by the p⁺ anode layer 95. For example, the side part of the p⁺ anode layer 95a is surrounded by the p⁺ anode layer 95. The effective impurity concentration in the p⁺ anode layer 95a is higher than the effective impurity concentration in the p⁺ anode layer 95.

The semiconductor device 5d further includes a p⁺ anode layer 95b in the first disposition region 501. The p⁺ anode layer 95b is in contact with the anode electrode 16, and at least a part other than the part in contact with the anode electrode 16 is surrounded by the p⁺ anode layer 95. The effective impurity concentration in the p⁺ anode layer 95b is higher than the effective impurity concentration in the p⁺ anode layer 95.

According to the structure, widths of the p⁺ anode layers 95a and 95b in the Y direction become narrower, so that further the hole injection is suppressed in ON period. Consequently, the switching action of the semiconductor device becomes faster. In addition, at the time of recovery, holes injected from the p⁺ cathode layer 96 are released to the anode electrode 16 effectively through the p⁺ anode layers 95a and 95b. Consequently, the recovery capability of the semiconductor device 5d is improved furthermore.

Furthermore, in the first disposition region 501, the p⁺ anode layers 95a as a plurality of p⁺ layers are dispersed in the X direction. Consequently, ballast resistance on the lower side of the p⁺ anode layer 95 in the first disposition region 501 rises to suppress local convergence of the hole current at the recovery period. As the result, the recovery capability of the semiconductor device 5d is further improved.

Sixth Embodiment

Figure 32A:
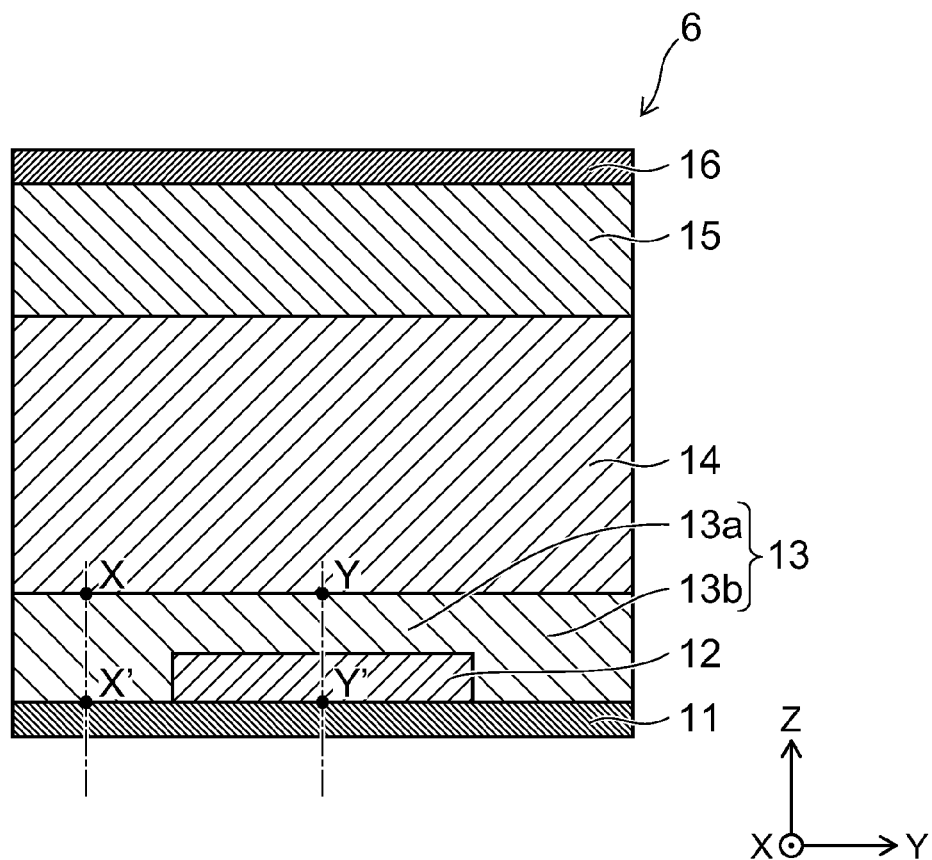
FIG. 32A is a schematic cross-sectional view illustrating a semiconductor device according to a sixth embodiment.
Figure 32B:
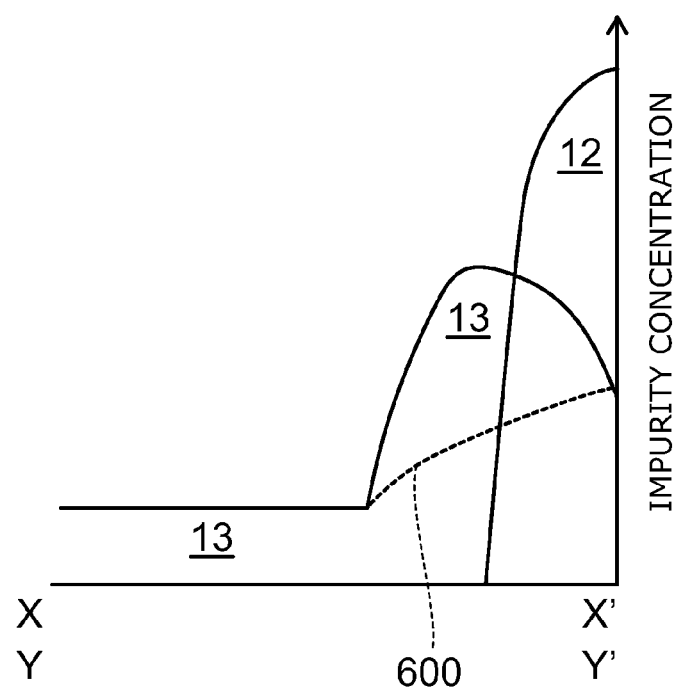
FIG. 32B is a graph showing an impurity concentration profile of the semiconductor device of the sixth embodiment.

FIG. 32A is a schematic cross-sectional view illustrating the semiconductor device according to a sixth embodiment, and FIG. 32B is a graph showing an impurity concentration profile of the semiconductor device of the sixth embodiment.

In FIG. 32B, impurity concentration profiles in the positions of the X-X' cross-section and the Y-Y' cross-section in FIG. 32A are shown.

In the embodiment, the n cathode layer 13 is provided on the cathode side in order to suppress the electron injection from the cathode side in ON period, in addition to the n⁺ cathode layer 12.

However, when the impurity concentration in the n cathode layer 13 lowers gradually from the cathode side toward the anode side as in an impurity concentration profile 600 according to a reference example, the depletion layer generated at turn-off extends too much and the depletion layer reaches to the cathode electrode 11. In this case, so-called punch through is generated and the breakdown voltage of the semiconductor device deteriorates.

In contrast, in the semiconductor device 6, the impurity concentration in the n cathode layer 13 rises once from the cathode side toward the anode side, and, after that, lowers gradually. For example, the peak in the impurity concentration profile of the n cathode layer 13 in the direction from the cathode electrode 11 toward the anode electrode 16 (the Z direction) is positioned between the n⁺ cathode layer 12 and the n base layer 14.

According to the structure, while the Schottky contact at the surface is maintained, the extension of the depletion layer generated at turn-off is suppressed and, consequently, the depletion layer does not reach the cathode electrode 11. As the result, the deterioration of the breakdown voltage of the semiconductor device can be prevented.

Seventh Embodiment

The directions in which the n⁺ cathode layer 12 and the p⁺ anode layer 95 extend, respectively, may intersect with each other.

Figure 33A:
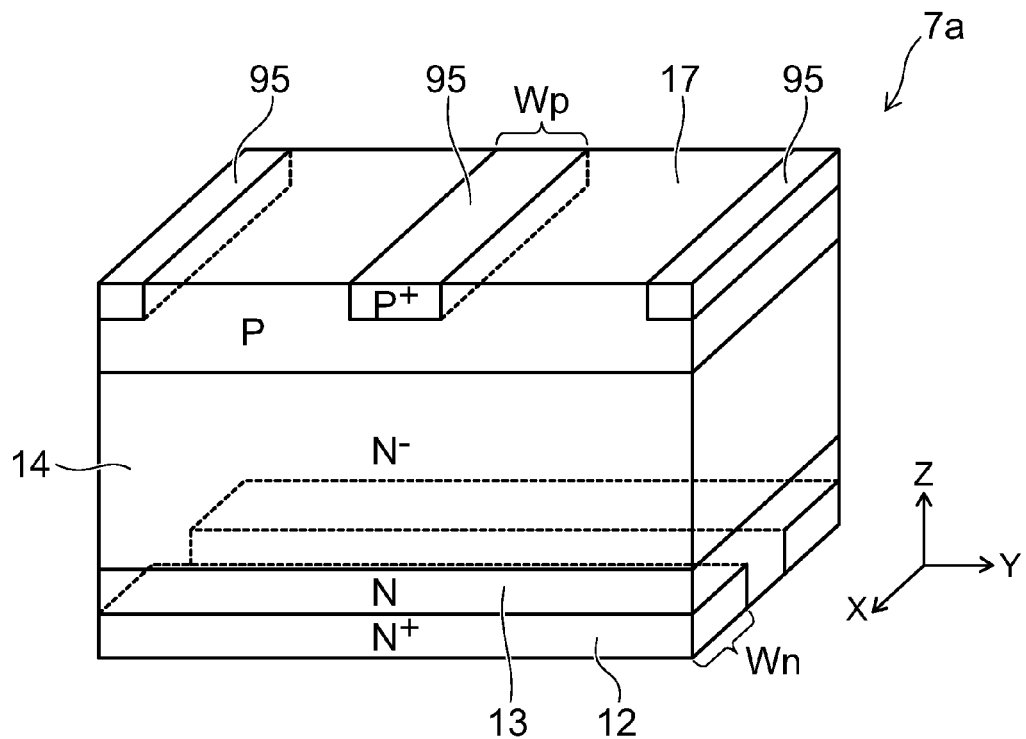
FIG. 33A is a schematic perspective view illustrating a semiconductor device according to a first example of a seventh embodiment.
Figure 33B:
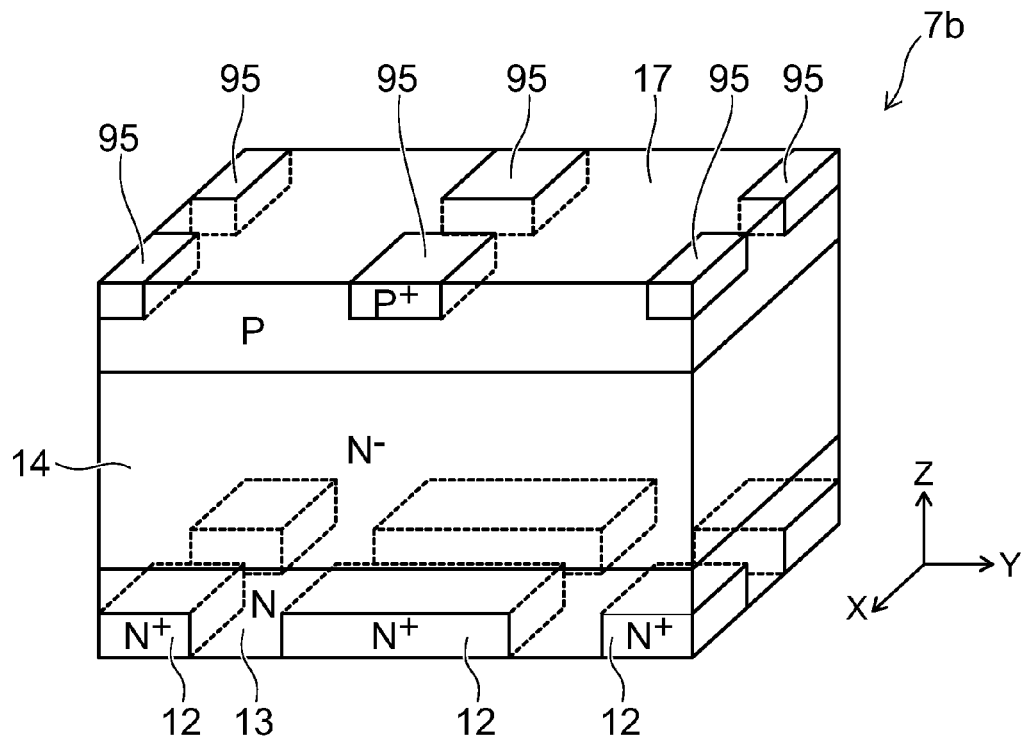
FIG. 33B is a schematic perspective view illustrating a semiconductor device according to a second example of the seventh embodiment.

FIG. 33A is a schematic perspective view illustrating the semiconductor device according to a first example of a seventh embodiment, and FIG. 33B is a schematic perspective view illustrating the semiconductor device according to a second example of the seventh embodiment.

For example, in the semiconductor device 7a shown in FIG. 33A, the direction in which the n⁺ cathode layer 12 extends and the direction in which the p⁺ anode layer 95 extends intersects with each other. For example, the n⁺ cathode layer 12 extends in the Y direction and the p⁺ anode layer 95 extends in the X direction that is orthogonal to the Y direction. The width Wn is larger than the width Wp.

Furthermore, each of the n⁺ cathode layer 12 and the p⁺ anode layer 95 may be divided in the direction in which each extends.

For example, in the semiconductor device 7b shown in FIG. 33B, the n⁺ cathode layer 12 extending in the Y direction is broken in several places. The p⁺ anode layer 95 extending in the X direction is broken in several places.

Even such a structure can suppress the electron injection amount and the hole injection amount in ON period, because of the existence of the n cathode layer 13 on the cathode side and the existence of the p anode layer 17 on the anode side. As the result, the switching action becomes faster.

Eighth Embodiment

A junction part of the p anode layer 17 and the n base layer 14 is not necessarily flat, but a part of the junction part may protrude to the cathode side. Here, the junction part of the p anode layer 17 and the n base layer 14 means a place in which the conductivity of the semiconductor changes from the p type to the n type when the p anode layer 17 and the n base layer 14 are cut in the direction from the p anode layer 17 to the n base layer 14.

Figure 34:
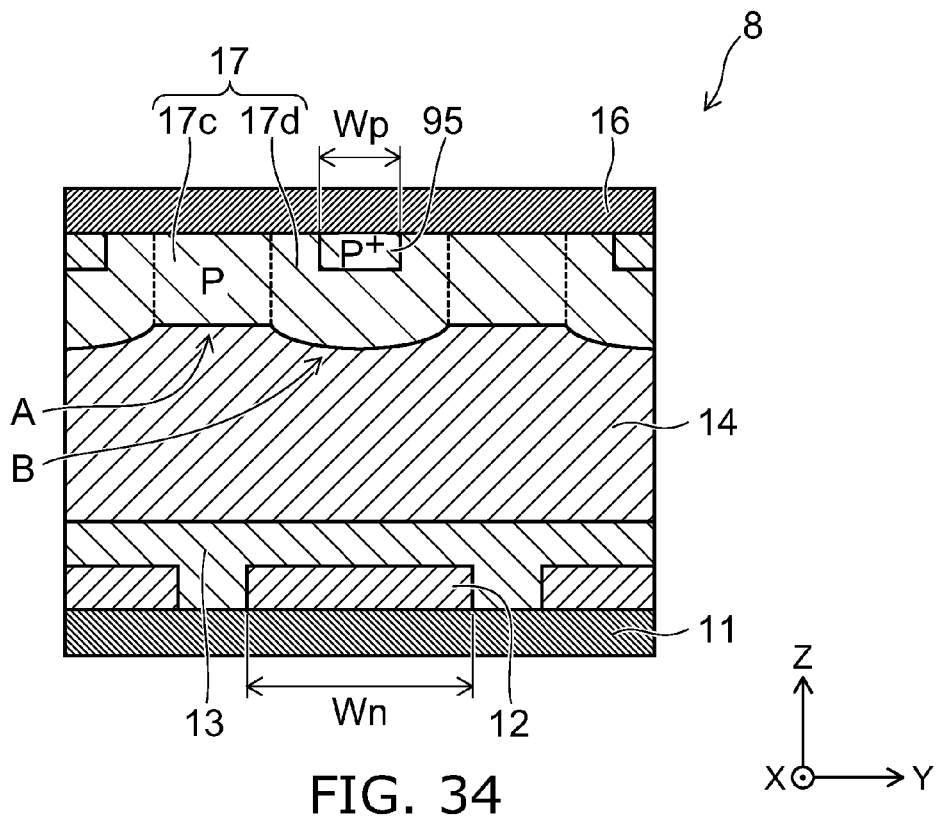
FIG. 34 is a schematic cross-sectional view illustrating a semiconductor device according to an eighth embodiment.

FIG. 34 is a schematic cross-sectional view illustrating the semiconductor device according to an eighth embodiment.

For example, in a semiconductor device 8 shown in FIG. 34, the p anode layer 17 has a p anode layer 17c and a p anode layer 17d. The positional relationship of the p⁺ anode layer 95 and the n⁺ cathode layer 12, and the width Wn and the width Wp are the same as those in the semiconductor device 2.

In the semiconductor device 8, although a junction part A of the p anode layer 17c and the n base layer 14 is flat, a junction part B protrudes to the cathode side. That is, at least a part of the junction part B bends.

According to the structure, if an avalanche current is generated at the time of recovery, the avalanche current concentrates easily on a region of the p anode layer 17d. This is because at least a part of the junction part B bends. Then, the avalanche current is released effectively to the anode electrode 16 via the p⁺ anode layer 95 provided in the p anode layer 17d. As the result, the recovery capability of the semiconductor device 8 is further improved.

Ninth Embodiment

Figure 35:
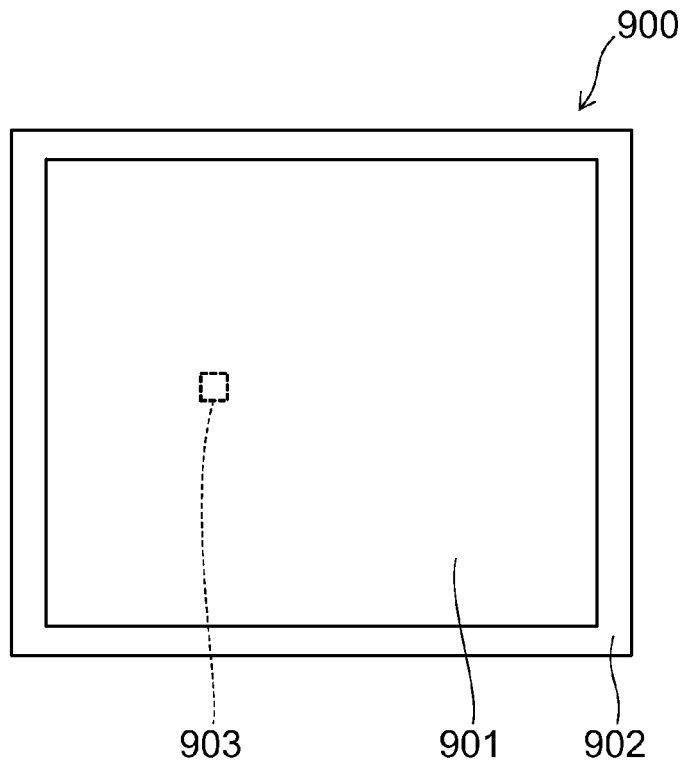
FIG. 35 is a schematic plan view of a semiconductor device according to a ninth embodiment.

FIG. 35 is a schematic plan view of the semiconductor device according to a ninth embodiment.

In FIG. 35, a schematic plane of a semiconductor chip 900 including any of the semiconductor devices 2, 2a, 2b, 2c, 3c, 3d, 4b, 5a, 5b, 5c, 5d, 7a, 7b and 8 is shown.

The semiconductor chip 900 includes an active region 901 and a peripheral region 902 surrounding the active region 901. Here, the active region 901 is a region in which the semiconductor device is able to function as an element (a diode).

The total contact area Sn1 (cm²) through which all the n⁺ cathode layers 12 in the active region 901 contact with the cathode electrode 11 is larger than the total contact area Sp1 (cm²) through which all the p⁺ anode layers 95 in the active region 901 contact with the anode electrode 16 (Sn1>Sp1).

The total contact area Sn2 (cm²) through which the n⁺ cathode layer 12 contacts with the cathode electrode 11 in a unit area of the active region 901 is larger than the total contact area Sp2 (cm²) through which the p⁺ anode layer 95 contacts with the anode electrode 16 in the unit area (Sn2>Sp2).

An occupation ratio Pn1 (%) of all the n⁺ cathode layers 12 in the active region 901 is larger than an occupation ratio Pp1 (%) of all the p⁺ anode layers 95 in the active region 901 (Pn1>Pp1). Here, the occupation ratio of a site B in a region A is defined as a value shown in percent, and the value is obtained by dividing an area, which all the sites B occupy in the region A, with the area of the region A.

An occupation ratio Pn2 (%) of the n⁺ cathode layer 12 in a unit area of the active region 901 is larger than an occupation ratio Pp2 (%) of the p⁺ anode layer 95 in the unit area (Pn2>Pp2).

Considering, an arbitrary region 903 is selected from in the active region 901. The arbitrary region 903 is a region selected randomly from in the active region 901, such as, a region of 100 μm square. In the region 903, the semiconductor device of the embodiment is disposed.

The total contact area Sn'1 (cm²) through which all the n⁺ cathode layers 12 in the region 903 contact with the cathode electrode 11 is larger than the total contact area Sp'1 (cm²) through which all the p⁺ anode layers 95 in the region 903 contact with the anode electrode 16 (Sn'1>Sp'1).

An occupation ratio Pn'1 (%) of all the n⁺ cathode layers 12 in the region 903 is larger than an occupation ratio Pp'1 (%) of all the p⁺ anode layers 95 in the region 903 (Pn'1>Pp'1).

Each of the Pp1, Pp2 and Pp'1 is not more than 20%, preferably not more than 10%. Each of the Pn1, Pn2 and Pn'1 is more than 20%.

Tenth Embodiment

Next, the semiconductor device according to a tenth embodiment will be described. The embodiment relates to a MOSFET (Metal-Oxide-Semiconductor Field-Effect Transistor) including a pin diode structure in the inside. To MOSFETs, too, the above-mentioned diode structure and dimensions of respective sites can be applied.

Figure 36:
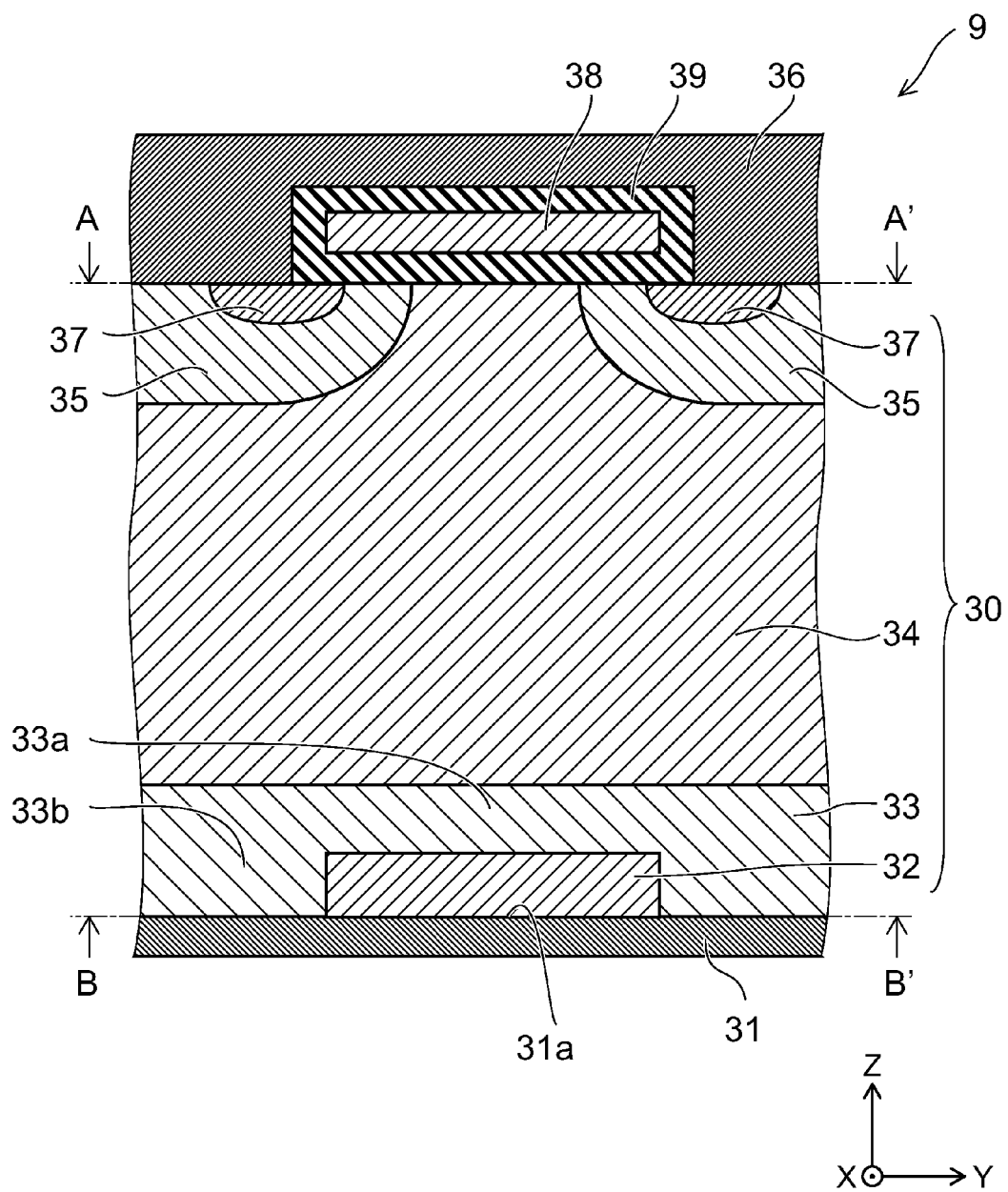
FIG. 36 is a schematic cross-sectional view illustrating a semiconductor device according to a tenth embodiment.

FIG. 36 is a schematic cross-sectional view illustrating the semiconductor device according to the tenth embodiment.

Figure 37A:
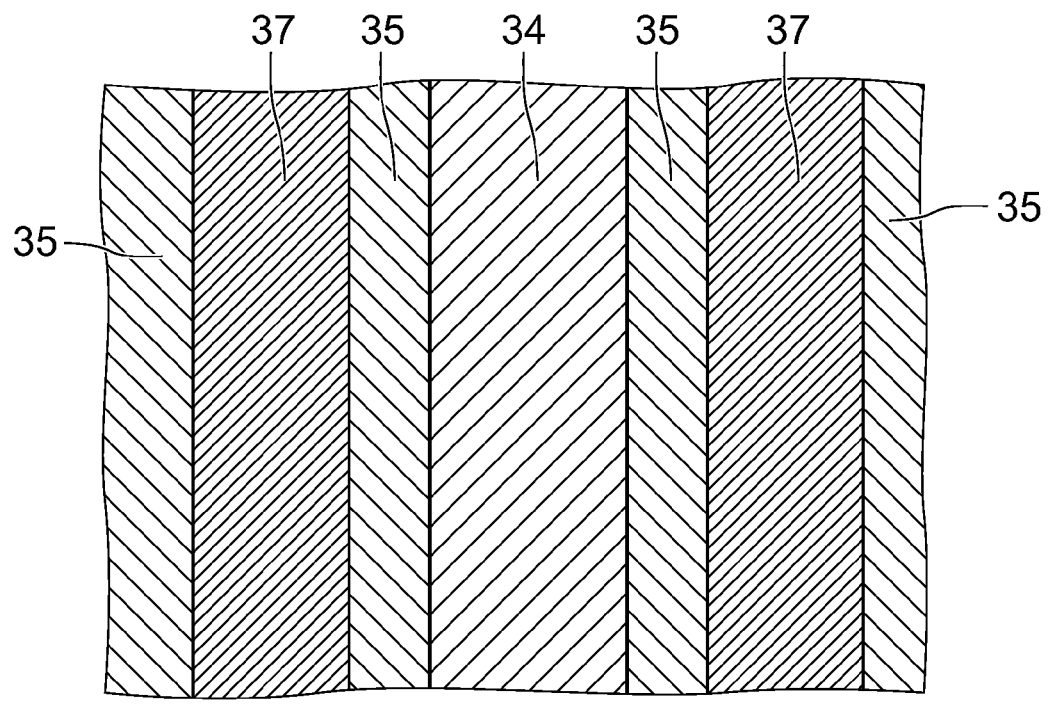
FIG. 37A is a schematic plan view at the position of the AA' line shown in FIG. 36.
Figure 37B:
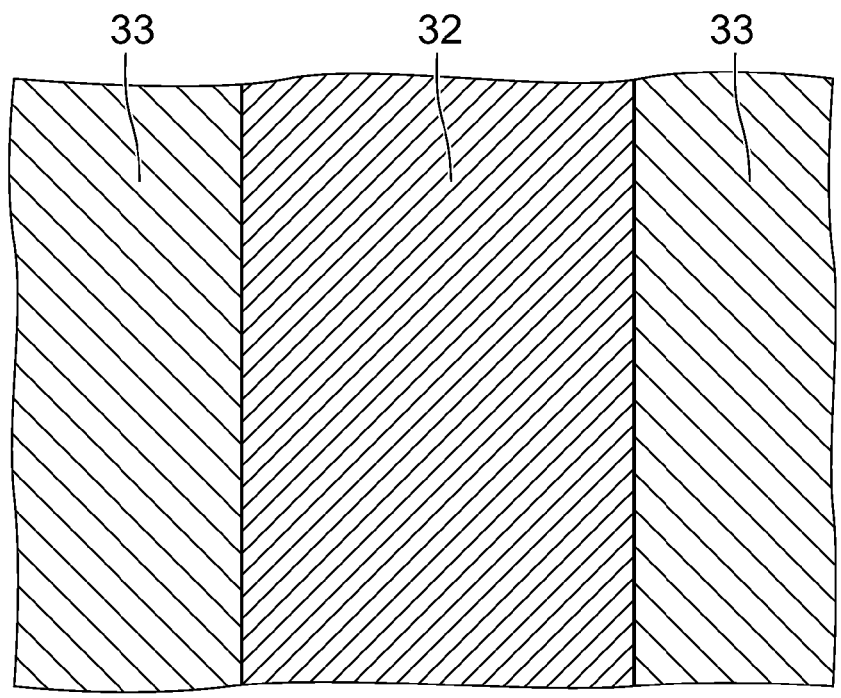
FIG. 37B is a schematic plan view at the position of the BB' line shown in FIG. 36, in the semiconductor device according to the tenth embodiment.

FIG. 37A is a schematic plan view at the position of the AA' line shown in FIG. 36, and FIG. 37B is a schematic plan view at the position of the BB' line shown in FIG. 36, in the semiconductor device according to the tenth embodiment.

The gate electrode, the source electrode, and the insulating film are removed in FIG. 37A, and electrode 31 are removed in FIG. 37B.

As shown in FIG. 36, FIG. 37A and FIG. 37B, the drain electrode 31, an n⁺ drain layer 32 (a first drain layer), an n drain layer 33 (a second drain layer), an n base layer 34 (a first base layer), a p base layer 35 (a second base layer), an n source layer 37, a source electrode 36, a gate electrode 38 and an insulating film 39 are provided in a semiconductor device 9. The semiconductor device 9 is, for example, a MOSFET of an upper/lower-electrode structure. That is, the n⁺ drain layer 32 (the first drain layer), the n drain layer 33 (the second drain layer), the n base layer 34 (the first base layer), the p base layer 35 (the second base layer), the n source layer 37, the source electrode 36, the gate electrode 38 and the insulating film 39 are provided between the drain electrode 31 and the source electrode 36.

The drain electrode 31 includes a metal, such as, aluminum. The drain electrode 31 has, for example, a plate-like shape. On the drain electrode 31, for example, on the plate face of the drain electrode 31, a plurality of n⁺ drain layers 32 is disposed in mutually distal state.

The n+ drain layer 32 is formed, for example, into the shape of a cuboid extending in one direction on the drain electrode 31. The region 31a in contact with each of the n+ drain layers 32 in the drain electrode 31 also extends in one direction. The width Wn of each of n+ drain layers 32 and the width Wn of each of regions 31a are, for example, not more than 100 micrometers (μm). The thickness of each of n+ drain layers 32 is, for example, not more than 5 micrometers (μm).

The distances between the respective n+ drain layers 32 and The distances between the respective regions 31a are, for example, not more than 50 micrometers (μm). The n+ drain layer 32 includes a semiconductor, such as silicon. In the n+ drain layer 32, an impurity serving as a donor, for example, phosphorous is included. The conductivity type of the n+ drain layer 32 is the n type (the first conductivity type). The effective impurity concentration in the n+ drain layer 32 is more than $3 \times 10^{17}$ cm$^{-3}$, for example, not less than $1 \times 10^{19}$ cm$^{-3}$. The drain electrode 31 includes aluminum, and the effective impurity concentration in the n+ drain layer 32 is more than $3 \times 10^{17}$ cm$^{-3}$. Therefore, the drain electrode 31 and the n+ drain layer 32 are in ohmic contact.

The n drain layer 33 is disposed on the n+ drain layer 32 and the drain electrode 31. Accordingly, the n drain layer 33 includes a part 33a disposed on the n+ drain layer 32 and a part 33b in contact with the drain electrode 31. The thickness of the part 33b in contact with the drain electrode 31 in the n drain layer 33 is from several to several tens micrometers (μm), for example, from 1 to 20 micrometers (μm) or from 0.5 to 20 μm.

The n drain layer 33 includes a semiconductor, such as silicon. In the n drain layer 33, an impurity serving as a donor, for example, phosphorous is included. The conductivity type of the n drain layer 33 is the n type. The effective surface impurity concentration in the n drain layer 33 is lower than the effective surface impurity concentration in the n+ drain layer 32. The surface concentration of phosphorous in the n drain layer 33 is, for example, not more than $3 \times 10^{17}$ cm$^{-3}$. The drain electrode 31 includes aluminum, and the effective surface impurity concentration in the n drain layer 33 is not more than $3 \times 10^{17}$ cm$^{-3}$. Therefore, the drain electrode 31 and the n drain layer 33 are in Schottky contact.

The n base layer 34 is disposed on the n drain layer 33. The thickness of the n base layer 34 is, for example, from 10 to 500 micrometers (μm), and is designed corresponding to the breakdown voltage of an element. The n base layer 34 includes a semiconductor, such as silicon. In the n base layer 34, an impurity serving as a donor, for example, phosphorous is included. The conductivity type of the n base layer 34 is the n type. The effective impurity concentration in the n base layer 34 is lower than the effective impurity concentration in the drain layer 33.

On the n base layer 34, a plurality of p base layers 35 are disposed apart from each other. Each of p base layers 35 is formed, on the n base layer 34, into a shape extending in one direction. The upper part of the n base layer 34 is sandwiched between the respective p base layers 35. The lower side and the lateral side of the p base layer 35 are in contact with the n base layer.

The thickness of the p base layer 35 is several micrometers (μm), for example, from 1 to 5 micrometers (μm). The p base layer 35 includes a semiconductor, for example, silicon. In the p base layer 35, an impurity serving as an acceptor, such as boron is included. The conductivity type of the p base layer 35 is the p type. The effective surface concentration of the impurity in the p base layer 35 is more than $3 \times 10^{17}$ cm$^{-3}$, for example, not less than $5 \times 10^{17}$ cm$^{-3}$.

The n source layer 37 is disposed on the p base layer 35. The n source layer 37 is formed into a shape extending in one direction on the p base layer 35. The lower direction and the side direction of the n source layer 37 are in contact with the p base layer 35. The thickness of the n source layer 37 is from 0.1 to several micrometers (μm), for example, 0.5 micrometers (μm). The n source layer 37 includes a semiconductor, such as silicon. In the n source layer 37, an impurity serving as a donor, for example, phosphorous or arsenic is included. The conductivity type of the n source layer 37 is the n type. The effective surface concentration of the impurity in the n source layer 37 is more than $3 \times 10^{17}$ cm$^{-3}$, for example, not less than $1 \times 10^{19}$ cm$^{-3}$.

The semiconductor layer 30 is constituted by the n+ drain layer 32, the n drain layer 33, the n base layer 34, the p base layer 35 and the n source layer 37. For example, the upper face of the semiconductor layer 30 is constituted by the upper face of the n source layer 37, the upper face of the p base layer 35 and the upper face of the n base layer 34. In the upper face of the semiconductor layer 30, the upper face of the n base layer 34 extends in one direction. On both sides of n base layer 34 in the upper face of the semiconductor layer 30, the p base layer 35 is exposed. In the upper face of the semiconductor layer 30, on the side of the p base layer 35 opposite to the n base layer 34, the n source layer 37 is exposed. In the upper face of the semiconductor layer 30, on both sides of the n source layer 37, the p base layer 35 is exposed.

The gate electrode 38 is disposed on the semiconductor layer 30. The gate electrode 38 is formed, for example, into a plate-like shape extending in one direction on the semiconductor layer 30. The gate electrode 38 is disposed on the part in which the n base layer 34 is exposed in the upper face of the semiconductor layer 30. Both end parts of the gate electrode 38 in the direction orthogonal to one direction reach an upper part of the n source layer 37. Accordingly, in the semiconductor layer 30 in the region directly under the gate electrode 38, the n base layer 34, the p base layer 35 and the n source layer 37 are exposed.

The source electrode 36 is disposed on the semiconductor layer 30 and on the gate electrode 38. The source electrode 36 includes a metal, for example, aluminum. The source electrode 36 is in ohmic contact with the n source layer 37 and the p base layer 35.

The insulating film 39 is disposed between the gate electrode 38 and the source electrode 36, and between the gate electrode 38 and the semiconductor substrate 30. That is, the insulating film 39 is disposed between the gate electrode 38 and the n base layer 34, between the gate electrode 38 and the p base layer 35 and between the gate electrode 38 and the n source layer 37. The part between the gate electrode 38 and the semiconductor substrate 30 in the insulating film 39 is referred to as a gate insulating film. The insulating film 39 includes, for example, silicon dioxide.2

In the semiconductor device 9, configurations shown in FIG. 36, FIG. 37A and FIG. 37B are disposed repeatedly.

Next, actions of semiconductor device 9 according to the embodiment will be described.

Between the source electrode 36 and the drain electrode 31, a voltage with the source electrode 36 side as a positive electrode is applied. In the inside of the semiconductor device 9, a diode having the n+ drain layer 32, the n drain layer 33, the n base layer 34 and the p base layer 35 as constituent elements is included. Accordingly, since forward bias is applied to the diode, for example, at the time of reflux, it is possible to apply an electrical current from the source electrode 36 toward the drain electrode 31.

Furthermore, by applying a voltage not less than a threshold value to the gate electrode 38 of the semiconductor device 9, an inversion layer is formed in the p base layer 35. Then, a voltage with the drain electrode 31 side being positive is applied between the source electrode 36 and the drain electrode 31. Consequently, it is possible to apply an electrical current from the drain electrode 31 toward the source electrode 36.

Next, effects of the embodiment will be described. In the embodiment, by forming the n drain layer 33 and the n$^+$ drain layer 32, the carrier concentration on the drain electrode 31 side is lowered. Accordingly, the pin diode built in the MOSFET is driven at a higher speed. In addition, since the speeding up can be achieved without introducing a lifetime killer, actions at high temperatures can be improved. Effects other than the above in the embodiment are the same as those in the first embodiment.

(First Variation of Tenth Embodiment)

Then, the semiconductor device according to a first variation of the tenth embodiment will be described. The embodiment relates to a MOSFET (Metal-Oxide-Semiconductor Field-Effect Transistor) including a pin diode structure in the inside thereof.

Figure 38:
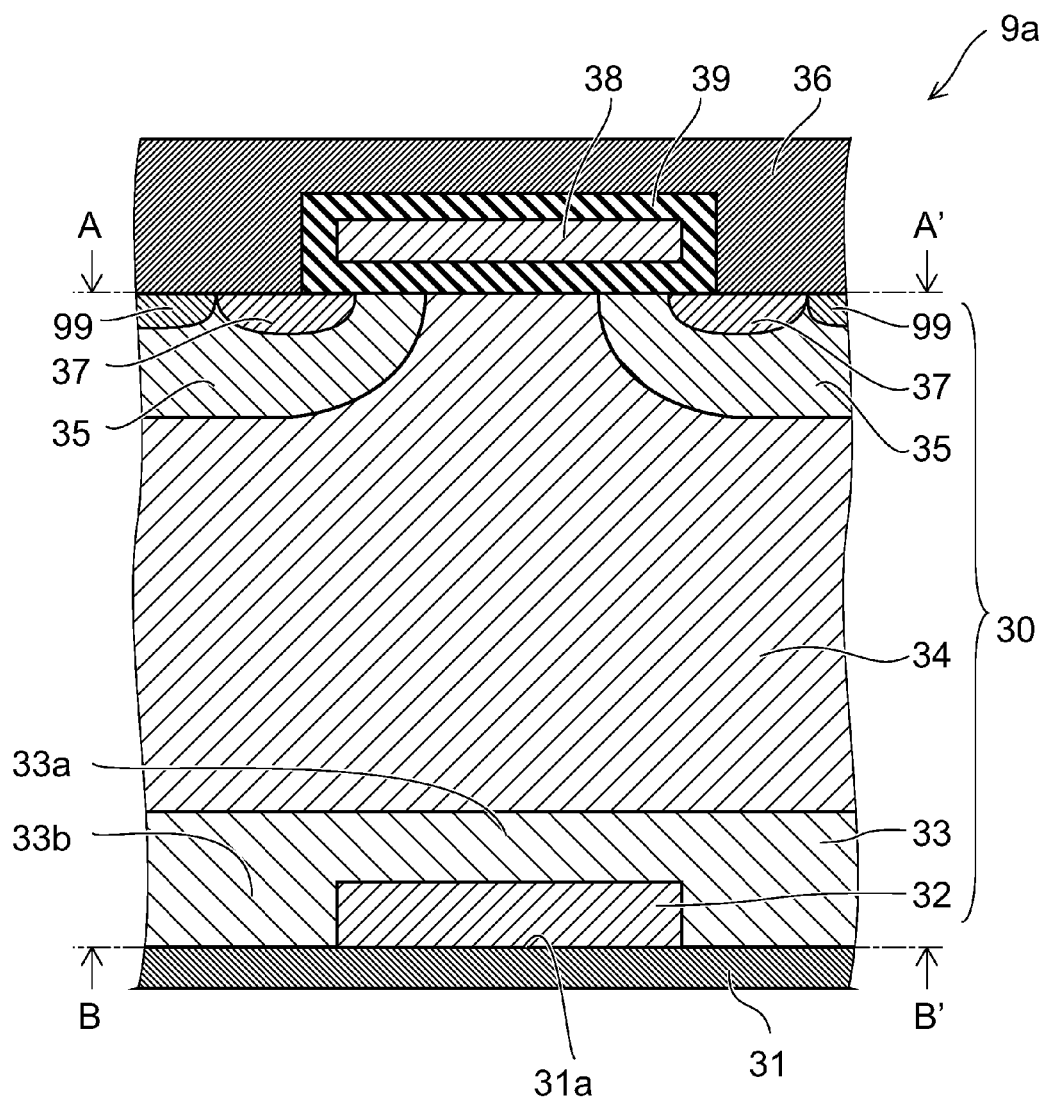
FIG. 38 is a schematic cross-sectional view illustrating the semiconductor device according to a first variation of the tenth embodiment.

FIG. 38 is a schematic cross-sectional view illustrating the semiconductor device according to the first variation of the tenth embodiment.

Figure 39A:
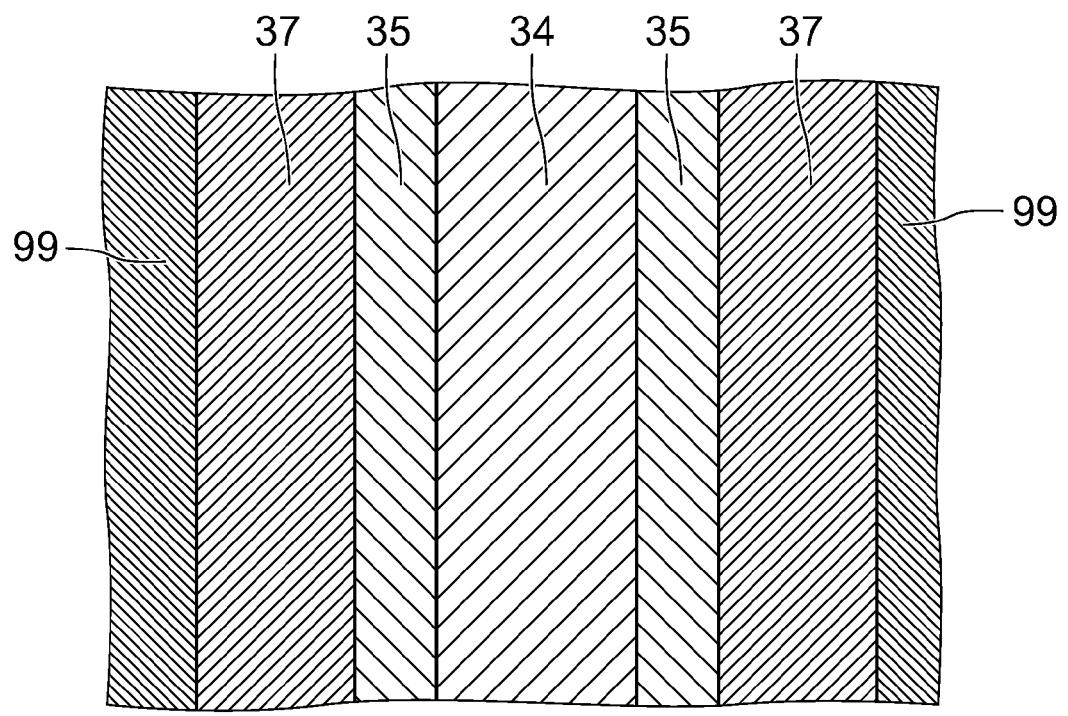
FIG. 39A is a schematic plan view at the position of the AA' line shown in FIG. 38.
Figure 39B:
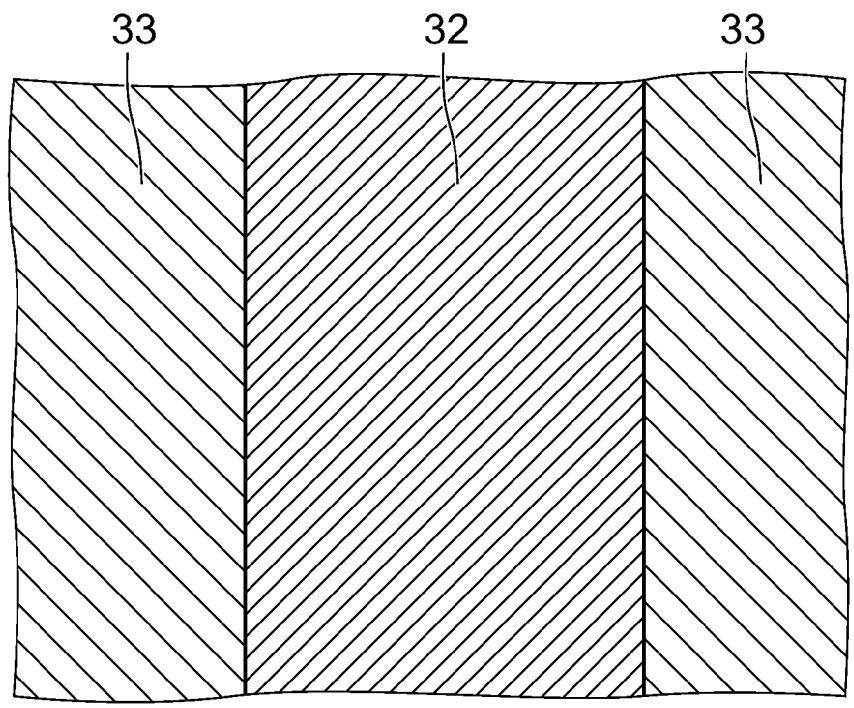
FIG. 39B is a schematic plan view at the position of the BB' line shown in FIG. 38, in the semiconductor device according to the first variation of the tenth embodiment.

FIG. 39A is a schematic plan view at the position of the AA' line shown in FIG. 38, and FIG. 39B is a schematic plan view at the position of the BB' line shown in FIG. 38, in the semiconductor device according to the first variation of the tenth embodiment.

The gate electrode, the source electrode, and the insulating film are removed in FIG. 39A, and the drain electrode is removed in FIG. 39B.

As shown in FIG. 38, FIG. 39A and FIG. 39B, a p$^+$ contact layer 99 is provided, in addition to the drain electrode 31, the n$^+$ drain layer 32, the n drain layer 33, the n base layer 34, the p base layer 35, the n$^+$ source layer 37, the gate electrode 38, the insulating film 39 and the source electrode 36 in the semiconductor device 9. The semiconductor device 9$a$ is, for example, a MOSFET.

The p$^+$ contact layer 99 is disposed on each of p base layers 35. Furthermore, the p$^+$ contact layer 99 is disposed, for example, adjacent to the end part side of the n$^+$ source layer 37, the end part being opposite to the end part covered with the gate electrode 38. The p$^+$ contact layer 99 is formed into the shape of a cuboid extending in one direction. The thickness of the p$^+$ contact layer 99 is 0.1 to several micrometers (µm), for example, 0.5 micrometers (µm).

The p$^+$ contact layer 99 includes a semiconductor, such as silicon. In the p$^+$ contact layer 99, an impurity serving as an acceptor, for example, boron is included. The conductivity type of the p$^+$ contact layer 99 is the p type (the second conductivity type). The effective surface concentration of the impurity in the p$^+$ contact layer 99 is more than $3 \times 10^{17}$ cm$^{-3}$, for example, not less than $1 \times 10^{19}$ cm$^{-3}$. Furthermore, the effective surface concentration of the impurity in the p base layer 35 is not more than $3 \times 10^{17}$ cm$^{-3}$.

The semiconductor layer 30 is constituted by the n$^+$ drain layer 32, the n drain layer 33, the n base layer 34, the p base layer 35, the n source layer 37 and the p$^+$ contact layer 99. For example, the upper face of the semiconductor layer 30 is constituted by the upper face of the n source layer 37, the upper face of the p base layer 35, the upper face of the n base layer 34 and the upper face of the p$^+$ contact layer 99. In the upper face of the semiconductor layer 30, the upper face of the n base layer 34 extends in one direction. In the upper face of the semiconductor layer 30, on both sides of the n base layer 34, the p base layer 35 is exposed. In the upper face of the semiconductor layer 30, on the side of the p base layer 35 opposite to the n base layer 34, the n source layer 37 is exposed. In the upper face of the semiconductor layer 30, on the side of the n source layer 37 opposite to the p base layer 35, the p$^+$ contact layer 99 is exposed.

In the semiconductor device 9$a$, configurations shown in FIG. 38, FIG. 39A and FIG. 39B are disposed repeatedly. The upper face of the p$^+$ contact layer 99 is in contact with the source electrode 36 between adjacent gate electrodes 38. In addition, the p base layer 35 has a part in contact with the source electrode 36 (not shown). Since the effective surface impurity concentration in the p$^+$ contact layer 99 is more than $3 \times 10^{17}$ cm$^{-3}$, the source electrode 36 and the p$^+$ contact layer 99 are in ohmic contact. Since the effective surface impurity concentration in the p base layer 35 is not more than $3 \times 10^{17}$ cm$^{-3}$, the source electrode 36 and the p base layer 35 are in Schottky contact.

The p$^+$ contact layer 99 may be formed into a part of the second base layer. That is, the second base layer includes the p base layer 35 with a low impurity concentration (a first part of the second base layer) and the p$^+$ contact layer 99 with a high impurity concentration (a second part of the second base layer).

Next, actions and effects of the variation will be described.

In the variation, since the anode structure the same as that in the semiconductor device 2 according to the second embodiment is formed, the hole injection amount from the anode side can be controlled, and speeding up can be realized. In addition to that, the p$^+$ contact layer 99 has a function of discharging holes. Consequently, for example, it is possible, to make holes flow rapidly to the source electrode 36 through the n base layer 34, the p base layer 35 and the p$^+$ contact layer 99 when the bias is changed from the forward direction to the reverse direction. Actions and effects other than the above in the variation are the same as those in the tenth embodiment.

(Second Variation of Tenth Embodiment)

Next, a second variation of the tenth embodiment will be described.

The schematic cross-sectional view illustrating the semiconductor device according to the variation is the same as FIG. 38 for the first variation of the tenth embodiment.

Figure 40A:
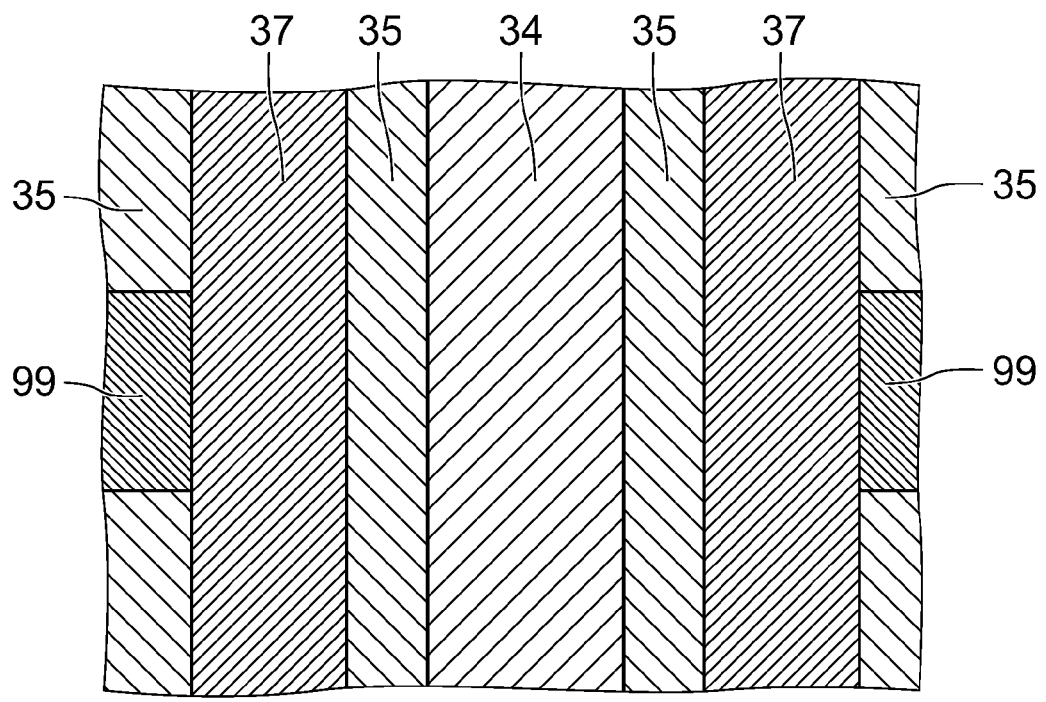
FIG. 40A is a schematic plan view at the position of the AA' line shown in FIG. 38.
Figure 40B:
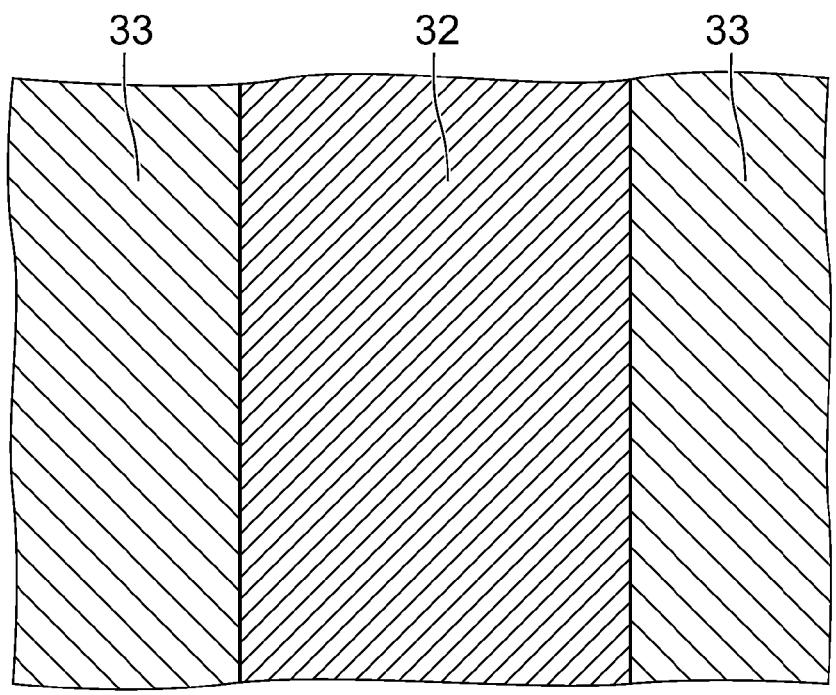
FIG. 40B is a schematic plan view at the position of BB' line shown in FIG. 38, in the semiconductor device according to a second variation of the tenth embodiment.

FIG. 40A is a schematic plan view at the position of the AA' line shown in FIG. 38, and FIG. 40B is a schematic plan view at the position of the BB' line shown in FIG. 38, in the semiconductor device according to the second variation of the tenth embodiment.

The gate electrode, the source electrode, and the insulating film are removed in FIG. 40A, and the drain electrode is removed in FIG. 40B.

As shown in FIG. 40A and FIG. 40B, in the variation, the p$^+$ contact layer 99 is disposed, in the upper face of the semiconductor layer 30, on a part of the n source layer 37 opposite to the p base layer 35 side. Then, on both sides of the p$^+$ contact layer 99 in one direction, the p base layer 35 is disposed. In the variation, the hole injection into the diode built in the MOSFET can be further suppressed, and thus, as compared with the tenth embodiment and the second variation of the tenth embodiment, the improvement of switching characteristics of the diode can be achieved. Configurations, actions and effects other than the above are the same as those in the tenth embodiment.

The structure of the MOSFET is not limited to the above-mentioned structure.

For example, in FIG. 36 and FIG. 38, the p$^+$ cathode layer 25 illustrated in FIG. 22 may be provided on the drain electrode 31. However, in the MOSFET, the p+ cathode layer 25 is referred to as a substituted expression "the p+ drain layer 25 (a third drain layer)." The p+ drain layer 25 is in ohmic contact with the drain electrode 31. The n drain layer 33 is provided on the drain electrode 31, on the n+ drain layer 32, and on the p+ drain layer 25. Furthermore, the n drain layer 33 has a part in contact with the drain electrode 31, and a part in contact with on the p+ drain layer 25 and on the n+ drain layer 32.

The effective impurity concentration included in the p+ drain layer 25 is the same as the impurity concentration in the p+ cathode layer 25. The p+ drain layer 25 and the n+ drain layer 32 may be disposed in contact with each other or separated from each other, as is the case of the p+ cathode layer 25 and the n+ cathode layer 12.

According to embodiments described above, semiconductor devices capable of achieving the improvement of electric characteristics can be provided. Furthermore, the above-mentioned numerical examples premises a silicon material, but characteristics can be improved by applying the structure according to the invention to diodes using a material other than silicon such as SiC or GaN, while changing appropriately numerical values.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first electrode;
    a second electrode;
    a first semiconductor layer of a first conductivity type, the first semiconductor layer being provided between the first electrode and the second electrode, and the first semiconductor layer being in contact with the first electrode;
    a second semiconductor layer of a first conductivity type, the second semiconductor layer including a first part provided between the first semiconductor layer and the second electrode and a second part provided between the first electrode and the second electrode, the second part being in contact with the first electrode, and the second semiconductor layer having an effective impurity concentration lower than an effective impurity concentration in the first semiconductor layer;
    a third semiconductor layer of a first conductivity type, the third semiconductor layer being provided between the second semiconductor layer and the second electrode, and the third semiconductor layer having an effective impurity concentration lower than an effective impurity concentration in the second semiconductor layer;
    a fourth semiconductor layer of a second conductivity type, the fourth semiconductor layer being provided between the third semiconductor layer and the second electrode;
    a fifth semiconductor layer of a first conductivity type, the fifth semiconductor layer being provided between the fourth semiconductor layer and the second electrode, and the fifth semiconductor layer being in contact with the second electrode; and
    a third electrode provided on the fourth semiconductor layer via an insulating film.

2. The device according to claim 1, further comprising a sixth semiconductor layer of a second conductivity type, the sixth semiconductor layer being in ohmic contact with the first electrode, the second semiconductor layer being in contact with the first electrode, the first semiconductor layer, and the sixth semiconductor layer.

3. The device according to claim 1, wherein the fourth semiconductor layer a third part and a fourth part, and the fourth part having an effective impurity concentration lower than an effective impurity concentration in the third part.

4. The device according to claim 1, wherein the third part is in Schottky contact with the second electrode, the fourth part is in ohmic contact with the second electrode.

5. The device according to claim 1, wherein a peak in an impurity concentration profile of the second semiconductor layer in a direction from the first electrode toward the second electrode being positioned between the first semiconductor layer and the third semiconductor layer.

6. A semiconductor device, comprising:
    a first electrode;
    a second electrode;
    a first semiconductor layer of a first conductivity type, the first semiconductor layer being provided between the first electrode and the second electrode, and the first semiconductor layer being in contact with the first electrode;
    a sixth semiconductor layer of a second conductivity type, the sixth semiconductor layer being provided between the first electrode and the second electrode, and the sixth semiconductor layer being in contact with the first electrode;
    a seventh semiconductor layer of a second conductivity type, the seventh semiconductor layer being provided between the first electrode and the second electrode, the seventh semiconductor layer being in contact with the first electrode, and the seventh semiconductor layer having an effective impurity concentration lower than an effective impurity concentration in the sixth semiconductor layer;
    a second semiconductor layer of a first conductivity type, the second semiconductor layer being provided between the first semiconductor layer and the second electrode, between the sixth semiconductor layer and the second electrode, and between the seventh semiconductor layer and the second electrode, and the second semiconductor layer having an effective impurity concentration lower than an effective impurity concentration in the first semiconductor layer;
    a third semiconductor layer of a first conductivity type, the third semiconductor layer being provided between the second semiconductor layer and the second electrode, and the third semiconductor layer having an effective impurity concentration lower than an effective impurity concentration in the second semiconductor layer; and
    a fourth semiconductor layer of a second conductivity type, the fourth semiconductor layer being provided between the third semiconductor layer and the second electrode, and the fourth semiconductor layer being in contact with the second electrode.

7. The device according to claim 6, further comprising a fifth semiconductor layer of a second conductivity type, the fifth semiconductor layer including a third part provided between the fourth semiconductor layer and the third semiconductor layer and a forth part provided between the third semiconductor layer and the second electrode, the forth part being in contact with the second electrode, and the fifth semiconductor layer having an effective impurity concentration lower than an effective impurity concentration in the fourth semiconductor layer.

8. The device according to claim 6, wherein:
a first region in contact with the first semiconductor layer in the first electrode extends in one direction;
a second region in contact with the fourth semiconductor layer in the second electrode extends in one of the one direction or another direction intersecting with the one direction; and
a width of the first region is wider than a width of the second region.

9. The device according to claim 6, wherein the fourth semiconductor layer is disposed in a first disposition region and a second disposition region, and an effective impurity concentration in the fourth semiconductor layer in the first disposition region is higher than an effective impurity concentration in the fourth semiconductor layer in the second disposition region.

10. The device according to claim 9, wherein the fourth semiconductor layer disposed in the first disposition region is provided on the sixth semiconductor layer.

11. The device according to claim 6, wherein the first semiconductor layer is provided between the sixth semiconductor layer and the seventh semiconductor layer.

12. The device according to claim 6, wherein a peak in an impurity concentration profile of the second semiconductor layer in a direction from the first electrode toward the second electrode being positioned between the first semiconductor layer and the third semiconductor layer.

* * * * *